(12) United States Patent
Lupino et al.

(10) Patent No.: US 9,853,053 B2
(45) Date of Patent: *Dec. 26, 2017

(54) THREE DIMENSION INTEGRATED CIRCUITS EMPLOYING THIN FILM TRANSISTORS

(71) Applicant: 3B Technologies, Inc., St. Louis Park, MN (US)

(72) Inventors: James John Lupino, St. Louis Park, MN (US); Tommy Allen Agan, Maple Grove, MN (US)

(73) Assignee: 3B Technologies, Inc., St. Louis Park, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/580,240

(22) Filed: Dec. 23, 2014

(65) Prior Publication Data

US 2015/0249096 A1   Sep. 3, 2015

Related U.S. Application Data

(63) Continuation-in-part of application No. 14/021,216, filed on Sep. 9, 2013, now Pat. No. 8,952,470.

(Continued)

(51) Int. Cl.
  *H01L 27/118*   (2006.01)
  *G11C 11/16*   (2006.01)
  (Continued)

(52) U.S. Cl.
  CPC ......... *H01L 27/11898* (2013.01); *G11C 5/02* (2013.01); *G11C 11/161* (2013.01); *G11C 11/165* (2013.01); *G11C 13/0004* (2013.01); *G11C 13/0007* (2013.01); *G11C 13/0021* (2013.01); *H01L 27/11803* (2013.01); *H01L 27/224* (2013.01); *H01L 27/2409* (2013.01);
  (Continued)

(58) Field of Classification Search
  CPC .................. H01L 27/118; H01L 27/11803
  See application file for complete search history.

(56) References Cited

U.S. PATENT DOCUMENTS 5,640,343 A * 6/1997 Gallagher et al. ............ 365/171
5,757,139 A   5/1998 Forrest et al.
(Continued)

FOREIGN PATENT DOCUMENTS

WO   WO 2012/159078   11/2012

OTHER PUBLICATIONS

US 7,529,121, 05/2009, Kitagawa et al. (withdrawn)
(Continued)

*Primary Examiner* — Marc Armand
(74) *Attorney, Agent, or Firm* — Kinney & Lange, P.A.

(57) ABSTRACT

An integrated circuit which enables lower cost yet provides superior performance compared to standard silicon integrated circuits by utilizing thin film transistors (TFTs) fabricated in BEOL. Improved memory circuits are enabled by utilizing TFTs to improve density and access in a three dimensional circuit design which minimizes die area. Improved I/O is enabled by eliminating the area on the surface of the semiconductor dedicated to I/O and allowing many times the number of I/O available. Improved speed and lower power are also enabled by the shortened metal routing lines and reducing leakage.

17 Claims, 56 Drawing Sheets

Related U.S. Application Data

(60) Provisional application No. 61/980,147, filed on Apr. 16, 2014, provisional application No. 61/699,211, filed on Sep. 10, 2012, provisional application No. 61/702,485, filed on Sep. 18, 2012.

(51) Int. Cl.
  *G11C 13/00* (2006.01)
  *H01L 27/22* (2006.01)
  *G11C 5/02* (2006.01)
  *H01L 27/24* (2006.01)
  *H01L 45/00* (2006.01)

(52) U.S. Cl.
  CPC ...... *H01L 27/2481* (2013.01); *G11C 2213/71* (2013.01); *G11C 2213/72* (2013.01); *H01L 45/04* (2013.01); *H01L 45/06* (2013.01); *H01L 45/085* (2013.01); *H01L 45/1233* (2013.01); *H01L 45/14* (2013.01); *H01L 45/143* (2013.01); *H01L 45/146* (2013.01); *H01L 45/147* (2013.01)

(56) References Cited

U.S. PATENT DOCUMENTS

| | | | |
|---|---|---|---|
| 5,897,190 A | 4/1999 | Takahashi | |
| 5,917,280 A | 6/1999 | Burrows et al. | |
| 5,932,895 A | 8/1999 | Shen et al. | |
| 6,181,167 B1 | 1/2001 | Agan | |
| 6,232,714 B1 | 5/2001 | Shen et al. | |
| 6,750,540 B2 | 6/2004 | Kim | |
| 6,838,721 B2 | 1/2005 | Garni et al. | |
| 6,872,472 B2 | 3/2005 | Liao et al. | |
| 7,018,875 B2 | 3/2006 | Madurawe | |
| 7,112,994 B2 | 9/2006 | Madurawe | |
| 7,193,239 B2 | 3/2007 | Leedy | |
| 7,224,601 B2 | 5/2007 | Panchula | |
| 7,265,421 B2 | 9/2007 | Madurawe | |
| 7,282,951 B2 | 10/2007 | Huppenthal et al. | |
| 7,288,480 B2 | 10/2007 | Yamaguchi et al. | |
| 7,446,563 B2 | 11/2008 | Madurawe | |
| 7,538,575 B2 | 5/2009 | Madurawe | |
| 7,608,514 B2 | 10/2009 | Hsu et al. | |
| 7,635,988 B2 | 12/2009 | Madurawe | |
| 7,656,185 B2 | 2/2010 | Kim et al. | |
| 7,656,192 B2 | 2/2010 | Madurawe | |
| 7,668,005 B2 | 2/2010 | Ueda | |
| 7,777,319 B2 | 8/2010 | Madurawe | |
| 7,800,565 B2 | 9/2010 | Nathan et al. | |
| 7,936,580 B2 | 5/2011 | Chen et al. | |
| 7,968,419 B2 | 6/2011 | Li et al. | |
| 7,989,940 B2 | 8/2011 | Haba et al. | |
| 8,115,201 B2 | 2/2012 | Yamazaki et al. | |
| 8,158,964 B2 | 4/2012 | Kim et al. | |
| 8,169,068 B2 | 5/2012 | Wu et al. | |
| 8,207,754 B2 | 6/2012 | Garg et al. | |
| 8,227,788 B2 | 7/2012 | Mikawa et al. | |
| 8,289,746 B2 | 10/2012 | Chen et al. | |
| 8,351,241 B2 | 1/2013 | Lu et al. | |
| 8,405,421 B2 | 3/2013 | Agan et al. | |
| 8,411,494 B2 | 4/2013 | Shukh | |
| 8,492,886 B2 | 7/2013 | Or-Bach et al. | |
| 8,726,162 B2 | 5/2014 | Yamazaki | |
| 8,823,076 B2 | 9/2014 | Lee et al. | |
| 8,829,664 B2 | 9/2014 | Madurawe | |
| 8,845,109 B2 | 9/2014 | Wang | |
| 8,853,765 B2 | 10/2014 | Lee et al. | |
| 8,856,699 B2 | 10/2014 | Madurawe | |
| 2004/0004239 A1 | 1/2004 | Madurawe | |
| 2006/0261731 A1 | 11/2006 | Aziz et al. | |
| 2008/0074356 A1 | 3/2008 | Cok | |
| 2009/0004788 A1 | 1/2009 | Madurawe | |
| 2009/0128189 A1 | 5/2009 | Madurawe et al. | |
| 2010/0096628 A1* | 4/2010 | Song | G11C 5/02 257/43 |
| 2010/0213458 A1 | 8/2010 | Prall | |
| 2010/0221857 A1 | 9/2010 | Cok | |
| 2010/0246241 A1* | 9/2010 | Seko | G11C 5/063 365/148 |
| 2010/0283024 A1* | 11/2010 | Yoshizumi | B82Y 10/00 257/2 |
| 2010/0295012 A1* | 11/2010 | Mikawa et al. | 257/4 |
| 2012/0132910 A1 | 5/2012 | Yamazaki et al. | |
| 2012/0224417 A1 | 9/2012 | Wang et al. | |
| 2012/0257449 A1 | 10/2012 | Agan et al. | |
| 2012/0281465 A1 | 11/2012 | Agan et al. | |
| 2012/0307549 A1 | 12/2012 | Agan et al. | |
| 2012/0313688 A1 | 12/2012 | Agan et al. | |
| 2012/0319728 A1 | 12/2012 | Madurawe | |
| 2013/0002296 A1 | 1/2013 | Madurawe | |
| 2013/0003448 A1 | 1/2013 | Chen et al. | |
| 2013/0015542 A1 | 1/2013 | Wang et al. | |
| 2013/0033199 A1 | 2/2013 | Ali et al. | |
| 2013/0044532 A1 | 2/2013 | Bethune et al. | |
| 2013/0082984 A1 | 4/2013 | Drzaic et al. | |
| 2013/0119396 A1 | 5/2013 | Yu et al. | |
| 2013/0175521 A1 | 7/2013 | Moriguchi et al. | |
| 2013/0193488 A1 | 8/2013 | Or-Bach et al. | |
| 2013/0200365 A1 | 8/2013 | Yamazaki | |
| 2013/0223125 A1 | 8/2013 | DeBrosse et al. | |
| 2013/0264536 A1 | 10/2013 | Tour et al. | |
| 2014/0001462 A1 | 1/2014 | Shieh et al. | |
| 2014/0008616 A1 | 1/2014 | Geim et al. | |
| 2014/0015566 A1 | 1/2014 | Yoneda et al. | |
| 2014/0021038 A1 | 1/2014 | Kusumi et al. | |
| 2014/0035478 A1 | 2/2014 | Kitakado et. al. | |
| 2014/0035671 A1 | 2/2014 | Shionoiri et. al. | |
| 2014/0061639 A1 | 3/2014 | Yamazaki et al. | |
| 2014/0070344 A1 | 3/2014 | Khalili Amiri et al. | |
| 2014/0071728 A1 | 3/2014 | Khalili Amiri et al. | |
| 2014/0071732 A1 | 3/2014 | Khalili Amiri et al. | |
| 2014/0077161 A1 | 3/2014 | Duan et al. | |
| 2014/0097867 A1 | 4/2014 | Koyama | |
| 2014/0117413 A1 | 5/2014 | Madurawe | |
| 2014/0124882 A1 | 5/2014 | Khalili Amiri et al. | |
| 2014/0145272 A1 | 5/2014 | Or-Bach et al. | |
| 2014/0151752 A1 | 6/2014 | Atkinson et al. | |
| 2014/0169085 A1 | 6/2014 | Wang et al. | |
| 2014/0177327 A1 | 6/2014 | Khalili Amiri et al. | |
| 2014/0197459 A1 | 7/2014 | Kis et al. | |
| 2014/0206182 A1 | 7/2014 | Chen et al. | |
| 2014/0209689 A1 | 7/2014 | Tang | |
| 2014/0217565 A1 | 8/2014 | Carroll | |
| 2014/0226401 A1 | 8/2014 | Yamazaki et al. | |
| 2014/0231803 A1 | 8/2014 | Yamazaki | |
| 2014/0266305 A1 | 9/2014 | Shionoiri et al. | |
| 2014/0273340 A1 | 9/2014 | Van Duren et al. | |
| 2014/0312296 A1 | 10/2014 | Jo et al. | |
| 2014/0319514 A1 | 10/2014 | Noda et al. | |
| 2014/0319516 A1 | 10/2014 | Tanaka et al. | |
| 2014/0319517 A1 | 10/2014 | Noda et al. | |
| 2014/0320166 A1 | 10/2014 | Nazarian et al. | |
| 2014/0325249 A1 | 10/2014 | Toyotaka | |
| 2014/0326991 A1 | 11/2014 | Matsubayashi et al. | |
| 2014/0326992 A1 | 11/2014 | Hondo et al. | |
| 2014/0326993 A1 | 11/2014 | Oikawa et al. | |
| 2014/0326994 A1 | 11/2014 | Tanaka | |
| 2014/0326998 A1 | 11/2014 | Honda | |
| 2014/0332800 A1 | 11/2014 | Hanaoka | |
| 2014/0333365 A1 | 11/2014 | Takahashi et al. | |
| 2014/0339538 A1 | 11/2014 | Yamazaki et al. | |
| 2014/0339539 A1 | 11/2014 | Yamazaki et al. | |
| 2014/0339540 A1 | 11/2014 | Takemura et al. | |
| 2014/0339541 A1 | 11/2014 | Kato et al. | |
| 2014/0339545 A1 | 11/2014 | Yamazaki | |
| 2014/0339546 A1 | 11/2014 | Yamazaki et al. | |
| 2014/0339547 A1 | 11/2014 | Hondo et al. | |
| 2014/0339548 A1 | 11/2014 | Yamazaki et al. | |
| 2014/0339549 A1 | 11/2014 | Yamazaki et al. | |
| 2014/0339560 A1 | 11/2014 | Yamazaki et al. | |
| 2014/0340115 A1 | 11/2014 | Kurokawa | |
| 2014/0340116 A1 | 11/2014 | Okamoto et al. | |

(56) References Cited

U.S. PATENT DOCUMENTS

| | | |
|---|---|---|
| 2014/0340117 A1 | 11/2014 | Takemura |
| 2014/0340608 A1 | 11/2014 | Yamazaki et al. |
| 2014/0340888 A1 | 11/2014 | Ishisone et al. |
| 2014/0346505 A1 | 11/2014 | Asami et al. |
| 2014/0346571 A1 | 11/2014 | Udaya |

OTHER PUBLICATIONS

T. Kawahara, Non-Volatile Memory and Normally-Off Computing, Central Research Laboratory, Hitachi, Ltd., ASP-DAC 2011, Jan. 26, 2011, Yokohama, Japan.

K. Ando, et. al. Spin-transfer torque magnetoresistive random-access memory technologies for normally off computing. Journal of Applied Physics, 2014 DOI: 10.1063/1.4869828.

Myoung-Jae Lee, et. al., Low-Temperature-Grown Transition Metal Oxide Based Storage Materials and Oxide Transistors for High-Density Non-volatile Memory, Advanced Functional Materials, vol. 19, Issue 10, pp. 1587-1593, May 22, 2009.

Sanghun Jeon, et. al., Nanometer-Scale Oxide Thin Film Transistor with Potential for High-Density Image Sensor Applications, Applied Materials & Interfaces, vol. 3, No. 1, 1-6, 2011.

Sanghun Jeon, et. al., Short channel device performance of amorphous InGaZnO thin film transistor, Applied Physics Letters 99, 082104 (2011).

Lijie Zhang, et. al, A MIM diode with ultra abrupt switching process and high on/off current ratio, Institute of Microelectronics, Peking University, Beijing 100871, P.R.China, ECS Transactions; 35, 4; 923-930, Silicon nitride, silicon dioxide, and emerging dielectrics International Symposium; 11th, Silicon nitride, silicon dioxide, and emerging dielectrics, 2011.

Linn E, et. al., Complementary resistive switches for passive nanocrossbar memories, *Nat Mater*. May 2010;9(5):403-6. doi: 10.1038/nmat2748. Epub Apr. 18, 2010.

Chai Y, et. al., Nanoscale Bipolar and Complementary Resistive Switching Memory Based on Amorphous Carbon, IEEE Transactions on Electron Devices, vol. 58, No. 11, Nov. 2011.

Hsiao-Wen Zan, et. al., High Performance a-IGZO TFT with Nano-Dots Doping, SID Symposium Digest of Technical Papers, vol. 42, Issue 1, pp. 28-31, Jun. 2011.

Weisheng Zhao, et. al., High Density Spin-Transfer Torque (STT)-MRAM based on Cross-Point Architecture, 978-1-4673-1081-9/12, 2012 IEEE.

Chen H, et. al., Large-scale complementary macroelectronics using hybrid integration of carbon nanotubes and IGZO thin-film transistors, Nat Commun. Jun. 13, 2014;5:4097. doi: 10.1038/ncomms5097. PubMed PMID: 24923382.

Wei-Gang Wang, et. al, Electric-field-assisted switching in magnetic tunnel junctions, Nature Materials, vol. 11, p. 64-88, Jan. 2012.

J.T. Heron, et. al., Deterministic switching of ferromagnetism at room temperature using an electric field, Nature, 516, 370-373 (Dec. 18, 2014), doi:10.1038/nature14004.

Uwe Bauer, et. al., Magneto-ionic control of interfacial magnetism, Nature Materials, (2014) doi:10.1038/nmat4134.

Herold et. al., Sub-pixel Structured OLED Microdisplay, SID 2013 Digest, ISSN 0097-966X/13/4401-0330.

Wakana, et. al., Amorphous ZTO/ITO Stacked-Channel TFTs with Field Effect Mobility over 50 cm2/Vs and Resistant to Channel Thickness Dispersion, SID 2010 Digest, ISSN 0097-966X/10/4103-1287.

Zan et. al., High Performance a-IGZO TFT with Nano-Dots Doping, SID 2011 Digest, ISSN 0097-966X/11/4201-0028.

Song, et. al., High Mobility Oxide TFTs for Future LCD Applications, SID 2013 Digest, ISSN 0097-966X/13/4401-0093.

Ulm, et. al., High Speed a-IGZO TFT-based Gate Driver by using Back Channel Etched Structure, SID 2014 Digest, ISSN 0097-966X/14/4503-0968.

Geng, et. al., High-Speed Shift Register for High Resolution AMD with Self-aligned Coplanar a-IGZO TFTs, SID 2012 Digest, ISSN 0097-966X/12/4301-0008.

Mativenga, et. al, Improving Switching Characteristics of Amorphous-InGaZnO4, Thin-Film Transistors by Dual-Gate Driving, SID 2013 Digest, ISSN 0097-966X/13/4403-1062.

Chiu, et. al.,. High-Performance a-IGZO Thin-Film Transistor Using Ta2O5 Gate Dielectric, IEEE Electron Device Letters, vol. 31, No. 11, Nov. 2010.

Lee, et. al., Oxide TFT with Multilayer Gate Insulator for Backplane of AMOLED Device, Journal of the SID 16/2, 2008.

Arai, Oxide-TFT Technologies for Next-Generation AMOLED Displays, Journal of the SID 20/3, 2012.

Morosawa, et. al., A Novel Self-Aligned Top-Gate Oxide TFT for AM-OLED Displays, SID 2011 Digest, ISSN 0097-966X/11/4201-0479.

Shunpei, et. al., Research, Development, and Application of Crystalline Oxide Semiconductor, SID Symposium Digest of Technical Papers, vol. 43, Issue 1, Jun. 2012, pp. 183-186 DOI: 10.1002/j.2168-0159.2012.tb05742.x.

Yoshiharu, et. al., Development of IGZO-TFT and Creation of New Devices Using IGZO-TFT, SID Symposium Digest of Technical Papers, vol. 44, Issue 1, Jun. 2013, pp. 771-774, DOI: 10.1002/j.2168-0159.2013.tb06329.x.

Shunpei Yamazaki, Future Possibility of C-Axis Aligned Crystalline Oxide Semiconductors Comparison with Low-Temperature Polysilicon, SID Symposium Digest of Technical Papers, vol. 45, Issue 1, Jun. 2014, pp. 9-12, Jul. 7, 2014, DOI: 10.1002/j.2168-0159.2014.tb00003.x.

Akio Yamashita, et. al., A 513-ppi FFS-Mode TFT-LCD using CAAC Oxide Semiconductor Fabricated by a 6-Mask Process, SID Symposium Digest of Technical Papers vol. 45, Issue 1, Jun. 2014, pp. 263-266, DOI: 10.1002/j.2168-0159.2014.tb00072.x.

Rui Cheng, et. al., Few-layer molybdenum disulfide transistors and circuits for high-speed flexible electronics, Nature 5, Article No. 5143 doi: 10.1038/ncomms6143.

Yuan Liu, et. al., Highly Flexible Electronics from Scalable Vertical Thin Film Transistors, Nano Letters, dx.doi.org/10.1021/nl404484s.

Woo Jong Yu, et. al., Vertically stacked multi-heterostructures of layered materials for logic transistors and complementary inverters, Nature Materials, vol. 12, Mar. 2013, DOI: 10.1038/NMAT3518.

Sang Hoon Chae, et. al., Transferred wrinkled Al2O3 for highly stretchable and transparent graphene-carbon nanotube transistors, Nature Materials, vol. 12, May 2013, DOI: 10.1038/NMAT3572.

Wooseok Song, et. al., High-mobility ambipolar ZnO-graphene hybrid thin film transistors, Scientific Reports | 4 : 4064 | DOI: 10.1038/srep04064.

Jiahao Kang, et. al., High-performance MoS2 transistors with low-resistance molybdenum contacts, Appl. Phys. Lett. 104, 093106 (2014).

Yuchen Du, et. al., Contact research strategy for emerging molybdenum disulfide and other two-dimensional field-effect transistors, APL Materials 2, 092510 (2014); doi: 10.1063/1.4894198.

Sunkook Kim, et. al., High-mobility and low-power thin-film transistors based on multilayer MoS2 crystals, Nature Communications 3, Article No. 1011 doi:10.1038/ncomms2018.

Chao Yan, et. al., Graphene-based flexible and stretchable thin film transistors, Nanoscale, 2012, 4, 4870 DOI: 10.1039/c2nr30994g.

Haitian Chen, et. al., Large-scale complementary macroelectronics using hybrid integration of carbon nanotubes and IGZO thin-film transistors, Nature Communications, 2014, DOI: 10.1038/ncomms5097.

K. Ando, et. al., Spin-transfer torque magnetoresistive random-access memory technologies for normally off computing. Journal of Applied Physics, 2014 DOI:10.1063/1.4869828.

Myoung-Jae Lee, et al., Low-Temperature-Grown Transition Metal Oxide Based Storage Materials and Oxide Transistors for High-Density Non-volatile Memory, Advanced Functional Materials, vol. 19, Issue 10, pp. 1587-1593, May 22, 2009.

Sanghun Jeon, et al., Nanometer-Scale Oxide Thin Film Transistor with Potential for High-Density Image Sensor Applications, Applied Materials & Interfaces, vol. 3, No. 1, 1-6, 2011.

(56) References Cited

OTHER PUBLICATIONS

Sanghun Jeon, et al., Short channel device performance of amorphous InGaZnO thin film transistor, Applied Physics Letters 99, 082104 (2011).

Lijie Zhang, et al., A MIM diode with ultra abrupt switching process and high on/off current ratio, Institute of Microelectronics, Peking University, Beijing 100871, P.R.China, ECS Transactions; 35, 4; 923-930, Silicon nitride, silicon dioxide, and emerging dielectrics International Symposium; 11th, Silicon nitride, silicon dioxide, and emerging dielectrics, 2011.

Linn E, et al., Complementary resistive switches for passive nanocrossbar memories, Nat Mater. May 2010;9(5):403-6 doi: 10.1038/nmat2748. Epub Apr. 18, 2010.

Chai Y, et al., Nanoscale Bipolar and Complementary Resistive Switching Memory Based on Amorphous Carbon, IEEE Transactions on Electron Devices, vol. 58, No. 11, Nov. 2011.

Hsiao-Wen Zan, et al., High Performance a-IGZO TFT with Nano-Dots Doping, SID Symposium Digest of Technical Papers, vol. 42, Issue 1, pp. 28-31, Jun. 2011.

Weisheng Zhao, et al., High Density Spin-Transfer Torque (STT)-MRAM based on Cross-Point Architecture, 978-1-4673-1081-9/12, 2012 IEEE.

Chen, H, et al., Large-scale complementary macroelectronics using hybrid integration of carbon nanotubes and IGZO thin-film transistors, Nat Commun. Jun. 13, 2014;5:4097. doi: 10.1038/ncomms5097. PubMed PMID:24923382.

Uwe Bauer, et al., Magneto-ionic control of interfacial magnetism, Nature Materials (2014) doi:10.1038/nmat4134.

Herold, et al., Sub-pixel Structured OLED Microdisplay, SID 2013 Digest, ISSN 0097-966X/13/4401-0330.

Wakana, et al., Amorphous ZTO/ITO Stacked-Channel TFTs with Field Effect Mobility over 50 cm2/Vs and Resistant to Channel Thickness Dispersion, SID 2010 Digest, ISSN 0097-966X/10/4103-1287.

Song, et al., High Mobility Oxide TFTs for Future LCD Applications, SID 2013 Digest, ISSN 0097-966X/13/4401-0093.

Um, et al., High Speed a-IGZO TFT-based Gate Driver by using Back Channel Etched Structure, SID 2014 Digest, ISSN 0097-966X/14/4503-0968.

Geng, et al., High-Speed Shift Register for High Resolution AMD with Self-aligned Coplanar a-IGZO TFTs, SID 2012 Digest, ISSN 0097-966X/12/4301-0008.

Mativenga, et al., Improving Switching Characteristics of Amorphous-InGaZnO4, Thin-Film Transistors by Dual-Gate Driving, SID 2013 Digest, ISSN 0097-966X/13/4403-1062.

Chiu, et al., High-Performance a-IGZO Thin-Film Transistor Using Ta2O5 Gate Dielectric, IEEE Electron Device Letters, vol. 31, No. 11, Nov. 2010.

Lee, et al., Oxide TFT with Multilayer Gate Insulator for Backplane of AMOLED Device, Journal of the SID 16/2, 2008.

Morosawa, et al., A Novel Self-Aligned Top-Gate Oxide TFT for AM-OLED Displays, SID 2011 Digest, ISSN 0097-966X/11/4201-0479.

Shunpei, et al., Research, Development, and Application of Crystalline Oxide Semiconductor, SID Symposium Digest of Technical Papers, vol. 43, Issue 1, Jun. 2012, pp. 183-186 DOI: 10,1002/j.2168-0159.2012.tb05742.x.

Yoshiharu, et al., Development of IGZO-TFT and Creation of New Devices Using IGZO-TFT, SID Symposium Digest of Technical Papers, vol. 44, Issue 1, Jun. 2013, pp. 771-774, DOI: 10.1002/j.2168-0159.2013.tb06329.x.

Akio Yamashita, et al., A 513-ppi FFS-Mode TFT-LCD using CAAC Oxide Semiconductor Fabricated by a 6-Mask Process, SID Symposium Digest of Technical Papers, vol. 45, Issue 1, Jun. 2014, pp. 263-266, DOI: 10.1002/j.2168-0159.2014.tb00072.x.

Wooseok Song, et al., High-mobility ambipolar ZnO-graphene hybrid thin film transistors, Scientific Reports | 4:4064 | D0I:10.1038/srep04064.

Jiahao Kang, et al., High-performance $MoS_2$ transistors with low-resistance molybdenum contacts, Appl. Phys, Lett. 104, 093106 (2014).

Yuchen Du, et al., Contact research strategy for emerging molybdenum disulfide and other two-dimensional field-effect transistors, APL Materials 2, 092510 (2014): DOI: 10.1063/1.4894198.

Sunkook Kim, et al., High-mobility and low-power thin-film transistors based on multilayer $MoS_2$ crystals, Nature Communications 3, Article No. 1011 doi:10,1038/ncomms2018.

Haitian Chen, et al., Large-scale comlementary macroelectronics using hybrid integration of carbon nanotubes and IGZO thin-film transistors, Nature Communications, 2014, DOI: 10.1038/ncomms5097.

Yuan Liu, et al., Highly Flexible Electronics from Scalable Vertical Thin Film Transistors, Nano Letters, dx.doi.org/10.1021/n140-4484s.

Woo Jong Yu, et al., Vertically stacked multi-heterostructures of layered materials for logic transistors and complementary inverters, Nature Materials, vol. 12, Mar. 2013, DOI: 10.1038/NMAT3518.

Sang Hoon Chae, et al., Transferred wrinkled $Al_2O_3$ for highly stretchable and transparent graphene-carbon nanotube transistors, Nature Materials, vol. 12, May 2013, DOI:10.1038/NMAT3572.

International Preliminary Report on Patentability, for PCT Patent Application No. PCT/US2015/000171, dated Jun. 27, 2017, 7 pages.

\* cited by examiner (Refer to U.S. Patent 6,838,721 for definitions of number identifiers)

FIG. 11A

Maximum Ft as a function of M and Fm, assuming TFT size is $12Ft^2$

For a single layer TFT array of sufficient number for addressing bit lines in an area not larger than the related memory array.

Maximum Ft size for transistors for a given matrix of M x N memory cells in a crosspoint memory array, assuming one layer of TFTs occupying same area as memory layer, has sufficient number of TFTs to address the Bit lines (2xN TFTs needed)

Fm = technology node of memory cell (MTJ, BBSD, and conductive line)
Area of memory cell (C) = $4 Fm^2$
Ft = technology node of TFT transistor
Area of transistor (T) = $12 Ft^2$ for example (may range from 6 to 30 $Ft^2$)

Area of matrix = M x N x C (memory cells)
Area of matrix = 2 x N x T (bit driver TFTs)
M x N x C = 2 x N x T
(M x C) / 2 = T
(M x $4Fm^2$) / 2 = $12 Ft^2$
M x $Fm^2$ / 6 = $Ft^2$
Ft = Square Root of (M x $Fm^2$ / 6)

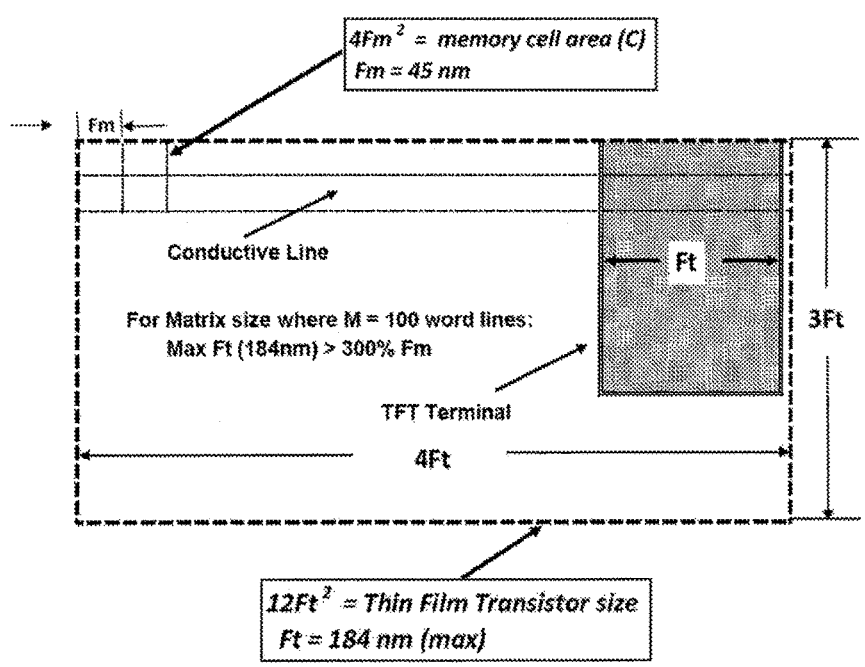

$4Fm^2$ = memory cell area (C)
Fm = 45 nm

For Matrix size where M = 100 word lines:
Max Ft (184nm) > 300% Fm

TFT Terminal $12Ft^2$ = Thin Film Transistor size
Ft = 184 nm (max)

FIG. 11B

Maximum Ft as a function of M and Fm, assuming TFT size (T) is 12Ft²
For a single layer TFT array of sufficient number for addressing bit lines in an area not larger than the related memory array.

Illustrates Decoupling of Technology Node requirement for Fabrication of Cross Point Memory Cell and TFT select transistors (Assume M = N)

| | Intro Year (Fm): 2020 | | Matrix side (L) | | Max |
|---|---|---|---|---|---|
| | M | Fm (nm) | L (μm) | L (cm) | Ft (nm) |
| | 1 | 7 | 0.014 | 0.0000014 | 2.9 |
| | 10 | 7 | 0.14 | 0.000014 | 9.0 |
| 10 Kbit > | 100 | 7 | 1.4 | 0.00014 | 29 |
| 1 Mbit > | 1,000 | 7 | 14 | 0.0014 | 90 |
| 100 Mbit > | 10,000 | 7 | 140 | 0.014 | 286 |
| 10 Gbit > | 100,000 | 7 | 1400 | 0.14 | 904 |
| 1 Tbit > | 1,000,000 | 7 | 14000 | 1.4 | 2,858 |

| Intro Year (Fm): 2019 | | Matrix side (L) | | Max |
|---|---|---|---|---|
| M | Fm (nm) | L (μm) | L (cm) | Ft (nm) |
| 1 | 32 | 0.064 | 6.4E-06 | 13.1 |
| 10 | 32 | 0.64 | 0.000064 | 41.3 |
| 100 | 32 | 6.4 | 0.00064 | 131 |
| 1,000 | 32 | 64 | 0.0064 | 413 |
| 10,000 | 32 | 640 | 0.064 | 1,306 |
| 100,000 | 32 | 6400 | 0.64 | 4,131 |
| 1,000,000 | 32 | 64000 | 6.4 | 13,064 |

| Intro Year (Fm): 2017 | | Matrix side (L) | | Max |
|---|---|---|---|---|
| M | Fm (nm) | L (μm) | L (cm) | Ft (nm) |
| 1 | 10 | 0.02 | 0.000002 | 4.1 |
| 10 | 10 | 0.2 | 0.00002 | 12.9 |
| 100 | 10 | 2 | 0.0002 | 41 |
| 1,000 | 10 | 20 | 0.002 | 129 |
| 10,000 | 10 | 200 | 0.02 | 408 |
| 100,000 | 10 | 2000 | 0.2 | 1,291 |
| 1,000,000 | 10 | 20000 | 2 | 4,082 |

(Assume M = N)

| | Intro Year (Fm): 2008 | | Matrix side (L) | | Max |
|---|---|---|---|---|---|
| | M | Fm (nm) | L (μm) | L (cm) | Ft (nm) |
| | 1 | 45 | 0.09 | 0.000009 | 18.4 |
| | 10 | 45 | 0.9 | 0.00009 | 58.1 |
| 10 Kbit > | 100 | 45 | 9 | 0.0009 | 184 |
| 1 Mbit > | 1,000 | 45 | 90 | 0.009 | 581 |
| 100 Mbit > | 10,000 | 45 | 900 | 0.09 | 1,837 |
| 10 Gbit > | 100,000 | 45 | 9000 | 0.9 | 5,809 |
| 1 Tbit > | 1,000,000 | 45 | 90000 | 9 | 18,371 |

| Intro Year (Fm): 2014 | | Matrix side (L) | | Max |
|---|---|---|---|---|
| M | Fm (nm) | L (μm) | L (cm) | Ft (nm) |
| 1 | 14 | 0.028 | 0.0000028 | 5.7 |
| 10 | 14 | 0.28 | 0.000028 | 18.1 |
| 100 | 14 | 2.8 | 0.00028 | 57 |
| 1,000 | 14 | 28 | 0.0028 | 181 |
| 10,000 | 14 | 280 | 0.028 | 572 |
| 100,000 | 14 | 2800 | 0.28 | 1,807 |
| 1,000,000 | 14 | 28000 | 2.8 | 5,715 |

| Intro Year (Fm): 2006 | | Matrix side (L) | | Max |
|---|---|---|---|---|
| M | Fm (nm) | L (μm) | L (cm) | Ft (nm) |
| 1 | 65 | 0.13 | 0.000013 | 26.5 |
| 10 | 65 | 1.3 | 0.00013 | 83.9 |
| 100 | 65 | 13 | 0.0013 | 265 |
| 1,000 | 65 | 130 | 0.013 | 839 |
| 10,000 | 65 | 1300 | 0.13 | 2,654 |
| 100,000 | 65 | 13000 | 1.3 | 8,391 |
| 1,000,000 | 65 | 130000 | 13 | 26,536 |

| Intro Year (Fm): 2012 | | Matrix side (L) | | Max |
|---|---|---|---|---|
| M | Fm (nm) | L (μm) | L (cm) | Ft (nm) |
| 1 | 22 | 0.044 | 0.0000044 | 9.0 |
| 10 | 22 | 0.44 | 0.000044 | 28.4 |
| 100 | 22 | 4.4 | 0.00044 | 90 |
| 1,000 | 22 | 44 | 0.0044 | 284 |
| 10,000 | 22 | 440 | 0.044 | 898 |
| 100,000 | 22 | 4400 | 0.44 | 2,840 |
| 1,000,000 | 22 | 44000 | 4.4 | 8,981 |

| Intro Year (Fm): 2004 | | Matrix side (L) | | Max |
|---|---|---|---|---|
| M | Fm (nm) | L (μm) | L (cm) | Ft (nm) |
| 1 | 90 | 0.18 | 0.000018 | 36.7 |
| 10 | 90 | 1.8 | 0.00018 | 116.2 |
| 100 | 90 | 18 | 0.0018 | 367 |
| 1,000 | 90 | 180 | 0.018 | 1,162 |
| 10,000 | 90 | 1800 | 0.18 | 3,674 |
| 100,000 | 90 | 18000 | 1.8 | 11,619 |
| 1,000,000 | 90 | 180000 | 18 | 36,742 |

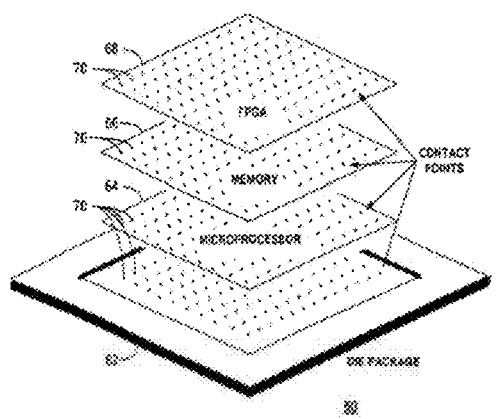
(Fig. 4 of U.S. Patent 7,282,951)
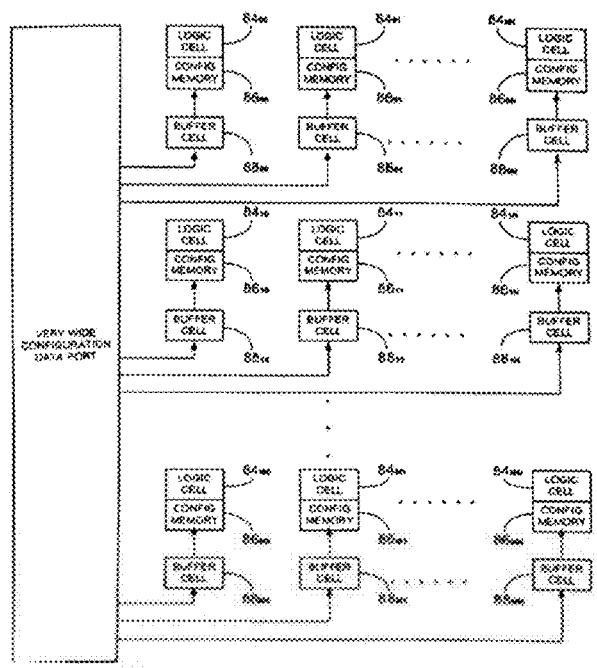
(Fig. 5 of U.S. Patent 7,282,951)
Fig. 23C
(Prior Art)

Von-Neumann Computer Model

Typical System Architecture

*Typical Flip Chip BGA Package (Cross-Sectional View)*

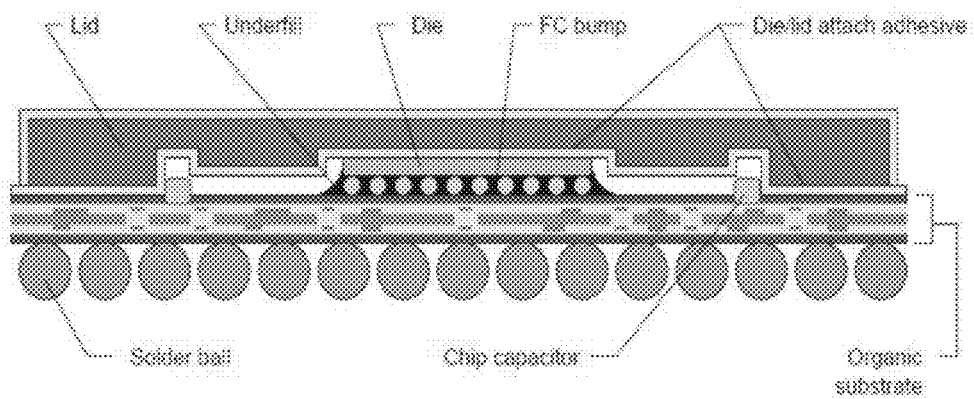
Fig. 27 (Prior art)
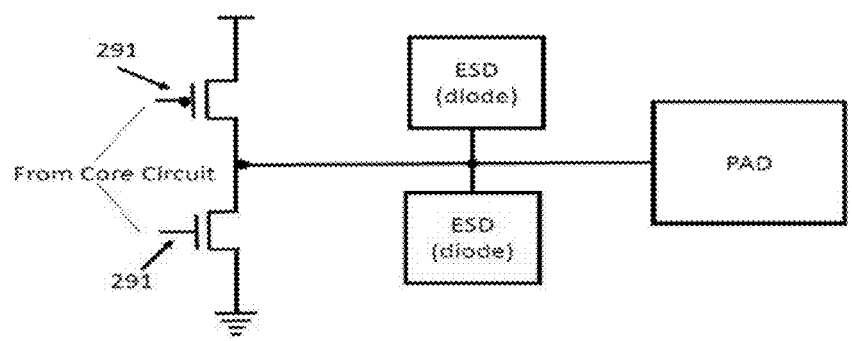
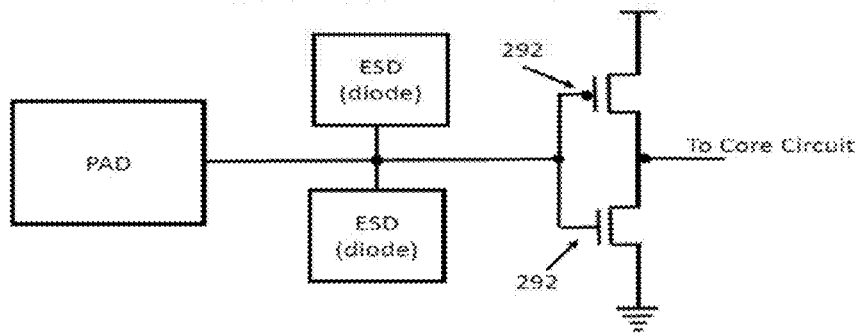
Fig. 28 (Prior art)

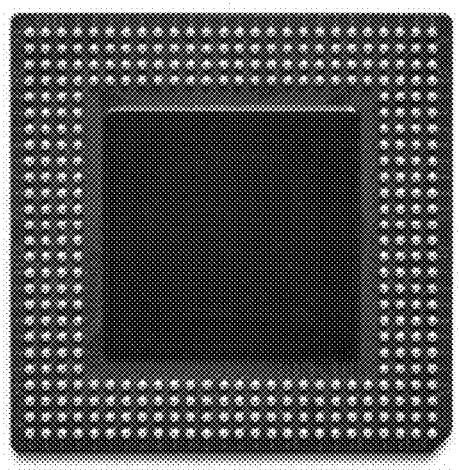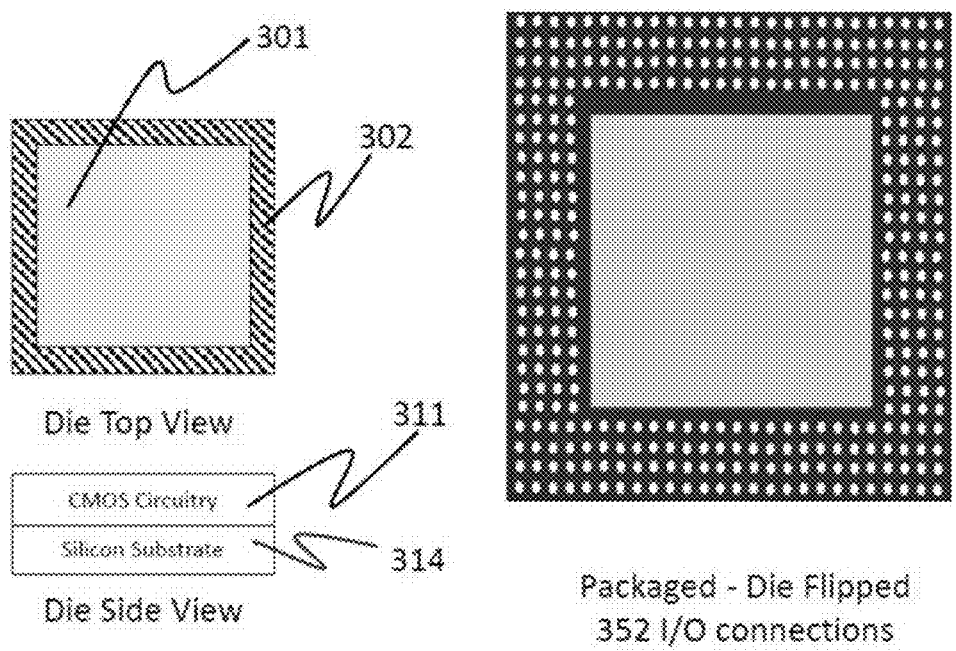
Fig. 29 (Prior art)

Display (1920 x 1080 pixels, 4μm pitch)

THREE DIMENSION INTEGRATED CIRCUITS EMPLOYING THIN FILM TRANSISTORS

CROSS-REFERENCE TO RELATED APPLICATIONS

This application is a continuation in part to U.S. patent application Ser. No. 14/021,216, having a filing date of Sep. 9, 2013, now U.S. Pat. No. 8,952,470 issued Feb. 10, 2015; and also claims priority to U.S. Provisional Application Nos. 61/699,211 filed Sep. 10, 2012, expired and 61/702,485 filed Sep. 18, 2012, expired. This application also claims the benefit of Provisional Application No. 61/980,147, filed on Apr. 16, 2014, pending. The specifications of each of these applications are incorporated herein by reference in their entirety.

FEDERALLY SPONSORED RESEARCH

None.

SEQUENCE LISTING

None.

PRIOR ART REFERENCES

U.S. Patent Application publication 2014/0021038, Jan. 23, 2014—Kusumi et. al.
U.S. Patent Application publication 2014/0273340, Sep. 18, 2014—Van Duren et. al.
U.S. Patent Application publication 2013/0200365, Aug. 8, 2013—Yamazaki
U.S. Patent Application publication 2012/0281465, Nov. 8, 2012—Agan et. al.
U.S. Patent Application publication 2012/0257449, Oct. 11, 2012—Agan et. al.
U.S. Patent Application publication 2012/0307549, Dec. 12, 2012—Agan et. al.
U.S. Patent Application publication 2012/0313688, Dec. 13, 2012—Agan et. al.
U.S. Patent Application publication, 2014/0177327, Jun. 26, 2014—Khalili Amiri, et. al.
U.S. Patent Application publication, 2014/0169085, Jun. 19, 2014—Wang, et. al.
U.S. Patent Application publication, 2014/0124882, May 8, 2014—Khalili Amiri, et. al.
PCT Patent publication WO 2012/159078, Nov. 22, 2012—Khalili Amiri et. al.
U.S. Patent Application publication 2014/0071732, Mar. 13, 2014—Khalili Amiri et. al.
U.S. Patent Application publication 2014/0071728, Mar. 13, 2014—Khalili Amiri et. al.
U.S. Patent Application publication 2014/0070344, Mar. 13, 2014—Khalili Amiri et. al.
U.S. Patent Application publication 2013/0015542, Jan. 17, 2013—Wang et. al.
U.S. Patent Application publication 2014/0151752, Jun. 5, 2014—Atkinson et. al.
U.S. Pat. No. 6,181,167, Jan. 30, 2001—Agan
U.S. Pat. No. 7,656,185, Feb. 2, 2010—Kim, et. al.
U.S. Pat. No. 8,207,754, Jun. 26, 2012—Garg, et. al.
U.S. Pat. No. 8,169,068, May 1, 2012—Wu, et. al.
U.S. Pat. No. 7,989,940, Aug. 2, 2011—Halm, et. al.
U.S. Pat. No. 8,405,421, Mar. 26, 2013—Agan et. al.
U.S. Pat. No. 7,282,951, Oct. 16, 2007—Huppenthal et. al.
U.S. Pat. No. 6,750,540, Jun. 15, 2004—Kim
U.S. Pat. No. 5,640,343, Jun. 17, 1997—Gallagher et. al.
U.S. Pat. No. 7,224,601, May 29, 2007—Panchula
U.S. Pat. No. 7,529,121, May 5, 2009—Kitagawa et. al.
U.S. Pat. No. 6,838,721, Jan. 4, 2005—Garth et. al.
U.S. Pat. No. 7,668,005, Feb. 23, 2010—Ueda
U.S. Patent Application publication 2010/0213458, Aug. 26, 2010—Prall
U.S. Pat. No. 8,411,494, Apr. 2, 2013—Shukh
U.S. Pat. No. 8,227,788, Jul. 24, 2012—Mikawa et. al.
U.S. Pat. No. 7,608,514, Oct. 27, 2009—Hsu et. al.
U.S. Pat. No. 7,968,419, Jun. 28, 2011—Li et. al.
U.S. Pat. No. 8,289,746, Oct. 16, 2012—Chen, et. al.
U.S. Pat. No. 7,936,580, May 3, 2011—Chen, et. al.
U.S. Pat. No. 8,158,964, Apr. 17, 2012—Kim, et. al.
U.S. Pat. No. 8,351,241, Jan. 8, 2013—Lu, et. al.
U.S. Patent Application publication 2012/0224417, Sep. 6, 2012—Wang, et. al.
U.S. Patent Application publication 2013/0044532, Feb. 21, 2013—Bethune, et. al.
U.S. Patent Application publication 2013/0223125, Aug. 29, 2013—DeBrosse, et. al.
U.S. Patent Application publication 2013/0003448, Jan. 3, 2013—Chen, et. al,
U.S. Patent Application publication 2014/0001462, Jan. 2, 2014—Shieh, et. al.
U.S. Patent Application publication 2013/0119396, May 16, 2013—Yu, et. al.
U.S. Pat. No. 5,757,139, May 26, 1998—Forrest, et. al.
U.S. Pat. No. 5,917,280, Jun. 29, 1999—Burrows, et. al.
U.S. Pat. No. 5,932,895, Aug. 3, 1999—Shen, et. al.
U.S. Pat. No. 6,232,714, May 15, 2001—Shen, et. al.
U.S. Pat. No. 6,872,472, Mar. 25, 2005—Liao, et. al.
U.S. Patent Application publication, 2006/0261731, Nov. 23, 2006—Aziz, et. al.
U.S. Patent Application publication, 2008/0074356, Mar. 27, 2008—Cok
U.S. Patent Application publication, 2010/0221857, Sep. 2, 2010—Cok
U.S. Pat. No. 7,800,565, Sep. 21, 2010—Nathan, et. al.
U.S. Pat. No. 8,845,109, Sep. 30, 2014—Wang
U.S. Pat. No. 5,897,190, Apr. 27, 1999—Takahashi
U.S. Patent Application publication 2013/0033199, Feb. 7, 2013—Ali, et. al.
U.S. Pat. No. 8,823,076, Sep. 2, 2014—Lee, et. al.
U.S. Pat. No. 8,853,765, Oct. 7, 2014—Lee, et. al.
U.S. Pat. No. 8,492,886, Jul. 23, 2013—Or-Bach, et. al.
U.S. Pat. No. 7,193,239, Mar. 20, 2007—Leedy
U.S. Patent Application publication, 2014/0145272, May 29, 2014—Or-Bach, et. al.
U.S. Patent Application publication, 2013/0193488, Aug. 1, 2013—Or-Bach, et. al.
U.S. Patent Application publication 2014/0077161, Mar. 20, 2014—Duan, et. al.
U.S. Patent Application publication 2014/0206182, Jul. 24, 2014—Chen, et. al.
U.S. Patent Application publication 2014/0008616, Jan. 9, 2014—Geim, et. al.
U.S. Patent Application publication 2014/0197459, Jul. 17, 2014—Kis, et. al.
U.S. Patent Application publication 2014/0035478, Feb. 6, 2014—Kitakado, et. al.
U.S. Patent Application publication 2013/0175521, Jul. 11, 2013—Moriguchi, et. al.

U.S. Pat. No. 7,288,480, Oct. 30, 2007—Yamaguchi, et. al.
U.S. Patent Application publication 2014/0231803, Aug. 21, 2014—Yamazaki
U.S. Pat. No. 8,726,176, May 13, 2014—Yamazaki
U.S. Patent Application publication 2012/0132910, May 31, 2012—Yamazaki, et. al.
U.S. Pat. No. 8,115,201, Feb. 14, 2012—Yamazaki, et. al.
U.S. Patent Application publication 2014/0340608, Nov. 20, 2014—Yamazaki, et. al.
U.S. Patent Application publication 2014/0340116, Nov. 20, 2014—Okamoto, et. al.
U.S. Patent Application publication 2014/0340117, Nov. 20, 2014—Takemura
U.S. Patent Application publication 2014/0340115, Nov. 20, 2014—Kurokawa
U.S. Patent Application publication 2014/0340888, Nov. 20, 2014—Ishisone, et. al.
U.S. Patent Application publication 2014/0339560, Nov. 20, 2014—Yamazaki, et. al.
U.S. Patent Application publication 2014/0339549, Nov. 20, 2014—Yamazaki, et. al.
U.S. Patent Application publication 2014/0339548, Nov. 20, 2014—Yamazaki, et. al.
U.S. Patent Application publication 2014/0339547, Nov. 20, 2014—Hondo, et. al.
U.S. Patent Application publication 2014/0339546, Nov. 20, 2014—Yamazaki, et. al.
U.S. Patent Application publication 2014/0339545, Nov. 20, 2014—Yamazaki
U.S. Patent Application publication 2014/0339541, Nov. 20, 2014—Kato, et. al.
U.S. Patent Application publication 2014/0339540, Nov. 20, 2014—Takemura, et. al.
U.S. Patent Application publication 2014/0339539, Nov. 20, 2014—Yamazaki, et. al.
U.S. Patent Application publication 2014/0339538, Nov. 20, 2014—Yamazaki, et. al.
U.S. Patent Application publication 2014/0333365, Nov. 13, 2014—Takahashi, et. al.
U.S. Patent Application publication 2014/0332800, Nov. 13, 2014—Hanaoka
U.S. Patent Application publication 2014/0326998, Nov. 6, 2014—Honda
U.S. Patent Application publication 2014/0326994, Nov. 6, 2014—Tanaka
U.S. Patent Application publication 2014/0326993, Nov. 6, 2014—Oikawa, et. al.
U.S. Patent Application publication 2014/0326992, Nov. 6, 2014—Hondo, et. al.
U.S. Patent Application publication 2014/0326991, Nov. 6, 2014—Matsubayashi, et. al.
U.S. Patent Application publication 2014/0325249, Oct. 30, 2014—Toyotaka
U.S. Patent Application publication 2014/0319517, Oct. 30, 2014—Noda, et. al.
U.S. Patent Application publication 2014/0319516, Oct. 30, 2014—Tanaka, et. al.
U.S. Patent Application publication 2014/0319514, Oct. 30, 2014—Noda, et. al.
U.S. Patent Application publication 2014/0346505, Nov. 27, 2014—Asami, et. al.
U.S. Patent Application publication 2014/0226401, Aug. 14, 2014—Yamazaki, et. al,
U.S. Patent Application publication 2014/0097867, Apr. 10, 2014—Koyama
U.S. Patent Application publication 2014/0061639, Mar. 6, 2014—Yamazaki, et. al.
U.S. Patent Application publication 2014/0035671, Feb. 6, 2014—Shionoiri, et. al.
U.S. Patent Application publication 2014/0015566, Jan. 16, 2014—Yoneda, et. al.
U.S. Patent Application publication 2014/0266305, Sep. 18, 2014—Shionoiri, et. al.
U.S. Patent Application publication 2013/0082984, Apr. 4, 2013—Drzaic, et. al
U.S. Patent Application publication 2014/0209689, Jul. 31, 2014—Tang
U.S. Patent Application publication 2014/0217565, Aug. 7, 2014—Carroll
U.S. Patent Application publication 2014/0346571, Nov. 27, 2014—Udaya
U.S. Patent Application publication 2013/0002296, Jan. 3, 2013—Madurawe
U.S. Pat. No. 8,856,699, Oct. 7, 2014—Madurawe
U.S. Pat. No. 8,829,664, Sep. 9, 2014—Madurawe
U.S. Patent Application publication 2012/0319728, Dec. 20, 2012—Madurawe
U.S. Patent Application publication 2014/0117413, May 1, 2014—Madurawe
U.S. Patent Application publication 2009/0128189, May 21, 2009—Madurawe, et. al.
U.S. Patent Application publication 2009/0004788, Jan. 1, 2009—Madurawe
U.S. Pat. No. 7,635,988, Dec. 22, 2009—Madurawe
U.S. Pat. No. 7,265,421, Sep. 4, 2007—Madurawe
U.S. Pat. No. 7,018,875, Mar. 28, 2006—Madurawe
U.S. Pat. No. 7,777,319, Aug. 17, 2010—Madurawe
U.S. Pat. No, 7,656,192, Feb. 2, 2010—Madurawe
U.S. Pat. No. 7,538,575, May 26, 2009—Madurawe
U.S. Pat. No. 7,446,563, Nov. 4, 2008—Madurawe
U.S. Pat. No. 7,112,994, Sep. 26, 2006—Madurawe
U.S. Patent Application publication 2004/0004239, Jan. 8, 2004—Madurawe
U.S. Patent Application publication 2013/0264536, Oct. 10, 2013—Tour, et. al.
U.S. Patent Application publication 2014/0320166, Oct. 30, 2014—Nazarian, et. al.
U.S. Patent Application publication 2014/0312296, Oct. 23, 2014—Jo, et. al.
Non-Volatile Memory and Normally-Off Computing, T. Kawahara, Central Research Laboratory, Hitachi, Ltd., ASP-DAC 2011, Jan. 26, 2011, Yokohama, Japan
Spin-transfer torque magnetoresistive random-access memory technologies for normally off computing. K. Ando, S. Fujita, J. Ito, S. Yuasa, Y. Suzuki, Y. Nakatani, T. Miyazaki, and H. Yoda. Journal of Applied Physics, 2014 DOI: 10.1063/1.4869828
Low-Temperature-Grown Transition Metal Oxide Based Storage Materials and Oxide Transistors for High-Density Non-volatile Memory, Advanced Functional Materials, Volume 19, Issue 10, pages 1587-1593, May 22, 2009
Nanometer-Scale Oxide Thin Film Transistor with Potential for High-Density Image Sensor Applications, Sanghun Jeon, Sungho Park, Ihun Song, Ji-Hyun Hur, Jaechul Park, Hojung Kim, Sunil Kim, Sangwook Kim, Huaxiang Yin, U-In Chung, Eunha Lee, and Changjung Kim, APPLIED MATERIALS & INTERFACES, Vol. 3, No. 1, 1-6, 2011
Short channel device performance of amorphous InGaZnO thin film transistor, Sanghun Jeon, Anass Benayad, Seung-Eon Ahn, Sungho Park, Ihun Song, Changjung Kim and U-In Chung, APPLIED PHYSICS LETTERS 99, 082104 (2011)

A MIM diode with ultra abrupt switching process and high on/off current ratio, Lijie Zhang, Ru Huang, Institute of Microelectronics, Peking University, Beijing 100871, P.R. China, ECS TRANSACTIONS; 35, 4; 923-930, Silicon nitride, silicon dioxide, and emerging dielectrics International Symposium; 11th, Silicon nitride, silicon dioxide, and emerging dielectrics, 2011

Complementary resistive switches for passive nanocrossbar memories, Linn E, Rosezin R, Kügeler C, Waser R. Nat Mater. 2010 May; 9(5):403-6. doi: 10.1038/nmat2748. Epub 2010 Apr. 18.

Nanoscale Bipolar and Complementary Resistive Switching Memory Based on Amorphous Carbon, Chai Y, Wu Y, et. al., IEEE Transactions on Electron Devices, Vol. 58, No. 11, November 2011.

High Performance a-IGZO TFT with Nano-Dots Doping, Hsiao-Wen Zan, Wu-Wei Tsai, Chia-Hsin Chen, Chuang-Chuang Tsai and Hsin-Fei Meng, SID Symposium Digest of Technical Papers Volume 42, Issue 1, pages 28-31, June 2011

High Density Spin-Transfer Torque (STT)-MRAM based on Cross-Point Architecture, Weisheng Zhao, Sumanta Chaudhuri, Celso Accoto, Jacques-Olivier Klein, Dafiné Ravelosonal, Claude Chappert, Pascale Mazoyer, 978-1-4673-1081-9/12, 2012 IEEE Large-scale complementary macroelectronics using hybrid integration of carbon nanotubes and IGZO thin-film transistors, Chen H, Cao Y, Zhang J, Zhou C. Nat Commun. 2014 Jun. 13; 5:4097. doi: 10.1038/ncomms5097. PubMed PMID: 24923382

Electric-field-assisted switching in magnetic tunnel junctions, Wei-GangWang, Mingen Li, Stephen Hageman and C. L. Chien, NATURE MATERIALS, VOL 11, Page 64-88, JANUARY 2012

Deterministic switching of ferromagnetism at room temperature using an electric field, J. T. Heron, J. L. Bosse, Q. He, Y. Gao, M. Trassin, L. Ye, J. D. Clarkson, C. Wang, Jian Liu, S. Salahuddin, D. C. Ralph, D. G. Schlom, J. Íñiguez, B. D. Huey & R. Ramesh, Nature, 516, 370-373 (18 Dec. 2014), doi:10.1038/nature14004

Magneto-ionic control of interfacial magnetism, Uwe Bauer, Lide Yao, Aik Jun Tan, Parnika Agrawal, Satoru Emori, Harry L. Tuller, Sebastiaan van Dijken & Geoffrey S. D. Beach, Nature Materials, (2014) doi:10.1038/nmat4134

Sub-pixel Structured OLED Microdisplay, Herold, Zakhidov, Vogel, Richter, Fehse, and Burghart, SID 2013 Digest, ISSN 0097-966X/13/4401-0330

Amorphous ZTO/ITO Stacked-Channel TFTs with Field Effect Mobility over 50 $cm^2$/Vs and Resistant to Channel Thickness Dispersion, Wakana, Kawamura, Fujii, Uchiyama, and Hatano, SID 2010 Digest, ISSN 0097-966X/10/4103-1287

High Performance a-IGZO TFT with Nano-Dots Doping, Zan, Tsai, Chen, Tsai, and Meng, SID 2011 Digest, ISSN 0097-966X/11/4201-0028

High Mobility Oxide TFTs for Future LCD Applications, Song, Lim, Aim, Lee, SID 2013 Digest, ISSN 0097-966X/13/4401-0093

High Speed a-IGZO TFT-based Gate Driver by using Back Channel Etched Structure, Ulm, Mativenga, Geng, Li and Jang, SID 2014 Digest, ISSN 0097-966X/14/4503-0968

High-Speed Shift Register for High Resolution AMD with Self-aligned Coplanar a-IGZO TFTs, Geng, Kang, Seok, Mativenga and Jang, SID 2012 Digest, ISSN 0097-966X/12/4301-0008

Improving Switching Characteristics of Amorphous-In-GaZnO$_4$, Thin-Film Transistors by Dual-Gate Driving, Mativenga, Geng, Um, Seok, Kang, Jang, Mruthyunjaya, Heiler and Tredwell, SID 2013 Digest, ISSN 0097-966X/13/4403-1062

High-Performance a-IGZO Thin-Film Transistor Using Ta2O5 Gate Dielectric, Chiu, Chang, and Chang, IEEE ELECTRON DEVICE LETTERS, VOL. 31, NO. 11, November 2010

Oxide TFT with Multilayer Gate Insulator for Backplane of AMOLED Device, Lee, Kyung, Sung, D. Y. Kim, Kang, S J Kim, C N Kim, H G Kim and S T Kim, Journal of the SID 16/2, 2008

Oxide-TFT Technologies for Next-Generation AMOLED Displays, Arai, Journal of the SID 20/3, 2012

A Novel Self-Aligned Top-Gate Oxide TFT for AM-OLED Displays, Morosawa, Ohshima, Morooka, Arai and Sasaoka, SID 2011 Digest, ISSN 0097-966X/11/4201-0479

Research, Development, and Application of Crystalline Oxide Semiconductor, Shunpei Yamazaki, Jun Koyama, Yoshitaka Yamamoto and Kenji Okamoto, SID SYMPOSIUM DIGEST OF TECHNICAL PAPERS, Volume 43, Issue 1, June 2012, Pages: 183-186 DOI: 10.1002/j.2168-0159.2012.tb05742.x Development of IGZO-TFT and Creation of New Devices Using IGZO-TFT, Yoshiharu Kataoka, Hajime Imai, Yukinobu Nakata, Tohru Daitoh, Takuya Matsuo Naofumi Kimura, Taketoshi Nakano, Yukio Mizuno, Taimi Oketani, Masahiro Takahashi, Masashi Tsubuku, Hiroyuki Miyake, Tetsuji Ishitani Yoshiharu Hirakata, Jun Koyama, Shunpei Yamazaki, Junichi Koezuka and Ken-ichi Okazaki, SID SYMPOSIUM DIGEST OF TECHNICAL PAPERS Volume 44, Issue 1, June 2013, Pages: 771-774, DOI: 10.1002/j.2168-0159.2013.tb06329.x Future Possibility of C-Axis Aligned Crystalline Oxide Semiconductors Comparison with Low-Temperature Polysilicon, Shunpei Yamazaki, SID SYMPOSIUM DIGEST OF TECHNICAL PAPERS, Volume 45, Issue 1, June 2014, Pages: 9-12, 7 Jul. 2014, DOI: 10.1002/j.2168-0159.2014.tb00003.x A 513-ppi FFS-Mode TFT-LCD using CAAC Oxide Semiconductor Fabricated by a 6-Mask Process, Akio Yamashita, Daisuke Kubota, Koji Moriya, Yusuke Kubota, Mika Jikumaru, Masaru Nakano, Haruyuki Baba, Yoshiharu Hirakata, Jun Koyama, Shunpei Yamazaki, Masahiro Katayama, Chieko Misawa, Hiroshi Matsukizono, Yohsuke Kanzaki, Seiji Kaneko, Naoki Ueda, Shigeyasu Mori and Takuya Matsuo, SID SYMPOSIUM DIGEST OF TECHNICAL PAPERS Volume 45, Issue 1, June 2014, Pages: 263-266, DOI: 10.1002/j.2168-0159.2014.tb00072.x Few-layer molybdenum disulfide transistors and circuits for high-speed flexible electronics, Rui Cheng, Shan Jiang, Yu Chen, Yuan Liu, Nathan Weiss, Hung-Chieh Cheng, Hao Wu, Yu Huang & Xiangfeng Duan, Nature 5, Article number: 5143 doi: 10.1038/ncomms6143

Highly Flexible Electronics from Scalable Vertical Thin Film Transistors, Yuan Liu, Hailong Zhou, Rui Cheng, Woojong Yu, Yu Huang, and Xiangfeng Duan, Nano Letters, dx.doi.org/10.1021/nl404484s Vertically stacked multi-heterostructures of layered materials for logic transistors and complementary inverters, Woo Jong Yu, Zheng Li, Hailong Zhou, Yu Chen, Yang-Wang, Yu Huang and Xiangfeng Duan, NATURE MATERIALS, Vol. 12, March 2013, DOI: 10.1038NMAT3518

Transferred wrinkled Al2O3 for highly stretchable and transparent graphene-carbon nanotube transistors, Sang Hoon Chae, Woo Jong Yu, Jung Jun Bae, Dinh Loc Duong, David Perello, Hye Yun Jeong, Quang Huy Ta, Thuc Hue Ly, Quoc An Vu, Minhee Yun, Xiangfeng Duan and Young Hee Lee, NATURE MATERIALS, Vol. 12, May 2013, DOI: 10.1038/NMAT3572

High-mobility ambipolar ZnO-graphene hybrid thin film transistors, Wooseok Song, Soon Yeol Kwon, Sung Myung, Min Wook Jung, Seong Jun Kim, Bok Ki Min, Min-A Kang, Sung Ho Kim, Jongsun Lim & Ki-Seok An, SCIENTIFIC REPORTS | 4:4064 | DOI: 10.1038/srep04064

High-performance MoS$_2$ transistors with low-resistance molybdenum contacts, Jiahao Kang, Wei Liu and Kaustav Banerjee, Appl. Phys. Lett. 104, 093106 (2014)

Contact research strategy for emerging molybdenum disulfide and other two-dimensional field-effect transistors, Yuchen Du, Lingming Yang, Han Liu, and Peide D. Ye, APL Materials 2, 092510 (2014); doi: 10.1063/1.4894198

High-mobility and low-power thin-film transistors based on multilayer MoS$_2$ crystals, Sunkook Kim, Aniruddha Konar, Wan-Sik Hwang, Jong flak Lee, Jiyoul Lee, Jae-hyun Yang, Changhoon Jung, Hyoungsub Kim, Ji-Beom Yoo, Jae-Young Choi, Yong Wan Jin, Sang Yoon Lee, Debdeep Jena, Woong Choi & Kinam Kim, *Nature Communications* 3, Article number: 1011 doi:10.1038/ncomms2018

Graphene-based flexible and stretchable thin film transistors, Chao Yan, Jeong Ho Cho and Jong-Hyun Ahn, Nanoscale, 2012, 4, 4870 DOI: 10.1039/c2nr30994g Large-scale complementary macroelectronics using hybrid integration of carbon nanotubes and IGZO thin-film transistors, Haitian Numonyx Chen, Yu Cao, Jialu Zhang, Chongwu Zhou, *Nature Communications,* 2014, DOI: 10.1038/ncomms5097

FIELD OF THE APPLICATION

The present discloser is related to nonvolatile memory arrays and integrated circuits; more specifically, to crosspoint memory arrays employing thin-film transistors (TFTs) as selection elements, enabling low cost monolithic three-dimensional memory arrays for stand alone memory chips or on-chip embedded memory. The monolithic 3D stacking of TFTs are also employed to enable 3D memory and logic circuit devices with high density, low cost and high speed due to drastically reduced interconnect distances. Further TFTs are implemented to enable high I/O connectivity to ICs of all types and may be fabricated on a multilayer substrate such as a printed circuit board to allow for design of I/O circuitry and related metal interconnects between ICs on a single component and potentially full integration of IC fabrication and interconnection of ICs onto a single substrate.

EXPLANATION OF REFERENCE NUMERALS, TEXT AND ABBREVIATIONS 02 first metal layer
04 second metal layer
10 back to back Schottky diode
11 first Schottky contact
12 pinned (or reference) magnetic layer
13 second Schottky contact
14 tunnel barrier layer
15 first diode
16 free (or storage) magnetic layer
17 second diode
18 amorphous semiconductor layer or semiconductor layer
21 nonvolatile memory element
22 array of memory cells
24 bit line driver
26 word line driver
28 source line driver
30 magnetic random access memory (MRAM) array
31 magnetic memory element or magnetic tunnel junction (MTJ)
32 pinned (or reference) magnetic layer
33 barrier layer
34 free (or storage) magnetic layer
36 second semiconductor layer
42 pinned ferromagnetic layer
43 spacer layer
44 reference ferromagnetic layer
51 resistive memory element
52 first electrode
54 second electrode
56 medium layer
60 silicon substrate
61 CMOS circuitry layer
62 interconnect layer
63 MTJ layer including, MTJ elements, back to back Schottky diodes and conductive lines
64 thin film transistor (TFT) layer
65 interconnects
66 word conductive lines—common to two MTJ layers
70 glass substrate
72 conductive wire
74 magnetic flux concentrator
76 non-magnetic gap
80 conductive line, representing either a bit or word line
81 area available for thin film transistor
82 area for interconnect between conductive line and thin film transistor
84 conductive line, representing either a bit (or word line)
85 conductive line, representing either a word (or bit line) wrapped from other side of memory array to face same direction as bit lines (or word lines) for interconnection to TFT array
88 memory array(s) with lower mobility (TFT) select transistors
90 cache memory I/O interface
91 embedded cache memory I/O interface
92 die attached cache memory I/O interface
93 I/O interconnects between external memory signals and cache memory
94 I/O interconnects between cache memory and memory array (88)
221—Connection Block
222—Switch Block
223—Vertical Interconnects
224—Logic Block
291—I/O transistors of output signal driver circuit
292—I/O transistors of input signal driver circuit
301—Core circuitry of IC chip
302—I/O circuitry typically found on periphery of IC chip
311—CMOS circuitry
312—I/O circuitry area comprised of TFTs 313—TFT circuitry
314—Silicon substrate
321—I/O circuitry
322—Microdisplay
323—One display layer of a stacked display
324—One of a plurality of layers of TFT-based logic circuitry
325—One of a plurality of layers of TFT-based Non-volatile memory circuitry
326—Substrate
327—First Substrate—glass, quartz, PCB or other suitable for fabrication of TFTs
328—Second substrate—glass, quartz, PCB or other suitable for fabrication of TFTs
330—Multilayer first substrate which may be a PCB or other multilayer substrate suitable for fabrication of TFTs
331—Memory core circuitry chip on second substrate without I/O TFT circuitry
331X—Memory core circuitry chip on a second substrate without TFTs—just memory elements in crosspoint array
3311—Memory core circuitry chip on second substrate including I/O TFT circuitry and TFTs for drivers, decoder logic, sense circuits and bandgap circuits
332—Microprocessor core circuitry chip on second substrate with conventional I/O
332W—Microprocessor core circuitry chip on second substrate with Wide I/O pinouts to be mated to TFT-based I/O circuitry on first substrate
333—TFT based I/O circuitry on first substrate
333X—I/O pads only
333P—TFT-based I/O circuitry on first substrate for microprocessor core circuitry on second substrate
333M—TFT-based I/O circuitry on first substrate for memory core circuitry on second substrate
333M2—TFT-based I/O circuitry on second substrate for memory core circuit on second substrate
334—I/O interconnects (bus lines)
335—Solder bumps
336—Memory core circuitry, including memory elements and TFTs for drivers, decoder logic, sense circuits and bandgap circuits
337—Microprocessor core circuitry
339—TFTs for memory core circuitry including transistors for drivers, decoder logic, sense circuits and bandgap circuits
340—Glass, quartz or other first substrate suitable for fabrication of TFTs
341—Metal line interconnects on or above first substrate
360—Second substrate where core circuitry resides to be mated to TFT-based I/O circuitry on first substrate
361—Cache memory chip interface between microprocessor (332) and memory core circuitry chip (331)
933P—TFT-based WIDE I/O circuitry for microprocessor core circuitry
933M—TFT-based WIDE I/O circuitry for memory core circuitry
934—WIDE I/O interconnects (bus lines) on or above first substrate
4012—Common word lines for MTJ-L1 and MTJ-L2
4034—Common word lines for MTJ-L3 and MTJ-L4
4055—Word lines for MTJ-L5
4090—Interconnect metal lines to I/O pads
4099L—Common Word lines vertically connected along left side of memory array and wrapped below stack of memory arrays in close proximity to TFT layers
4099R—Common Word lines vertically connected along right side of memory array and wrapped below stack of memory arrays in close proximity to TFT layers
5051—Bit lines for MTJ-L1
5052—Bit lines for MTJ-L2
5053—Bit lines for MTJ-L3
5054—Bit lines for MTJ-L4
5055—Bit lines for MTJ-L5
A ($A_1$-$A_N$)—The selective voltage level for the bit line driver, from two or more sources
AOS—Amorphous Oxide Semiconductor
ASIC—Application Specific Integrated Circuit
ASSP—Application Specific Standard Product
B ($B_1$-$B_M$)—The selective voltage level for the word line driver, from two or more sources
BBSD—back to back Schottky diode
BL, BL1, BL2, BL3 . . . BLN bit line
C, C11-C33 . . . CNM memory cell
CBRAM—Conductive Bridge Random Access Memory
CPU—Central Processing Unit
DSP—Digital Signal Processor
Fm minimum feature size of technology node for MTJ layer (including MTJ, conductive lines, and BBSD)
Ft minimum feature size of technology node for TFT layer
Fc minimum feature size of technology node for CMOS circuitry layer
FPGA—Field Programmable Gate Array
GPU—Graphical Processing Unit
J, J11-J33 magnetic tunnel junction
K, K11-K33 KNM (memory element) magnetic tunnel junction and semiconductor layer comprising a portion of a back to back Schottky diode
M—number of Word lines in a memory array
MC, MC1, MC2—memory cell
ML, ML1, ML2—memory layer
MEMS—Micro-Electro-Mechanical Systems
N—number of Bit lines in a memory array
MeRAM—Magnetoelectric Random Access Memory or Magnetic Random Access Memory
MRAM—Magnetoresistive Random Access Memory or Magnetic Random Access Memory
MTJ—magnetic tunnel junction
MTJ-Ln—MTJ layer, including memory array, BBSD and conductive lines
P—I/O Pad Pitch
PCB—printed circuit board
PCM or PCRAM—Phase Change Random Access Memory
PLD—Programmable Logic Device
ReRAM or RRAM—Resistive Random Access Memory
SA1-SA3 . . . SA$_M$ sense amplifier
STT-MRAM—Spin Torque Transfer MRAM
TFT—thin film transistor
TFT-Ln—TFT layer, including TFT array
Tb1-Tb6 . . . Tb(N×2) bit line driver transistor
Ts1-Ts3 . . . TsM read transistor
Tw1-Tw6 . . . Tw(M×2) word line driver transistor
VCMA—Voltage Controlled Magnetic Anisotropy
Vss—Ground Voltage
Vdd—Power Voltage
WL, WL1, WL2, WL3 . . . WLM word line

BACKGROUND

The vast majority of Integrated circuits (IC) are fabricated with traditional crystalline silicon CMOS technology ("CMOS"). Unless otherwise noted specifically, CMOS refers herein to traditional crystalline silicon transistors found in the vast majority of today's integrated circuit devices fabricated in semiconductor fabs where high temperature (>450 C) front end equipment is required. As ICs continue to scale to smaller geometries RC time delays in the interconnects (wiring on the chips) becomes a major design issue hampering further improvements in performance normally expected with improved scalability of the production process to smaller technology nodes. Three dimensional (3D) integrated circuits are expected to be the next stage in the evolution of ICs, however, 3D circuit fabrication with conventional CMOS technology is not possible. Much is discussed in the industry about "3D", but all relate to stacking of die or circuits in one form of another requiring complex interposers and manufacturing methods. New methods are needed to develop 3D circuits in a monolithic fashion which incorporates memory, logic, IO and other elements and features that increase performance (speed and density), at low power consumption and low cost.

Nonvolatile crosspoint memory technologies such as resistance random access memory (ReRAM or RRAM), conductive bridge RAM (CBRAM), phase change random access memory (PCM or PCRAM), Nano-RAM carbon nanotube based memory (NRAM), and magnetic random access memory (MRAM) using magnetic tunnel junctions (MTJs) are strong candidates for providing a dense and fast nonvolatile storage solution for future memory applications. The ability of MRAM, RRAM, NRAM and PCRAM to more effectively compete with established memory types, such as dynamic random access memory (DRAM), static random access memory (SRAM) and FLASH memory (NAND or NOR) can be maximized by increasing the density at which memory units (a memory cell and its associated driving circuits) can be formed on a chip.

A crosspoint memory (also referred at times as a crossbar memory) is common terminology in the semiconductor memory industry and is herein further defined to be a memory array disposed on or above the substrate surface, arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance.

A conventional MTJ includes at least a pinned ferromagnetic layer and a free ferromagnetic layer separated from each other by a thin tunnel barrier layer. The free layer has a reversible magnetization direction that can have two stable directions that are parallel or anti-parallel to a fixed magnetization direction of the pinned layer. Resistance of the MTJ depends on the mutual orientation of the magnetizations in the free and pinned layers and can be effectively controlled.

A typical MRAM device includes an array of memory cells, a plurality of parallel word lines extended along columns (or rows) of the memory cells, and a plurality of parallel bit lines extended along rows (or columns) of the memory cells. The word and bit lines overlay each other but spaced from each other in a vertical direction. Each memory cell is located at a crosspoint of a word line and a bit line, and typically includes a single MTJ connected in series with a selection metal-oxide-semiconductor (MOS) transistor. The connected in series MTJ and transistor are electrically coupled to the word line at one terminal and to the bit line at the opposite terminal.

FIG. 1 shows a circuit diagram for a magnetic random access memory (MRAM) array according to a prior art disclosed in U.S. patent application publication US 2012/0281465. U.S. patent application publication US 2012/0281465 discloses in detail various methods of writing bits ("0" and "1") to the memory cells as well as reading and erasing the bits. The disclosure of US 2012/0281465 is hereby incorporated herein in its entirety by reference.

FIG. 2 shows a cross sectional view of a magnetic memory cell made with magnetic materials having perpendicular anisotropy according to the prior art.

The circuit described by US 2012/0281465 presents a challenge to controlling the addressing of the memory array for writing, reading or erasing due to the fact alternative current paths are possible than those described in the disclosure. This problem is also described in U.S. Pat. Nos. 7,968,419 and 8,227,788, which teach the use of back to back Schottky diodes in a resistance memory array to solve the cross talk problems associated when reading from the array. FIG. 3A is a circuit diagram of a crosspoint resistance nonvolatile memory array including resistance variable elements 105 with back to back Schottky diodes (referred to as current controlling elements) 112 according to U.S. Pat. No. 8,227,788. Word and bit conductive lines are indicated at 101 and 119.

US 2012/0281465 describes location of the selection transistors positioned along the perimeter of the array which still requires valuable die area. The use of MOS transistors (in particular silicon based Complimentary Metal Oxide Semiconductor—CMOS) as a selection element limits the arrangement of the existing MRAM into three-dimensional configuration due to long interconnects to the selection transistor from the remote layers of MTJs. Moreover, the MOS technology is relatively expensive.

An improved method of fabricating and addressing the word and bit selection transistors in nonvolatile memory arrays, such as MRAM memory arrays, is required that retains the advantages of small die size due to the crosspoint design of the memory array and eliminates the MOS transistors altogether to enable lower cost.

The present application addresses the above problems and provides a solution for low cost three-dimensional (3D) integrated circuits including nonvolatile crosspoint memory arrays. The solutions provided by the disclosures herein also addresses improved methods of fabricating 3D integrated circuits including memory, logic and other functions. The 3D devices described herein provide a much simpler approach to 3D compared to the conventional "3D" approaches under development in the semiconductor industry as of this writing—i.e., stacked die, package on package (PoP) and through silicon via (TSV) techniques which require costly and complex interconnect processes such as silicon interposers.

BRIEF DESCRIPTION OF THE DRAWINGS

FIG. 11B is an illustration showing the range of maximum technology nodes for the TFTs as a function M and Fm, assuming a TFT cell area of 12 Ft$^2$ for one configuration only FIG. 23C is an example of a hybrid stacked die device incorporating a microprocessor, FPGA and shared memory according to the prior art FIG. 27 is a Cross-Sectional View of a Typical Flip Chip BGA Package according to the prior art FIG. 28 is a schematic diagram of basic input and output (IO) circuits according to the prior art FIG. 29 is a typical I/O configuration on a chip according to the prior art

DETAILED DISCLOSURE OF THE INVENTION

Figure 1:
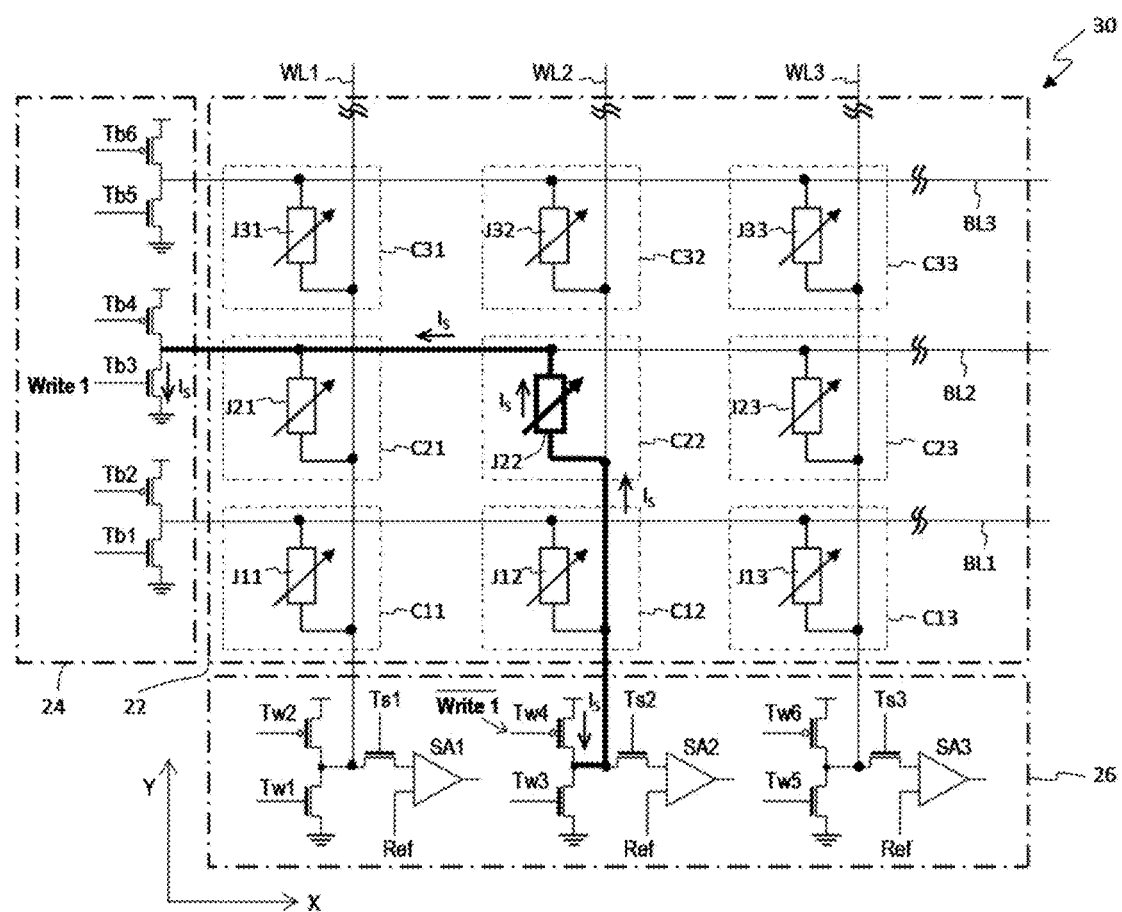
FIG. 1 is a circuit diagram of a memory array according to the prior art.
Figure 2:
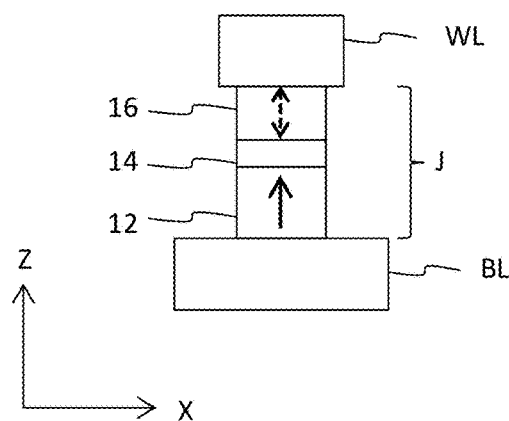
FIG. 2 is a cross section view of a magnetic memory cell made with perpendicular magnetic materials according to the prior art.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", and "on top", if used herein, are utilized for ease of description to describe spatial relationships of an element(s) to another. Such spatially related terms encompass different orientations of the device in use or operation in addition to the particular orientations depicted in the figures and described herein. For example, if a cell depicted in the figures is turned over or flipped over, portions previously described as below or beneath other elements would then be above those other elements.

As used herein, when an element, component or layer for example is described as being "on" "connected to", "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as begin "directly on", "directly connected to", "directly coupled with", or "directly in contact with" another element, there are no intervening elements, components or layers for example.

An improved memory device is disclosed comprising a substrate, a plurality of memory arrays disposed above the substrate surface, each memory array being arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance, wherein a back to back Schottky diode is located between each memory cell and one of the said conductive lines, and wherein each conductive line is electrically coupled to at least two thin film transistors (TFTs). The device is substantially produced in low temperature (<450 C) back end of line (BEOL) facilities without need of front end semiconductor production facilities, yet can be made with ultra high density and low cost. Furthermore, the device can be produced as an embedded memory on layers directly above a semiconductor circuit (for example in an ASIC, ASSP, FPGA, GPU, PLD, programmable system on chip, DSP, microcontroller or microprocessor chip) providing even lower cost and easy, fast access to nonvolatile memory without having to go off chip. TFTs may be fabricated in single or multiple layers of arrays providing flexibility to the designer for optimizing cost, speed, power or other design/performance objectives.

The magnetic tunnel junction (MTJ) element herein mentioned in this specification and within the scope of the claims is a general term of a tunneling magnetoresistance element using an insulator or semiconductor as the tunnel barrier layer. Although the herein mentioned figures each illustrate the major components of the MTJ element, another layer (or layers) such as a seed layer, a pinning layer, a cap layer, and others may also be included.

The use of back to back Schottky diodes in nonvolatile memory arrays has been disclosed by Mikawa (U.S. Pat. No. 8,227,788) and Li (U.S. Pat. No. 7,968,419) for resistance random access memory (ReRAM) and by Chen (U.S. Pat. Nos. 7,936,580 and 8,289,746) and Agan, in co-pending patent application No. 61/702,485, by one of the inventors (Agan), for magnetic random access memory (MRAM). The disclosures of U.S. Pat. Nos. 8,227,788, 7,968,419, 7,936,580, and 8,289,746 and U.S. patent application 61/702,485 are hereby incorporated herein in their entirety by reference. A back to back Schottky diode is a metal/semiconductor/metal (MSM) structure, commonly made from silicon (Si) semiconductor material, although other semiconductor materials may be used such as Zinc oxide (ZnO) or Indium Gallium Zinc Oxide (IGZO). The back to back Schottky diode has a threshold voltage, breakdown voltage, and on/off current ratio.

Figure 6A:
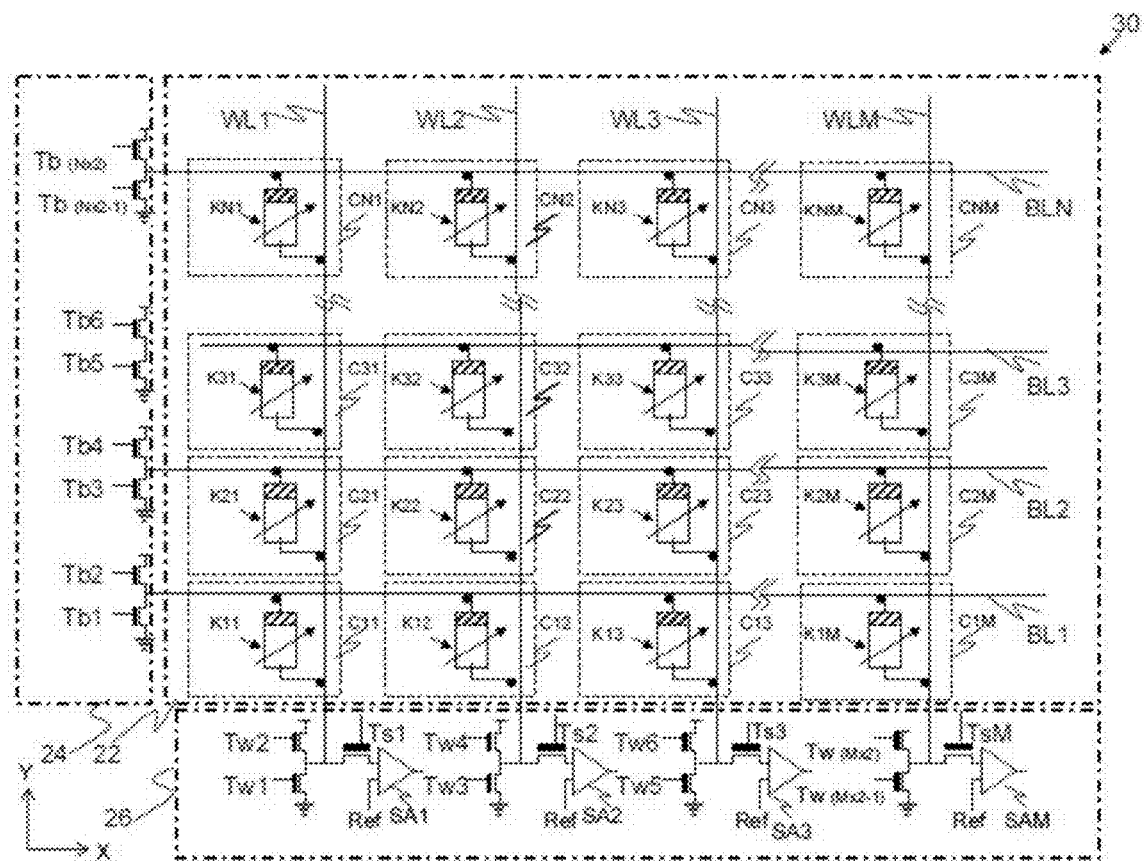
FIG. 6A is a circuit diagram of a magnetic random access memory (MRAM) crosspoint array with back to back Schottky diodes at each memory cell

FIG. 6A. shows a circuit diagram of a portion of a crosspoint (also referred to as crossbar) MRAM array 30 according to embodiments of the present disclosure. The memory includes an array 22 of memory cells C11-CNM, a plurality of parallel bit lines BL1-BLN connected at their end [schematically shown at end but physically at any point along the bit line] to a bit line driver 24, and a plurality of parallel word lines WL1-WLM connected at their end [schematically shown at end but physically at any point along the bit line] to word line driver 26.

Figure 4A:
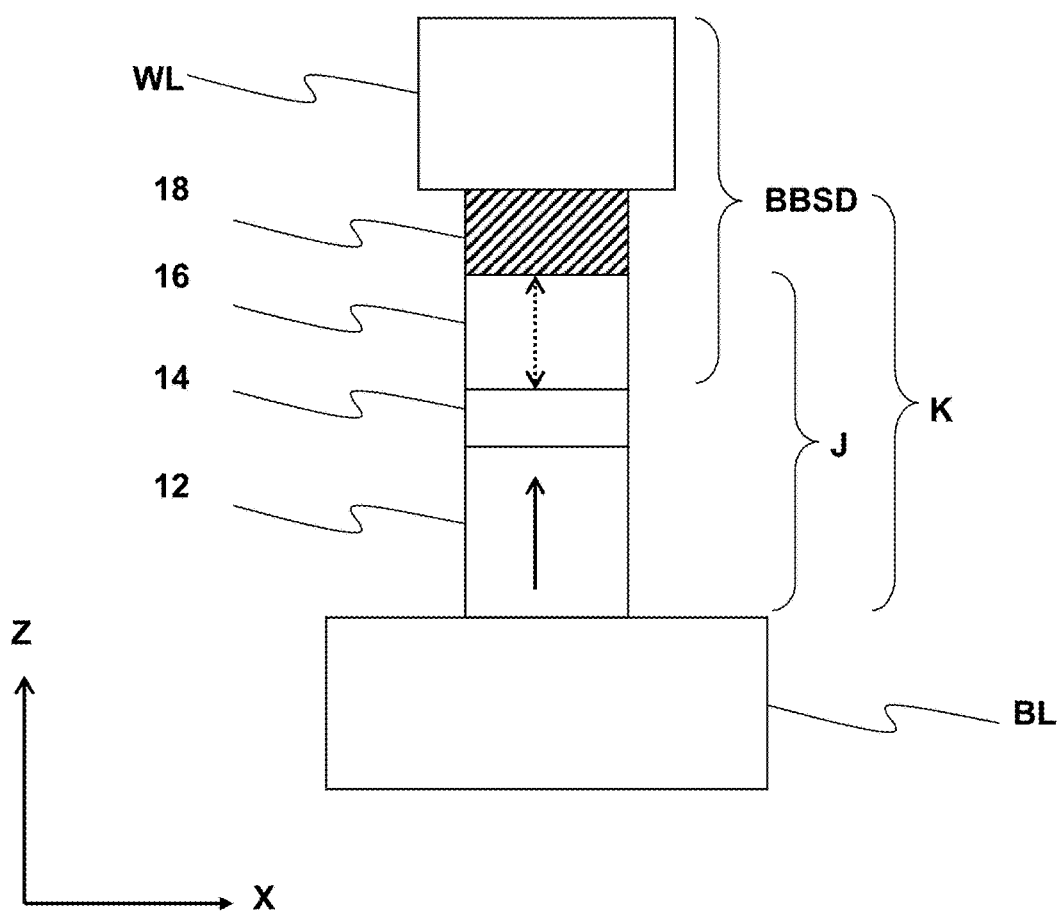
FIG. 4A and FIG. 4B are cross sectional views of a magnetic memory cell made with perpendicular magnetic materials including a back to back Schottky diode built into the structure
Figure 4B:
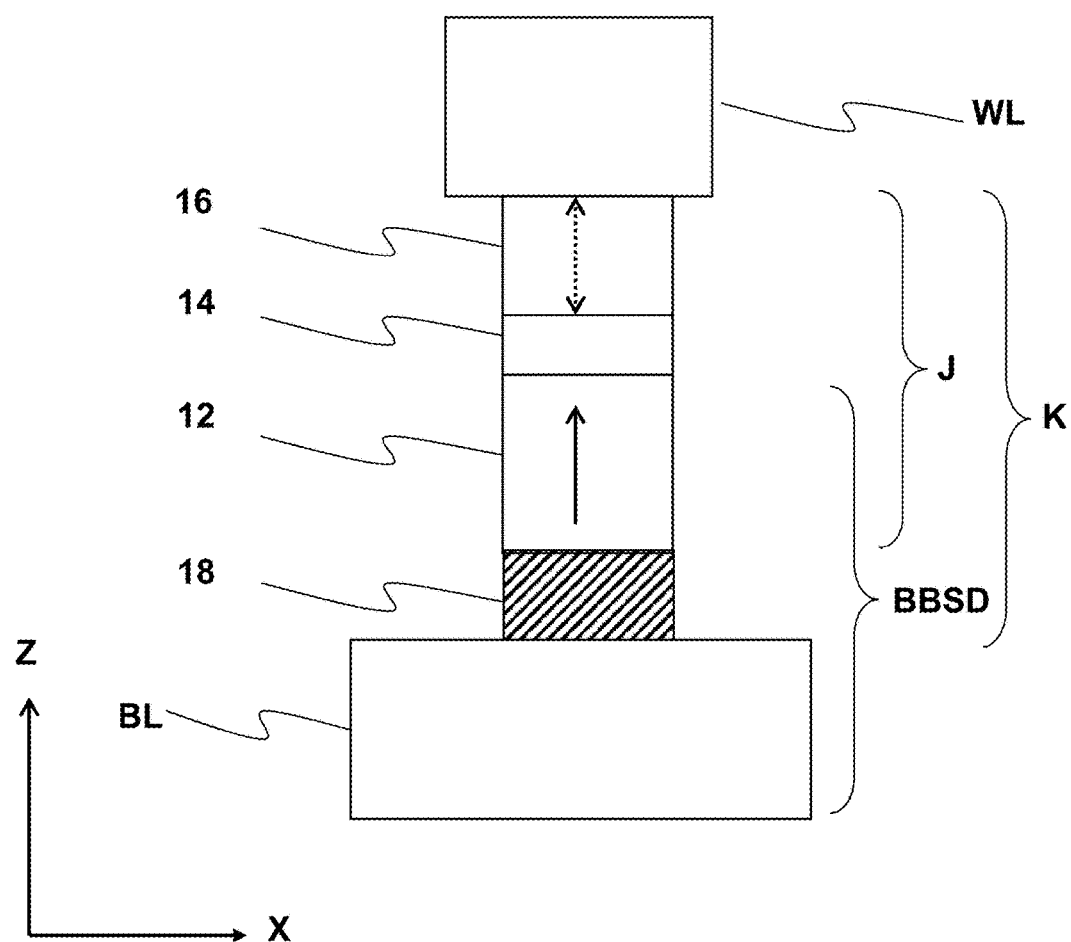

Each memory cell comprises an MTJ element and a back to back Schottky diode (BBSD), without a selection transistor. The MTJ element and semiconductor layer of the BBSD (together referenced as K) is connected to the appropriate bit and word lines at its ends and disposed at the intersection of the lines in a vertical space between them. Representative schematic views of a memory cell of the MRAM 30 is shown on FIGS. 4A and 4B. The MTJ element J has a pillar structure and comprises at least a pinned magnetic layer 12 having a fixed magnetization direction (shown by a solid arrow), a free magnetic layer 16 having a variable (or reversible) magnetization direction (shown by a dashed arrow), and a tunnel barrier layer 14 disposed between the pinned and free magnetic layers. A semiconductor material, such as Silicon (Si, a-Si, or p-Si), ZnO or IGZO (Indium-Gallium-Zinc-Oxide), 18, is disposed between the Word line WL and free magnetic layer 16; this metal-semiconductor-metal (MSM) structure is a back to back Schottky diode, BBSD.

The free magnetic layer 16 can be made of a magnetic material with a substantial spin-polarization and has a magnetization directed substantially perpendicular to a layer surface in its equilibrium state. For example, the free magnetic layer 16 can be made of $(Co_{30}Fe_{70})_{85}B_{15}$ (% atomic) alloy having a thickness of about 1.5 nm. The pinned magnetic layer 12 can be made of a magnetic material with a substantial spin-polarization and has the magnetization directed substantially perpendicular to a layer surface. For example, the pinned magnetic layer can be made of the $(Co_{30}Fe_{70})_{85}B_{15}$ (% atomic) alloy having a thickness of about 2.5 nm. The tunnel barrier layer 14 can be made of MgO having a thickness of about 1.1 nm. The free, tunnel barrier and pinned layers form a substantially coherent texture having a BCC (body-centered cubic) structure with (001) plane orientation. The MTJ element with this crystalline structure provides a substantial tunneling magnetoresistance (TMR≥100% at room temperature) and a density of spin-polarized write current of about $1 \cdot 10^6$ A/cm$^2$ or less. These parameters are essential for MRAM.

In the MRAM 30 shown in FIG. 6A the pluralities of the conductive bit and the word lines intersect each other but are spaced from each other in direction perpendicular to a plane of substrate (not shown). Each of the memory cells C11-CNM comprises an appropriate MTJ element and semiconductor layer (K11-KNM) that is disposed at an intersection of a bit and word line in the vertical space between them. The memory element K is electrically connected to the intersecting bit and the word lines at its opposite ends. For instance the memory cell C22 comprises the memory element K22 disposed at the intersection of the bit line BL2 and the word line WL2. The memory element K22 is electrically connected to the word line WL2 at its first end and to the bit line BL2 at its second end.

The bit lines BL1-BLN extend in the X-direction. They are electrically connected to a bit line driver 24 that includes transistors Tb1-Tb(N×2), which may be CMOS transistors or thin film transistors (TFTs). Thin film transistors herein are defined as any transistor that can be fabricated at BEOL temperatures (under 450 C normally) and thereby enable construction of multiple layers of TFTs above memory elements (which may only tolerate process temperatures below 450 C) in the vertical direction from the substrate (3D circuits). TFTs are also lower in cost to fabricate since they do not require the high temperature channel doping process of the source and drain contacts as with conventional CMOS transistors. Each bit line is connected to two transistors which control the magnitude and direction of the current. Although FIG. 6A schematically indicates the bit line driver 24 transistors are connected at the end of the bit lines BL1-BLN, this is not required and in particular, it is preferred to provide for the physical interconnects between the bit lines BL1-BLN and bit line driver transistors Tb1-Tb(N×2) at various points along the bit lines in order to minimize the interconnect complexity of the device. This is an important aspect of the invention, enabling the interconnect of small technology node (i.e., smaller minimum feature size) bit lines to larger technology node (i.e., larger minimum feature size) transistors arranged above or below the entire area of the memory array. Shorter interconnects are thereby enabled which provides the benefit of higher speed operation at lower power consumption due to less capacitive conductive lines.

The bit driver 24 operates as a row selection switch. The bit driver 24 and related transistors are connected with signal lines (not shown) to bandgap and decoder logic (not shown), which is comprised of additional transistors which may or may not be located on the same layer of the bit line transistors. It is preferred that the decoder logic and bandgap transistors are on the same layer of the related bit driver transistors in order to provide for shorter interconnects and hence, higher speed operation, lower power consumption, and lower cost due to simpler construction.

The word lines WL1-WLM extend in the Y-direction. Each word line WL1-WLM is connected to the word line driver 26. Although FIG. 6A schematically indicates the word line driver 26 transistors are connected at the end of the word lines WL1-WLM, this is not required and in particular, it is preferred to provide for the physical interconnects between the word lines WL1-WLM and word line driver transistors Tw1-Tw(M×2) at various points along the word lines in order to minimize the interconnect complexity of the device. This is an important aspect of the invention, enabling the interconnect of small technology node (small minimum feature size) word lines to larger technology node (larger minimum feature size) transistors arranged above or below the entire area of the memory array. Shorter interconnects are thereby enabled which provides the benefit of higher speed operation at lower power consumption due to less capacitive conductive lines.

The driver 26 comprises a plurality of read/write circuits. Each of the read/write circuits includes at least a pair of transistors Tw1-Tw(M×2) connected in series to each other, and one of a sense amplifiers SA1-SAM. Each word line WL1-WLM is connected to two transistors which control the magnitude and direction of the current. The word line is further connected to a common drain terminal of the transistor pair and to one input terminal of the sense amplifier SA through a read transistor Ts. For example, the word line WL2 is connected to the common drain terminal formed on the transistor pair Tw3 and Tw4 and to the first input terminal of the sense amplifier SA2 through the read transistor Ts2. A second input terminal of the sense amplifier SA2 is connected to a reference element (not shown). Gates of the transistors Tw1-Tw(M×2) are connected to the word line driver 26. The word driver 26 operates as a column selection switch. The word driver 26 and related transistors are connected with signal lines (not shown) to bandgap and decoder logic (not shown), which is comprised of additional transistors which may or may not be located on the same layer. It is preferred that the decoder logic and bandgap transistors are on the same layer of the related word driver transistors in order to provide for shorter interconnects and hence, higher speed operation, lower power consumption and lower cost due to simpler construction.

Each of the sense amplifiers SA1-SAM comprise at least two inputs. One input of the amplifier is connected to the word line WL1-WLM and to the common drain terminal of the transistor pair by means of the read transistor Ts1-TsM. The other input of the sense amplifier is connected to a reference element (not shown). The sense amplifier judges a data value of the MTJ element inside of the selected memory cell based on a reference signal.

The memory 30 shown in FIG. 6A comprises the array 22 of the memory elements K11-KNM disposed above the substrate (not shown). The selection transistors Tb1-Tb(N×2) and Tw1-Tw(M×2) may be positioned along a perimeter of the array 22, as schematically indicated, but are preferably fabricated on another layer above or below the memory array and positioned across the entire area (or partial area) of the array in order to minimize the interconnect complexity of the device. This enables the multiplexing of ultra large size M×N memory arrays. This approach, including layering in three dimensions of several memory arrays and thin film transistor (TFT) arrays optimizes the die area and provides for maximum memory density in terms of bits per area, high speed of operation and low power consumption due to lower capacitive conductive lines compared to other devices which have longer conductive lines.

In some cases, depending on the driving characteristics of the memory cell employed, it may be desirable to place selection transistors such that the current travels in same direction across the memory cells as if they were connected on the perimeter of the array 22 (FIG. 6A.). In this case, the conductive lines could be extended to a layer beneath or above the layer where direct contact of the conductive lines is made with the memory cells thereby allowing the placement of the TFTs across an area above or below the memory array and not require additional die area, yet the placement of TFTs provides for functional circuitry as if placed on the perimeter of the memory array. This is simply a matter of circuit layout and known in the art.

Throughout the disclosure, the terms small or large (or smaller or larger) technology node may be interchangeable with the terms small or large (or smaller or larger) minimum feature size.

Larger size TFTs made with larger technology node Ft relative to the technology node of the MTJ layer Fm, provides for cost savings since such process equipment is significantly lower in cost compared to that required for CMOS transistors. Even in the domain of TFT transistor production, larger technology node processing is less expensive than smaller technology node processing. Larger transistors also can provide a substantial write current that is essential for high speed writing. Larger size metal lines from the decoder logic to the select transistors is also advantageous since RC time delays are minimized. As Moore's Law is pushed to smaller technology nodes, it is becoming evident that RC time delays of the interconnects is a main issue. Hence a key advantage of the present invention is that the smallest technology node may be applied primarily to the memory elements and conductive lines of the crosspoint array, but the select transistors and metal interconnects from such transistors to the related decoder logic may be fabricated with larger technology nodes, thereby minimizing RC delays and leading to higher speed addressing of the array. The use of a cache buffer memory is described later herein to further enable fast addressing of a memory device made according to the invention described herein to overcome slower response time of the lower mobility thin film transistors compared to silicon CMOS transistors.

The MRAM 30 shown in FIG. 6A employs a spin-induced switching mechanism of the memory elements K. According to spin-induced switching the orientation of magnetization in the free layer 16 can be reversed by a spin-polarized current $I_S$ (not shown) running through the memory element. Electrons of the write current have a substantial degree of spin polarization that is predetermined by magnetic properties of the pinned layer 12. The spin-polarized electrons running through the free layer 16 transfer a moment of their spin causing the magnetization in the free layer to change its direction. Direction of the magnetization in the free layer 16 can be controlled by a direction of the spin-polarized current $I_S$ running through the memory element. The direction of the spin-polarized current in the memory element corresponds to writing a logic "0" or to parallel orientation of magnetization directions in the free 16 and pinned 12 magnetic layers.

In order to write a logic "0" to a memory element (K22 of the memory cell C22 for example) a switching current $I_S$ (not shown) is produced in the memory element by applying appropriate input signals to the gate of the transistor Tb4 and to the gate of the transistor Tw3. Both transistors are opened. The spin-polarized current $I_S$ is running from the power supply (not shown) through the transistor Tb4, bit line BL2, memory element K22, word line WL2, and transistor Tw3 to the ground. For the memory element having a configuration shown in FIG. 4A the current $I_S$ is running in the direction from the free layer 16 to the pinned layer 12 through the tunnel barrier layer 14. The spin-polarized conductance electrons are moving in the opposite direction from the pinned layer 12 to the free layer 16. For the given direction of the current $I_S$, the magnetization in the free layer 16 will be directed in parallel to the magnetization direction of the pinned layer 12. This mutual orientation of the magnetizations corresponds to a low resistance state of the memory element or to a logic "0". There is a minimum threshold voltage required, due to the back to back Schottky diode (BBSD) structure, for this operation to occur.

In order to write a logic "1" to a memory element (K22.of the memory cell C22 for example) a write current $I_S$ (not shown) is supplied to the memory element K22 by simultaneously applying an appropriate input signal to the gate of the transistors Tb3 and Tw4. The transistors are opened and the current $I_s$ is running from the transistor Tw4 to the transistor Tb3 through the word line WL2, memory element K22, and bit line BL2. In the memory element K22 having a configuration shown in FIG. 4A the spin-polarized current $I_S$ is running in the direction from the pinned layer 12 to the free layer 16. This direction of the spin-polarized current can direct the magnetization in the free layer 16 anti parallel to the magnetization direction of the pinned layer 12. This mutual orientation of the magnetizations corresponds to a high resistance state or to a logic "1". There is a minimum threshold voltage required, due to the back to back Schottky diode (BBSD) structure, for this operation to occur.

A major advantage of using TFTs is that multiple layers of memory arrays can be fabricated with layers of TFTs between such memory layers to provide for very high density memory devices, high speed operation and low power consumption due to the lower capacitive conductive lines. U.S. Pat. No. 6,838,721 (Garni, et.al) teaches the use of TFTs above an interconnect line in an toggle MRAM device—an early generation MRAM technology which employs the toggle reading method and writing method by applying high currents through the conductive lines directly above or below the MTJ stack of a cell (i.e., not through the stack). The TFTs in Garni however are not used for writing but used only for reading the bits which at most 16 bits are read by one transistor through a complicated read process. The current is sourced from the TFT through several bits in order to sequentially read one bit from several bits in a group. This presents harsh requirements on the sense amplifiers. If one attempted to read more than 16 bits in a group, the change in resistance to be measured by the sense amplifiers becomes increasingly difficult or impossible read. The invention disclosed herein in contrast enables the reading of a bit by sourcing the current through one bit only; thereby the change in resistance is fully measurable by the sense amplifier regardless of the size of the array. Further, Garth does not teach the use of back-to-back Schottky diodes to enable crosspoint memory arrays, nor a method to fabricate multiple layers of such crosspoint memory arrays in 3D for higher density. Garth also does not mention the use of amorphous oxide semiconductor (AOS) TFTs which are the preferred TFTs of the invention disclosed herein. Garth only mentions amorphous silicon (a-Si) and polysilicon (p-Si) TFTs. a-Si TFTs have very low mobility (about 1 $cm^2/Vs$) which would prevent high speed memory addressing; p-Si TFTs have higher mobility, however the high temperature processing temperature (>500 C) prevents fabrication of such p-Si TFTs above magnetic layers which can withstand temperatures at most to about 400 C. In the invention disclosed herein, it is preferred to have TFTs of high mobility and process temperatures enabling 3D construction above memory elements that can only withstand 400 C or lower temperatures. In particular, AOS TFTs of mobility greater than 10 $cm^2/Vs$ are preferred, and those greater than 30 and even greater than 100 are more preferred. The high mobility and low leakage of AOS TFTs such as IGZO and ZTO (Zinc Tin Oxide) are desired for high speed operation at low power consumption of the nonvolatile memory devices disclosed herein. Finally, Garth makes no suggestion of the benefit of decoupling the technology node of the memory cell fabrication from the technology node of the TFT fabrication to enable lower cost device fabrication—an important aspect of the invention disclosed herein.

Use of IGZO TFTs in a stackable RRAM memory device is disclosed in the Samsung publication: Low-Temperature-Grown Transition Metal Oxide Based Storage Materials and Oxide Transistors for High-Density Non-volatile Memory, Advanced Functional Materials, Volume 19, Issue 10, pages 1587-1593, May 22, 2009; the contents of which are incorporated herein in its entirety by reference. Fabrication of IGZO TFTs are discussed as well as selection of CuO/InZnO (CuO/IZO) based diodes, both fabricated at low BEOL compatible temperatures. The advantages of stacking peripheral IGZO-TFT circuits is discussed. This differs from the invention disclosed herein which utilizes the area under or above the memory array for placement of the TFTs, thereby not utilizing precious die area around the periphery of the array. Further, the Samsung disclosure makes no mention of decoupling of the technology node for fabricating the TFTs compared to the technology node for fabricating the memory cells. By positioning the TFTs under or above the memory array, there is no penalty in die area by choosing multiple smaller array memory blocks versus a few larger memory blocks. This is a key distinction of the invention disclosed herein which offers flexibility to the designer for choosing smaller memory blocks over larger memory blocks. Fabricating the TFTs at larger technology node enables one to keep the cost of multiple layers of TFTs to a low level. For medium sized arrays measuring say 100×100 cells, the periphery circuitry for select transistors alone may occupy upwards of 20% of the combined memory array area and peripheral circuit area. This is a substantial amount of die area which can be eliminated by incorporating the principles of the invention disclosed herein of spreading the TFTs across the area directly above or below the memory array. In addition to the die area savings, larger technology node TFTs could be used with lower cost equipment, thereby providing additional cost savings yet maintain the high density of the memory array fabricated at the smaller technology node without a penalty in die area.

As noted above, TFTs defined herein are any transistors which may be fabricated in BEOL facilities at temperatures under 450 C. AOS TFTs are preferred due to their high mobility and low process temperatures. Other TFTs which may be suitable include compound semiconductor (e.g., III-nitride) TFTs including InN, GaN, InAlN, GaAs, AlGaAs, and InGaAs TFTs, Such compound semiconductor TFTs may offer performance advantages such as speed, which may be more applicable when designing logic functions in the TFT layers or applications of embedded memory where speed is of high importance. An embodiment of a back to back Schottky diode (or element) 10 as disclosed herein can be seen in FIG. 12A. The exemplary back to back Schottky diode 10 includes a first metal layer 02, a second metal layer 04, and a semiconductor layer 18 disposed between the metal layers 02 and 04. The first 02 and second 04 metal layers are in intimate contact with the semiconductor layer 18 and form Schottky contacts (or junctions).

Whenever a metal and a semiconductor are in intimate contact, there exists a potential barrier between the two materials that prevents most charge carriers (electrons or holes) from passing from one material to the other material. Only a small number of carriers have enough energy to get over the barrier and cross to the other material. When a bias is applied to the junction, it can have one of two effects: it can make the barrier appear lower from the semiconductor side, or it can make it appear higher from the semiconductor side. The bias does not change the barrier height from the metal side. The result of this is a Schottky barrier, which can also be referred to as a Schottky contact (or junction), where the junction conducts for one bias polarity, but not the other. A Schottky contact has a non-linear and asymmetric current-voltage (I-V) curve.

The Schottky barrier can depend at least in part on the work function of the metal, the band gap of the semiconductor, the type and concentration of dopants in the semiconductor, and other factors. A junction of an undoped or lightly doped semiconductor material and a metal will form a Schottky contact.

A junction of a heavily doped semiconductor material and a metal will form an ohmic contact (the current will flow in either direction: forward biased current in one direction, tunneling in the other (reverse) direction). In general, the junction of a heavily doped semiconductor and a metal forms a thinner energy barrier (the heavier the dopant level, the thinner the barrier will be). At reverse bias conditions, charge will flow through the barrier due to quantum mechanical tunneling.

In the embodiment of a back to back Schottky diode (or device) 10 disclosed herein (FIG. 12A) the first metal layer will have a Schottky contact 11 with the semiconductor layer 18. Respectively, the second metal layer 04 will have another Schottky contact 13 with the semiconductor layer 18. The orientation of the Schottky contacts will generally be opposite to each other. The opposite orientation of the Schottky contacts 11 and 13 render back to back Schottky diode 10 having such a configuration a bidirectional switch. A bidirectional switch allows current to flow in a first direction when a current having a first polarity is applied and allows current to flow in a second direction (opposite the first direction) when a current having a second polarity (opposite the first polarity) is applied.

Figure 12A:
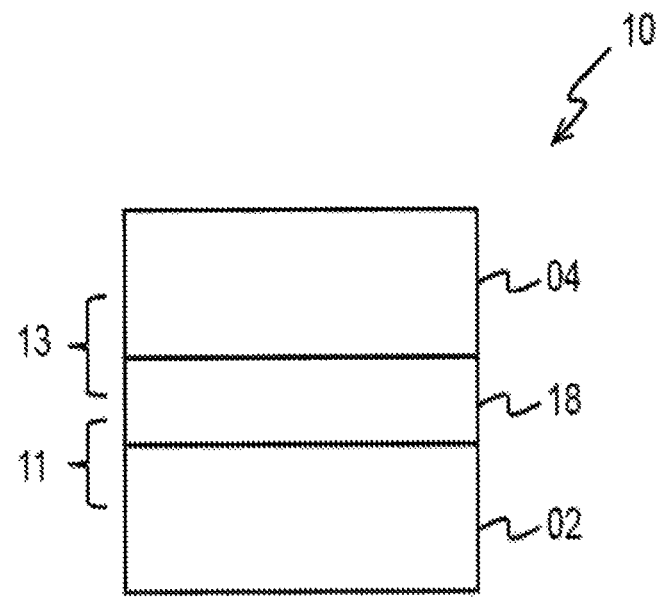
FIG. 12A is a schematic diagram of an embodiment of a back to back schottky diode
Figure 12B:
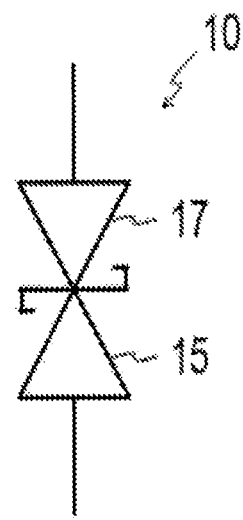
FIG. 12B is a circuit diagram depicting the functioning of a back to back schottky diode

FIG. 12B depicts a circuit diagram that illustrates the bidirectional nature of the back to back Schottky diode 10 disclosed herein. As seen in the circuit diagram of FIG. 12B, the first contact 11 (FIG. 12A) provides the function of a first diode 15 and the second contact 13 provides the function of a second diode 17. The diodes 15 and 17 are that are connected in series with each other. The first diode 15 allows current to flow in an opposite direction than does the second diode 17.

Figure 12C:
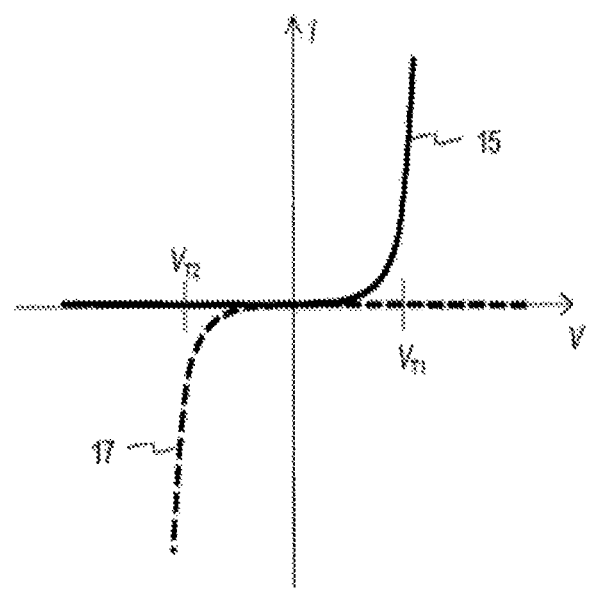
FIG. 12C is a current-voltage (I-V) curve representative of a back to back schottky diode

FIG. 12C shows a current-voltage (I-V) curve for the disclosed back to back Schottky diode 10. As seen in FIG. 12C, the first diode 15 has a threshold voltage $V_{T1}$ at which a substantial current begins to flow in a first direction; and the second diode 17 has a threshold voltage $V_{T2}$ at which a substantial current begins to flow in a second (opposite) direction. As shown in FIG. 12C, the polarity of $V_{T1}$ and $V_{T2}$ are opposite, as is the current that flows from the back to back Schottky diode 10 at the two voltages. This provides a back to back Schottky diode 10 that essentially blocks current between the voltages $V_{T1}$ and $V_{T2}$ and allows current having a first polarity to flow at voltages below $V_{T2}$ and a second polarity to flow at voltages above $V_{T1}$.

In functioning as a switch, this means that if a voltage of less than $V_{T2}$ is applied to the back to back Schottky diode 10, a current will flow in a first direction; whereas if a voltage of greater than $V_{T1}$ is applied to the back to back Schottky diode, a current will flow in a second direction. The back to back Schottky diode 10 can therefore be utilized to control the direction in which current flows through an electrically connected component, such as for example a non volatile memory element. The threshold voltages $V_{T1}$ and $V_{T2}$ depend on the Schottky barriers formed on the opposite sides of the semiconductor layer 18 with the contacting metal layers 02 and 04.

The back to back Schottky diode 10 as disclosed herein can advantageously provide the combination of bi-directional switching and the ability to withstand high driving current. The back to back Schottky diodes disclosed herein can be used where high driving current is necessary because of the relatively larger (as compared with conventional MOS transistors) cross-section of the current path of the disclosed back to back Schottky diode which makes it capable of flowing a relatively large amount of current. The ability to handle high driving currents can be advantageous because the switch can then be utilized with components where a high driving current is necessary, or desired, an example of which is magnetic random access memory (MRAM) employing a spin-induced switching mechanism. Moreover, the back to back Schottky diode 10 based on Schottky contacts can provide faster switching than conventional semiconductor diodes employing on p-n-junctions.

The hypothetical I-V curve that is illustrated in FIG. 12C is symmetrical. Generally, in order for the I-V curve of a disclosed back to back Schottky diode to be symmetrical, the surface area of the metal/semiconductor junctions 11 and 13 and material of the metal layers 02 and 04 have to be at least substantially the same. A back to back Schottky diode that has a symmetrical I-V curve can be advantageous in some applications. For example, it can be advantageous for a back to back Schottky diode that is to be used in combination with memory elements to have a symmetrical I-V curve.

The back to back Schottky diode 10 can have an asymmetric I-V curve when the junctions 11 and 13 have different surface areas, or the metal layers 02 and 04 are made of different materials, or the semiconductor layer 18 has a different concentration of dopants at opposite sides contacting with the metal layer 02 and 04, and at other conditions.

The semiconductor layer 18 or its portion can be doped. Doping is the process of intentionally introducing impurities into a semiconductor to change its electrical properties. The particular dopant that is chosen can depend at least in part on the particular properties that are desired in the final back to back Schottky diode, the identity of the semiconductor material to be doped, other factors not discussed herein, or a combination thereof. Exemplary dopants can include, but are not limited to Group III and Group V elements. In embodiments where the semiconductor materials are Group IV materials (for example, silicon, germanium, and silicon carbide), Group III or Group V elements can be utilized as dopants. Specific exemplary dopants can include, but are not limited to boron (B), arsenic (As), phosphorus (P), and gallium (Ga).

The metal layers 02 and 04 can be made of any metallic material that is electrically conductive. The first metal layer 02 and the second metal layer 04 can be made of the same material, but may be made of different materials.

In an embodiment shown in FIG. 12A, the semiconductor layer 18 is made of polycrystalline silicon (poly-Si) and is doped with phosphorus (P). A thickness of the semiconductor layer is about 100 nm. The first metal layer 02 and the second metal layer 04 are made of tungsten (W). Thicknesses of the metal layers 02 and 04 are about 5 nm.

A back to back Schottky diode disclosed herein can be utilized as a selective element electrically coupled to a nonvolatile memory element to form a memory cell. A nonvolatile memory cell utilized in memory devices as described herein can include many different types of memory elements. An exemplary type of nonvolatile memory element that can be utilized in memory devices disclosed herein includes, but is not limited to resistive sense memory (RSM) elements. Exemplary RSM elements include, but are not limited to, ferroelectric RAM (FeRAM or FRAM); magnetoresistive RAM (MRAM or STT-RAM); magnetoelectric RANI (MeRAM); resistive RAM (RRAM); phase change memory (PCM) which is also referred to as PRAM, PCRAM or C-RAM; programmable metallization cell (PMC), which is also referred to as conductive-bridging RAM (CBRAM).

Figure 13A:
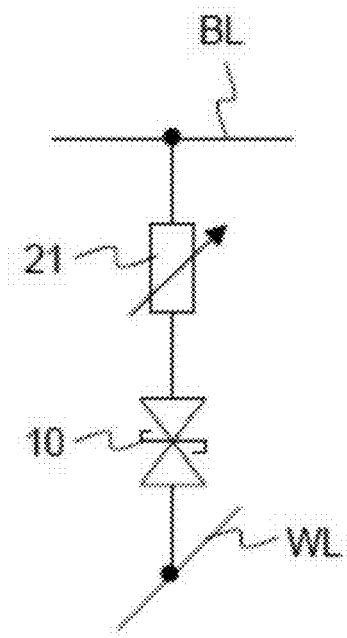
FIG. 13A and FIG. 13B are circuit diagrams of nonvolatile memory cells and back to back schottky diodes
Figure 13B:
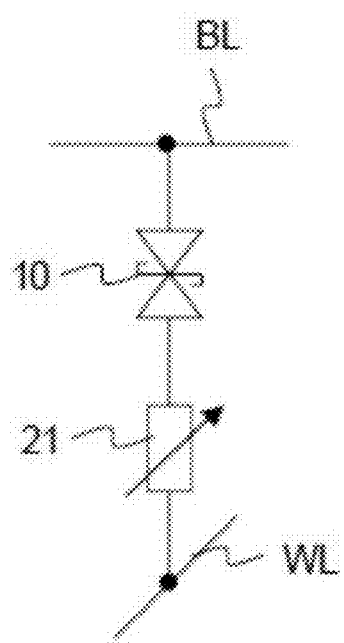

Circuit diagrams of memory cells MC employing RSM element and a back to back Schottky diode disclosed herein is shown in FIGS. 13A and 13B. In embodiments, the memory cell can include a nonvolatile memory element 21 connected in series with a back to back Schottky diode 10. A memory cell can be disposed at intersection region where a word line (WL) and a bit line (BL) overlap each other, in a vertical space between the overlapping conductive lines. Opposite ends (or terminals) of the back to back Schottky diode 10 and the memory element 21 are electrically connected to overlapping word WL and bit BL lines.

In embodiments, the RSM element can be a magnetoresistive (MR) element (or magnetic tunnel junction (MTJ)). The MTJ along with a back to back Schottky diode can form a magnetic memory cell. The MTJ generally includes two ferromagnetic layers separated by a thin insulating layer, which is also known as a tunnel barrier layer. Embodiments of the magnetic memory cells without conductive word and bit lines are depicted in FIGS. 14A through 14D. The memory cell 30A shown in FIG. 14A includes a MTJ 31 connected in series with a back to back Schottky diode 10 that includes a semiconductor layer 18, a first metal contact 02, and a second metal contact 04 as described and exemplified above. The MTJ 31 includes a pinned ferromagnetic layer 32 and a free ferromagnetic layer 34, which are separated by a tunnel barrier layer 33. The pinned layer 32 and the free layer 34 may both independently have multilayer structures. The pinned layer 34 has a fixed magnetization direction shown by a solid arrow $M_{32}$. The free ferromagnetic layer 34 has a changeable magnetization direction $M_{34}$ depicted by two arrows (solid and dashed). The memory cell 30A includes the MTJ 31 with a perpendicular magnetization direction (or perpendicular anisotropy). The MTJ 31 is formed above the back to back Schottky diode 10. The orientation is generally only meant to show that the nonvolatile memory element 21 is electrically connected in series to one of the metal contacts (FIG. 15B shows the magnetic memory element 31 electrically connected to the second metal contact 04, but it could of course be the first metal contact 02). The memory cell 30A may also includes several additional layers such as a seed layer, a cap layer and others, which are not shown.

The pinned layer 32 can be made of (Co/Pt)/CoFeB multilayer having a thickness of (Co/Pt) superlattice of about 8 nm and a thickness of CoFeB layer of about 2 nm. The free layer 34 can be made of CoFeB(1.5nm)/(Pt/Co (2.5nm)) multilayer. The layers of CoFeB are placed in a direct contact with the tunnel barrier layer 33 made of MgO and having a thickness of about 1.1 nm.

The free layer 34 works as a storage layer and can have two stable directions of the magnetization that is parallel or anti-parallel to the direction of the magnetization of the pinned layer 32. Resistance of the MTJ 31 measured in a direction across the tunnel barrier layer 33 depends on a mutual orientation of the magnetizations $M_{32}$ and $M_{34}$ in the free 34 and pinned 32 layers. It can be effectively controlled by a direction of the spin-polarized switching current $I_S$ running across the MTJ 31 perpendicular to substrate surface (not shown). The spin-polarized current $I_S$ can reverse the magnetization direction $M_{34}$ of the free layer 34. The resistance of the MTJ 31 is low when the magnetizations of the free and pinned layers are parallel to each other (logic "0") and high when the magnetizations are antiparallel to each other (logic "1"). Difference in the resistance between two logic states can be in a range of about 100%-600% at room temperature.

Writing data to a free layer 34 can be provided by a spin-polarized current $I_S$ running through the MTJ 31 in the direction perpendicular to the substrate. More specifically, when the spin-polarized current $I_S$ flows from the free layer 34 to the pinned layer 32 through the tunnel barrier layer 33 (solid downward arrow), the conductance electrons run in the opposite direction from the pinned layer 32 to the free layer 34. The electrons storing a spin information of the pinned layer 32 are injected into the free layer 34. A spin angular momentum of the injected electrons is transferred to electrons of the free layer 34 in accordance with the law of spin angular momentum conservation. This forces the magnetization direction $M_{34}$ (solid arrow) of the free layer 34 to be oriented in parallel with the magnetization direction of the pinned layer 32 (logic "0").

On the other hand, when the spin-polarized write current $I_S$ flows from the pinned layer 32 to the free layer 34 (dashed upward arrow), the spin-polarized electrons run in the opposite direction from the free layer 34 to the pinned layer 32. The electrons having spin oriented in parallel to the magnetization direction of the pinned layer 32 are transmitted. The electrons having spin antiparallel to the magnetization direction of the pinned layer 32 are reflected. As a result, the magnetization orientation $M_{34}$ (dashed arrow) of the free layer 34 is forced to be directed antiparallel to the magnetization direction of the pinned layer 32 (logic "1").

Reading of the data stored in the MTJ 31 is provided by measuring its resistance and comparing it with the resistance of the reference element (not shown).

Figure 14A:
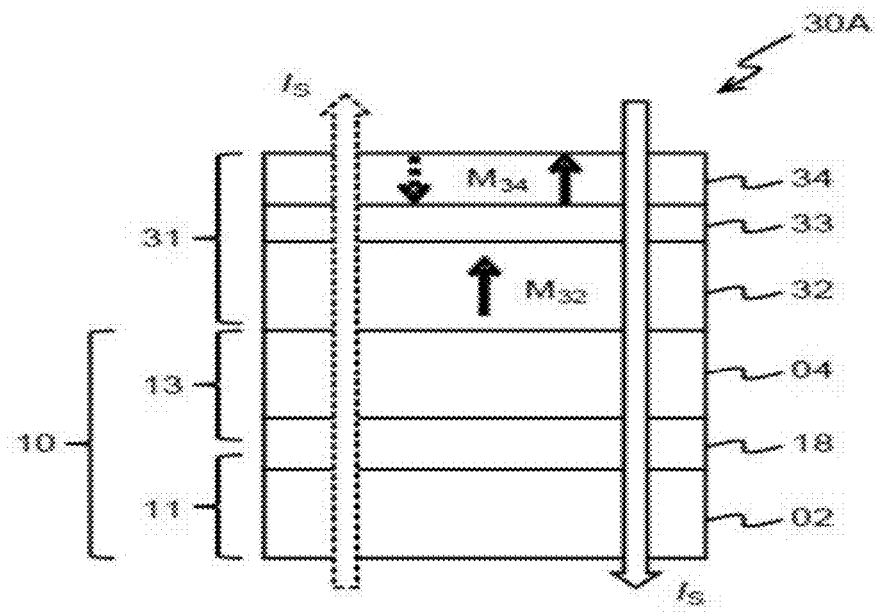
FIG. 14A and FIG. 14B are schematic diagrams of magnetic memory cells with a conventional pinned layer including a back to back schottky diode
Figure 14B:
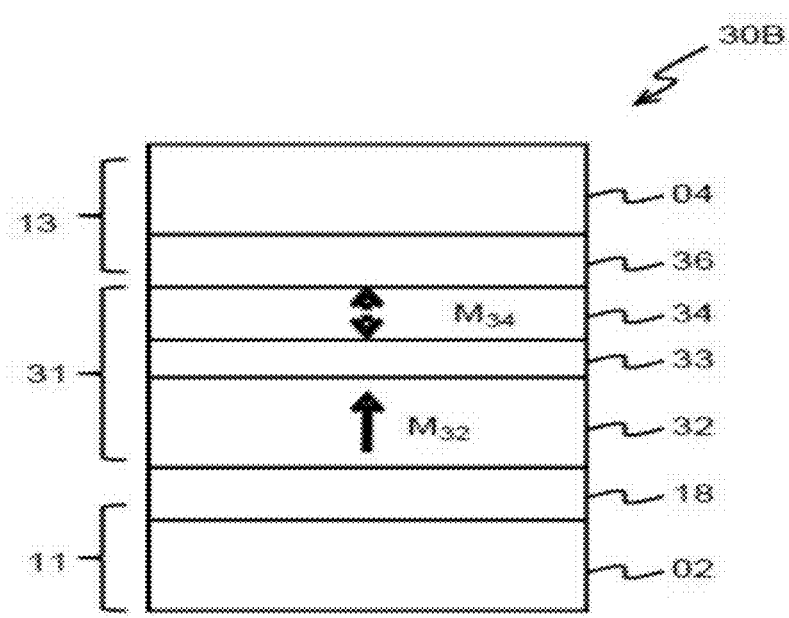

FIG. 14B depicts a schematic diagram of the magnetic memory cell 30B that includes a MTJ 31 with a perpendicular magnetization disposed between two Schottky contacts 11 and 13 having opposite polarities (see FIG. 13C).

The memory cell 30B includes two semiconductor layers 18 and 36 positioned on opposite end of the MTJ 31. The first Schottky contact is formed by the first metal layer 02 and the first semiconductor layer 18. Respectively, the second Schottky contact 13 is formed by the second semiconductor layer 36 and the second metal layer 04.

Figure 15A:
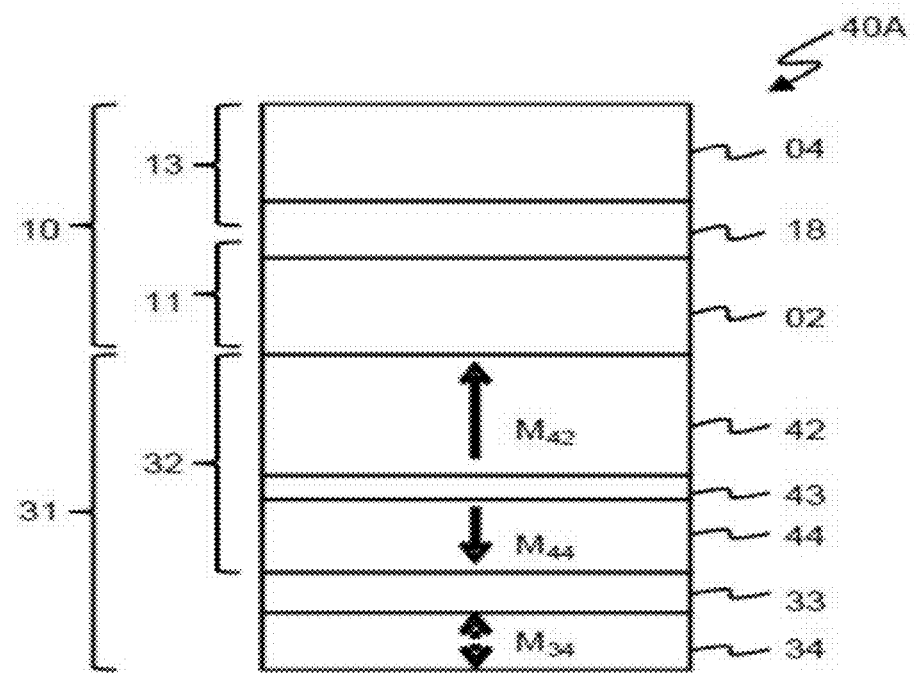
FIG. 15A and FIG. 15B are schematic diagrams of perpendicular magnetic memory cells with a pinned layer having a structure of synthetic anti-ferromagnetic including a back to back schottky diode
Figure 15B:
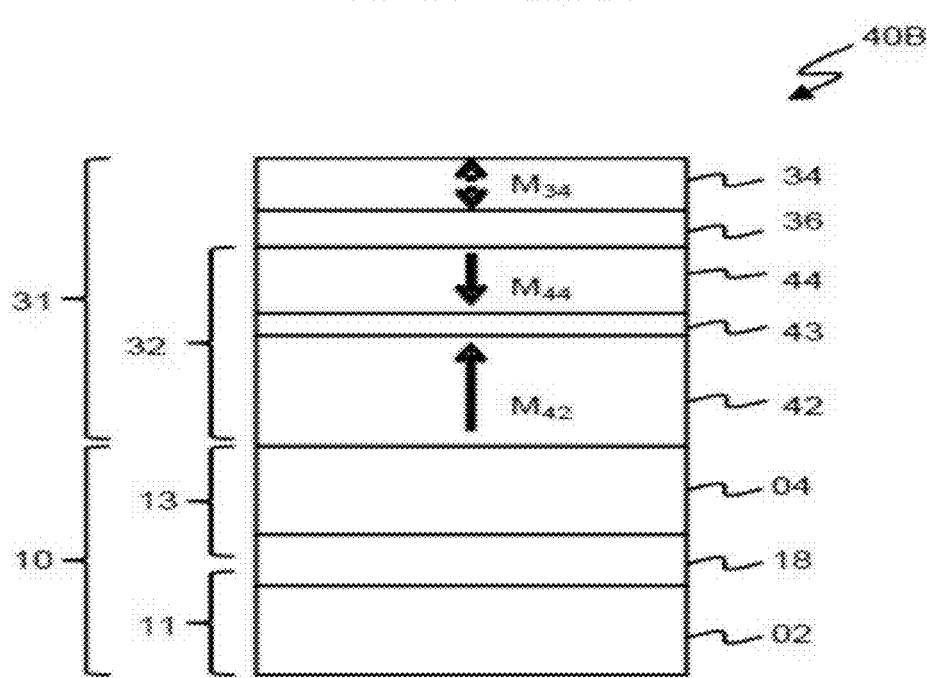

FIGS. 15A and 15B depict a magnetic memory cells 40A and 40B that include a perpendicular MTJ 31 (MTJ with magnetic material having a perpendicular magnetization) with a pinned layer 32 having a structure of a synthetic anti-ferromagnetic. The pinned layer 32 includes a pinned ferromagnetic layer 42 and a reference ferromagnetic layer 44 which are substantially antiferromagnetically exchange coupled to each other through a spacer layer 43 made of a nonmagnetic metal such as Ru or similar materials. The magnetization direct $M_{44}$ in the reference layer is fixed by the aferagnetic exchange coupling with the pinned layer 42. The antiferromagnetic struce of the pinned layer 32 provides a cancelation of a fringing field produced in the vicinity of the free layer 34 by the pinned layer 32. The cancellation of the fringing magnetic field can provide equal magnitudes of the switching current $I_S$ required for writing logic "0" or "1". Moreover, the synthetic pinned layer can improve a thermal stability of the MTJ 31 or, more specifically, the thermal stability of the free layer 34.

The magnetic memory cells 40A and 40B distinguish from each other by a structure of the MTJ 31. The cell 40A includes the MTJ 31 with the free layer 34 disposed adjacent to the back to back Schottky diode 10. The memory cell 40B has the free layer 34 positioned distal from the back to back Schottky diode 10. The free layer 34 can be made of CoFeB(1.5nm)/(Pt/Co(2.5nm)) multilayer. The pinned layer 42 can be made of (Co/Pt) superlattice having a thickness of about 10 nm. The pinned layer 42 can have be made of (Co/Pt)/CoFeB multilayer having a thickness The pinned layer 42 can have be made of (Co/Pt)/CoFeB multilayer having a thickness of (Co/Pt) superlattice of about 5 nm and a thickness of CoFeB layer of about 2 nm. The layers of CoFeB are placed in a direct contact with the tunnel barrier layer 33 made of MgO and having a thickness of about 1.1 nm. The pinned layer 42 and the reference layer 44 can be antiferromagnetically exchange coupled to each other by a spacer layer 43 made of Ru having a thickness of about 0.9 nm.

Figure 16:
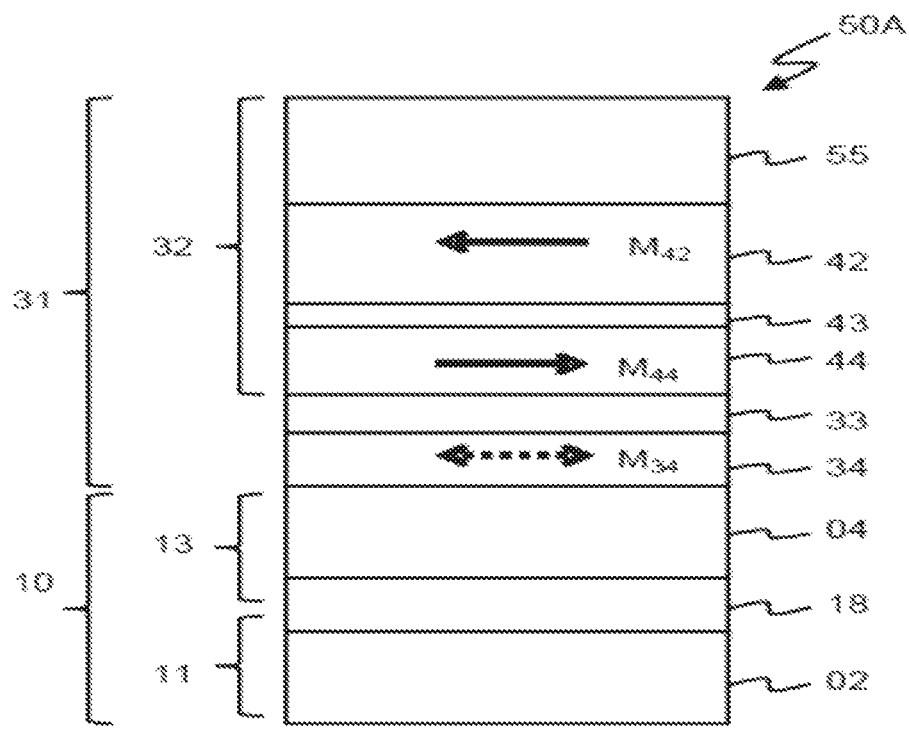
FIG. 16 and FIG. 17 are schematic diagrams of in-plane magnetic memory cells with a pinned layer having a structure of synthetic anti-ferromagnetic including a back to back schottky diode
Figure 17:
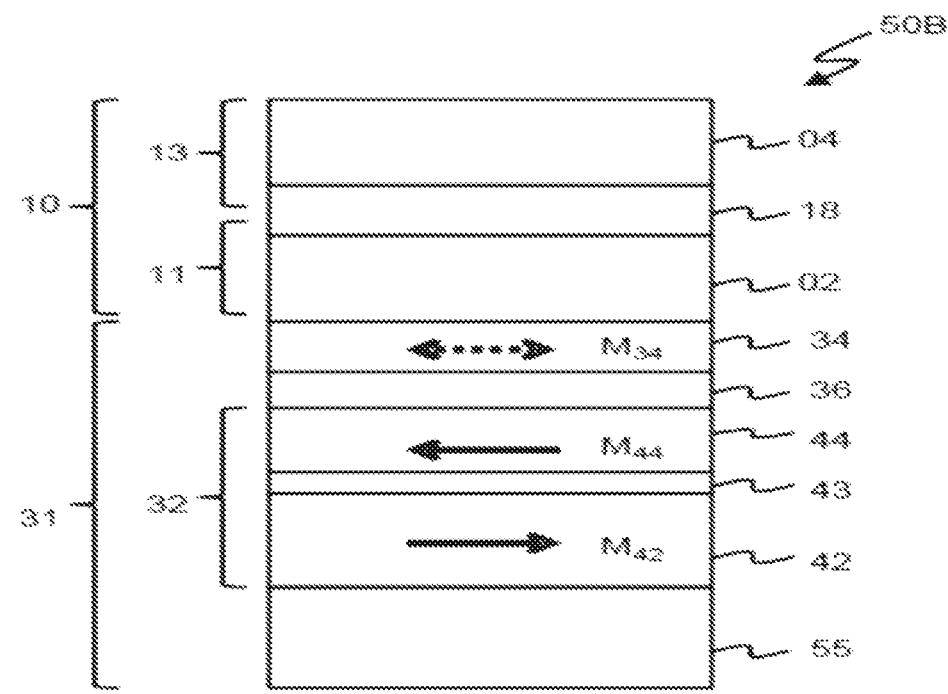

FIGS. 16 and 17 show a schematic diagram of magnetic memory cells 50A and 50B that employ the MTJ 31 having magnetic materials with in-plane magnetization. The magnetization directions in the free, pinned and reference layers are depicted by dashed or solid arrows $M_{34}$, $M_{42}$, and $M_{44}$, respectively. To provide fixed magnetization direction $M_{42}$ in the pinned layer 42, the layer has a substantial exchange coupling with an antiferromagnetic layer 55. The layers 42 and 55 are in direct contact with each other. The magnetization direction $M_{44}$ of the reference layer 44 is fixed by the exchange coupling with the pinned layer 42 through the spacer layer 43. The memory cells 50A and 50B distinguish from each other by a position of the back to back Schottky diode 10 relatively the MTJ 31 and by a position of the free layer 34 in the MTJ 31. The memory cells 50A and 50B may have an elliptical shape to provide a required thermal stability to the free layer 34 made of material with in-plane magnetization (anisotropy).

The free ferromagnetic layer 34 of the memory cells 50A and 50B can be made of CoFeB having a thickness of about 2.2 nm. The pinned layer can be made of CoFe having a thickness of about 3 nm that is antiferromagnetically exchange coupled with the antiferromagnetic layer 55 made of IrMn and having a thickness of about 15 nm. The reference layer 44 can be made of CoFeB with a thickness of about 3 nm. The spacer layer can be made of Ru with a thickness of 0.9 nm. The tunnel barrier layer 33 can be made of MgO and have a thickness of about 1.1 nm.

Figure 18:
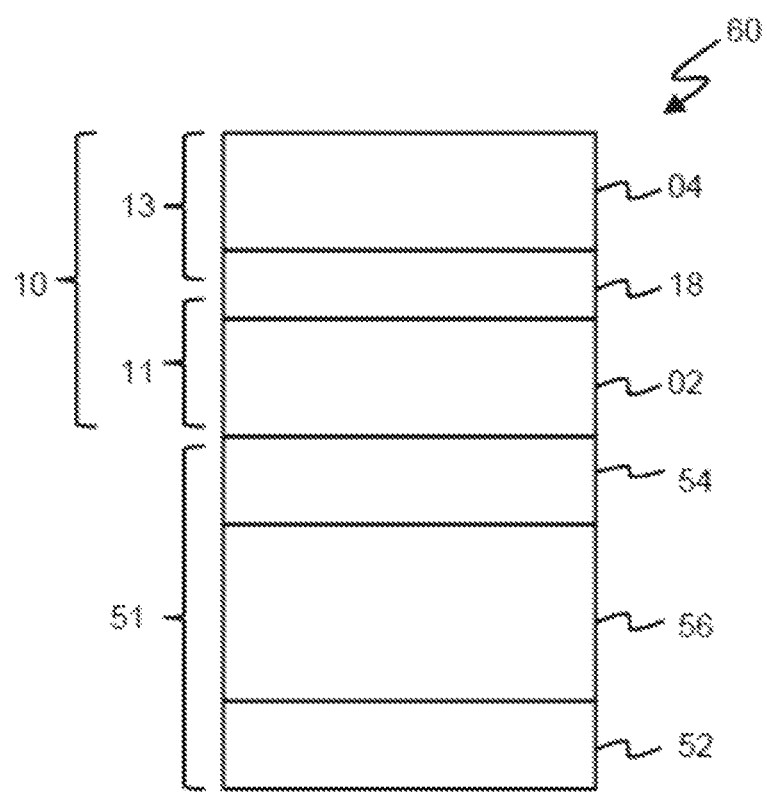
FIG. 18 is a schematic diagram of a resistive memory cell including a back to back schottky diode

In embodiments, the RSM cell can be a RRAM cell or PCRAM cell. FIG. 18 is a schematic diagram of an illustrative resistive random access memory (RRAM) cell 40. The RRAM cell 40 includes a resistive memory element 51 and a back to back Schottky diode 10 that are electrically connected in series. The resistive memory element 51 can include a medium layer 56 that responds to an electrical current or voltage pulse by altering an electrical resistance of the medium layer 56. This phenomenon can be referred to as the electrical pulse induced resistance change effect by changing a chemical composition or crystalline structure of the medium layer 56. This effect changes the resistance (i.e., logic state) of the memory element from one or more high resistance state(s) to a low resistance state, for example. The medium layer 56 is interposed between a first electrode 52 and the second electrode 54 and acts as a data storage material layer of the RRAM or PCRAM cell. The first electrode 52 and the second electrode 54 are electrically connected to a voltage source (not shown). The first electrode 52 and a second electrode 54 can be formed of any useful electrically conducting material such as, for example, a metal.

The material forming the medium layer 56 can be any known useful RRAM material. In embodiments, the material forming the medium layer 56 can include an oxide material such as, a metal oxide. In some embodiments, the metal oxide is a binary oxide material or complex metal oxide material. In other embodiments, the material forming the medium layer 56 can include a chalcogenide solid electrolyte material or an organic/polymer material.

The binary metal oxide material can be expressed as a chemical formula of $M_XO_Y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 66 include CuO, NiO, CoO, ZnO, $CrO_2$, $TiO_2$, $HfO_2$, $ZrO_2$, $Fe_2O_3$, and $Nb_2O_5$.

In embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_XSe_{100-X}$) containing a silver (Ag) component. One example of an organic material is Poly(3,4-ethylenedioxythiophene) (i.e., PEDOT).

The RSM cell can also include ferroelectric capacitors having structures similar to FIG. 6A using materials such as lead zirconate titanate (referred to as "PZT") or $SrBi_2Ta_2O_9$ (referred to as "SBT"). In such memory cells, an electrical current can be used to switch the polarization direction and the read current can detect whether the polarization is up or down. In such embodiments, a read operation is a destructive process, where the cell will lose the data contained therein, requiring a refresh to write data back to the cell.

Figure 19:
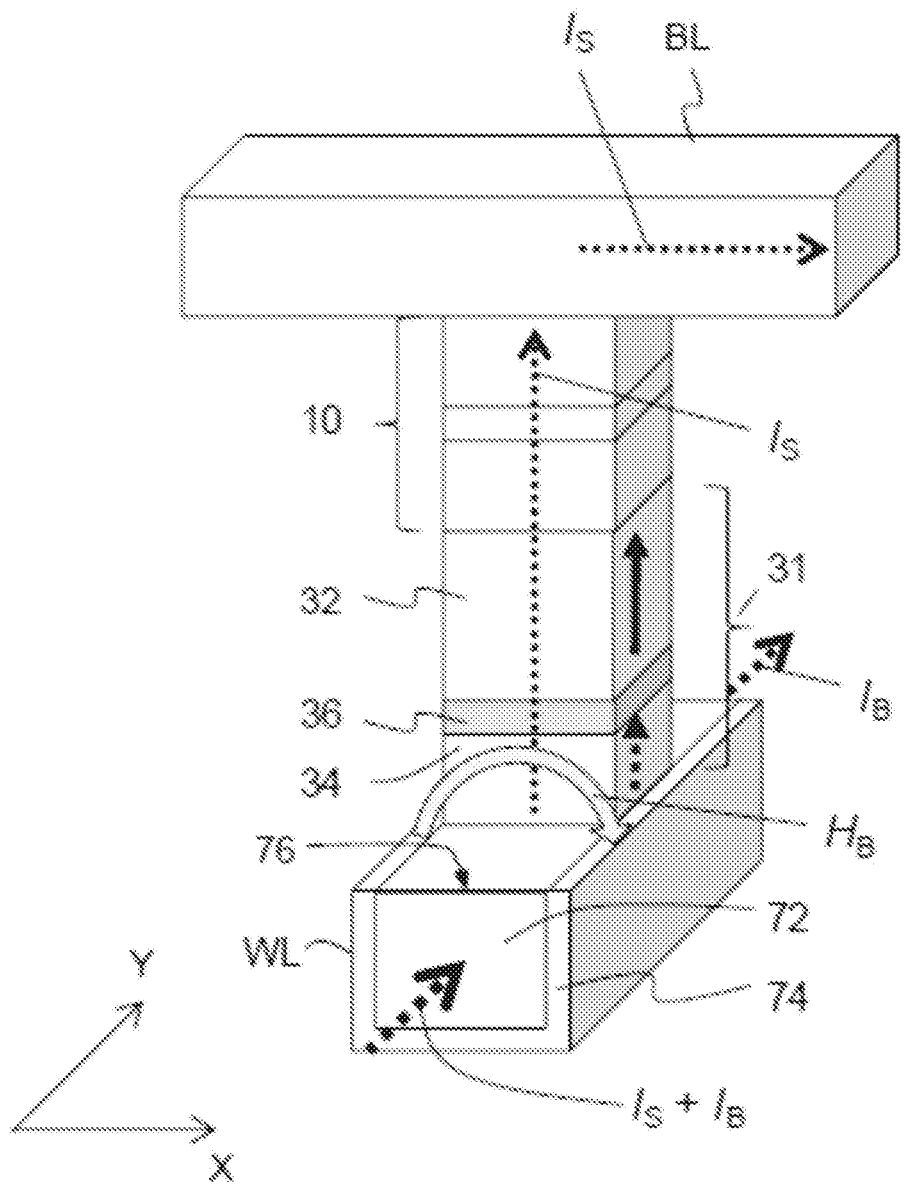
FIG. 19 is a schematic diagram of a magnetic memory cell including employing a hybrid switching mechanism including a back to back schottky diode

FIG. 19 shows a schematic diagram of the magnetic memory cell including a MTJ 31 and a back to back Schottky diode 10 which are electrically coupled to overlapping word WL and bit BL lines. The MTJ 31 employs magnetic materials with perpendicular magnetization in the pinned 32 and free 34 layers. The memory element employs a hybrid switching mechanism that uses a joint effect of the spin-polarized current $I_S$ and a bias magnetic field HB simultaneously applied to the MTJ 31. The bias magnetic field $H_B$ is produced by a bias current $I_B$ supplied to the bit line BL. The bias current $I_B$ running through the bit line BL produces a bias magnetic field $H_B$ (shown by arrow) that is applied along the hard axis of the free layer 34. To localize and magnify the bias magnetic field in the vicinity of the MTJ 31 the bit line BL comprises a conductive wire 72 with a magnetic flux concentrator (magnetic flux cladding) 74. The magnetic flux concentrator 74 is made of a soft magnetic material having a high permeability and a low coercivity such as NiFe. The flux concentrator 74 comprises a non-magnetic gap 76 formed on a side of the bit line BL facing the MTJ 31. The free layer 34 is disposed adjacent to the non-magnetic gap 76 where the bias magnetic field $H_B$ has a maximum. Additional layers, such as a seed layer can be placed between the free layer 34 and the bit line BL. Insertion of the additional layer (or layers) between the free magnetic layer 34 and the bit line BL can result in a reduction of the bias field. The magnetic field $H_B$ decreases almost inversely proportional with the distance between the free layer 18 and the bit line surface containing the non-magnetic gap 76. The hybrid writing mechanism can provide a substantial reduction of the spin-polarized current $I_S$, increase a switching speed, endurance of the memory cell and other advantages.

Memory cells as disclosed herein can be utilized in memory arrays. In embodiments, memory cells as disclosed herein can be utilized in crossbar memory arrays. An exemplary depiction of a crossbar (or crosspoint) memory array is illustrated in FIG. 19. An exemplary crossbar memory array 80 includes a first layer of approximately parallel conductive word line WL that are overlain (or underlain) by a second layer of approximately parallel conductive bit lines BL. In embodiments, the conductive bit lines BL can be substantially perpendicular, in orientation, to the conductive word lines WL. In embodiments, the orientation angle between the word and bit lines may be other than perpendicular. Two layers of conductive lines form a lattice, or crossbar, each bit line BL overlying all of the word lines WL and coming into close contact with each word line WL at conductor intersections that represent the closest distance between two conductive lines. Conductive word and bit lines can have rectangular, square, circular, elliptical, or any other regular or irregular cross sections. The conductive word and bit lines may have different widths or diameters and aspect ratios or eccentricities.

Memory cells as disclosed above can be disposed at the conductive lines intersections of the memory arrays. In embodiments, disclosed memory cells can be disposed at substantially all of the conductive lines intersections. A conductive lines intersection connected by disclosed memory cells can be referred to as a "crossbar junction" or "crosspoint junction". The crossbar junction may or may not involve physical contact between the word and bit lines. As shown in FIG. 19, the two conductive lines are not in physical contact at their overlap point, but the gap between the word line WL and the bit line BL is spanned by the memory cell MC that lies between the two lines at their closest overlap point. Each memory cell MC of the memory 80 includes aback to back Schottky diode 10 connected in series with a memory element 21. Each memory cell is electrically connected to an appropriate word line WL at one terminal and to an appropriate bit line BL at another terminal. The word lines WL are electrically coupled to a column decoder 86. Opposite ends of the bit lines BL are electrically coupled to a row decoders 82 and 84 through p-type pT and n-type nT MOS transistors. Source terminals of the p-type transistors are connected to a current source 88. Source terminals of the n-type transistors nT are connected to a ground. Selection of the memory cell MC in the memory array can be done by applying appropriate signals the bit BL and word WL lines. The selected memory cell MC is located at the intersection of these lines.

It should be noted that the drive transistors are in the linear range to control the current through the resistive element. This can be accomplished with either p-MOS or n-MOS transistors. However, the preferred TFTs (AOS TFTs) are of the NMOS type only.

Figure 20:
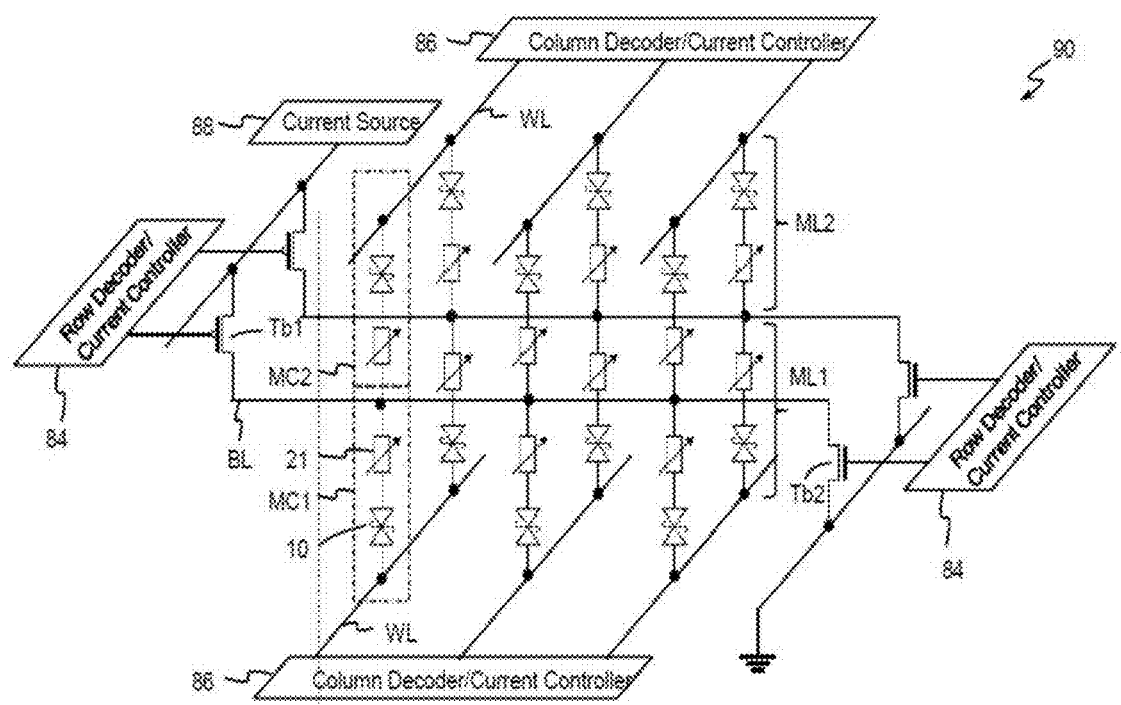
FIG. 20 is a circuit block diagram illustrating a memory array that can incorporate memory elements and back to back schottky diodes

FIG. 20 shows a circuit diagram of the nonvolatile memory according to another embodiment employing back to back Schottky diode disclosed herein. The memory 90 comprises two memory layers ML1 and ML2. Each memory layer comprises an array of memory cells MC disposed at intersection regions of the word and bit lines. Each memory cell MC includes a memory element a memory element 21 connected in series with a back to back Schottky diode 10. The memory layers ML1 and ML2 are jointly connected to the bit lines BL.

Disclosed memory cells may be advantageously utilized in memory arrays because the switching devices that are included in the memory cells can function as an integrated selective element that can avoid or minimize disturbances on unintended memory elements during read, write and erase operations due to sneak currents. The switching devices disclosed herein are especially advantageous in combination with MRAM because MRAM requires writing and erasing operations to be carried out using opposite polarities.

Thus, embodiments of Schottky diode switch and memory cells containing the same are disclosed. The implementations described above and other implementations are within the scope of the present disclosure. One skilled in the art will appreciate that the present disclosure can be practiced with embodiments other than those disclosed. The disclosed embodiments are presented for purposes of illustration and not limitation, and the present disclosure is limited only by the claims that follow.

There is wide latitude for the choice of materials and their thicknesses within the embodiments of the present disclosure.

The semiconductor layers 18 and 36 can include any semiconductive material. Exemplary semiconductors that can be utilized for the semiconductor layers 18 and 36 include, but are not limited to, silicon (Si), Si containing compounds, germanium (Ge), Ge containing compounds, aluminum (Al) containing compounds, boron (B) containing compounds, gallium (Ga) containing compounds, indium (In) containing compounds, cadmium (Cd) containing compounds, zinc (Zn) containing compounds, lead (Pb) containing compounds, and others. Exemplary elemental and compound semiconductors include, but are not limited to, Si, for example crystalline Si, polycrystalline Si, Ge, SiC, SiGe, AlSb, AlAs, MN, AlP, BN, BP, BAs, GaSb, GaAs, GaN, GaP, InSb, InAs, InN, InP, $Al_xGa_{1-x}As$, $In_xGa_{1-x}As$, InGaP, AlInAs, AlInSb, GaAsN, GaAsP, AlGaN, AlGaP, InGaN, InAsSb, InGaSb, AlGaInP, also InAlGaP, InGaAlP, AlInGaP), AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $SnO_2$, $In_2O_3$, CdO, $Cu_2O$, InGaZnO, ZnSnO, ZnO, InZnO $AgSbO_3$, $2CdO.GeO_2$, $2CdO.PbO$, $CdS.In2S_x$ and others. A thickness of the semiconductor layer 18 can be in a range from 10 nm through 500 nm, and more specifically in a range from 20 nm through 100 nm.

The semiconductor layer 18 and 36 or its portion can be doped. Doping is the process of intentionally introducing impurities into a semiconductor to change its electrical properties. The particular dopant that is chosen can depend at least in part on the particular properties that are desired in the final back to back Schottky diode, the identity of the semiconductor material to be doped, other factors not discussed herein, or a combination thereof. Exemplary dopants can include, but are not limited to Group III and Group V elements. In embodiments where the semiconductor materials are Group IV materials (for example, silicon, germanium, and silicon carbide), Group III or Group V elements can be utilized as dopants. Specific exemplary dopants can include, but are not limited to boron (B), arsenic (As), phosphorus (P), and gallium (Ga).

Metal layers 02 and 04 can be made of materials that include, but are not limited to tungsten (W), titanium (Ti), chromium (Cr), molybdenum (Mo) or a noble metal such as gold (Au), platinum (Pt), silver (Ag), palladium (Pd), rhodium (Rh), copper (Cu), or ferromagnetic metal such as nickel (Ni), cobalt (Co), iron (Fe), or their silicides such as W—Si, Ti—Si, Pt—Si, Pd—Si, Ni—Si, or their based alloys such as NiCr, TiW and others.

Preferred materials are those that exhibit high ON/OFF current ratios such as CuTaOxPt as reported by Zhang and Huang: A MIM diode with ultra abrupt switching process and high on/off current ratio, Lijie Zhang, Ru Huang, Institute of Microelectronics, Peking University, Beijing 100871, P.R.China, ECS TRANSACTIONS; 35, 4; 923-930, Silicon nitride, silicon dioxide, and emerging dielectrics International Symposium; 11th, Silicon nitride, silicon dioxide, and emerging dielectrics, 2011. This paper is hereby incorporated herein in its entirety by reference. The MIM diode reported by Zhang and Huang exhibits $10^6$ On/Off current ratio, low switching voltage (0.7V) and can be fabricated in low temperature BEOL facilities.

Additional preferred low temperature BEOL compatible diodes are described in U.S. Patent Application publication 2013/0044532, Feb. 21, 2013—Bethune, et. al., incorporated herein in its entirety by reference.

The invention disclosed herein shall not be limited to back-to-back Schottky diodes as the bidirectional selector switch. Although the drawings, embodiments and discussion has focused on back-to-back Schottky diodes, there are other developments of bipolar switches that exhibit the necessary non-linear characteristics for use in crosspoint memory arrays. Those other options include Complementary Resistive Switches disclosed in the following publications 1) Complementary resistive switches for passive nanocrossbar memories. Linn E, Rosezin R, Kiigeler C, Waser R. Nat Mater. 2010 May; 9(5):403-6. doi: 10.1038/nmat2748. Epub 2010 Apr. 18 and 2) Nanoscale Bipolar and Complementary Resistive Switching Memory Based on Amorphous Carbon, Chai Y, Wu Y, et. al., IEEE Transactions on Electron Devices, Vol. 58, No. 11, November 2011. In addition, zener diodes and Cu-containing and other mixed ionic electronic conductors (MEIC), promoted by IBM, [Ref: I. Riess, Solid State Ionics, 157, 1 (2003) for an overview of MIEC models], may also serve as bipolar switches (or bidirectional selector switch) and shall not depart from the spirit and scope of the invention disclosed herein. In certain embodiments incorporating the back-to-back Schottky diodes in memory arrays, metal layers 02 and/or 04 may be the conductive Bit or Word line, the pinned or free layer of the MTJ stack (in the case of an MRAM memory cell) or comprised of an additional layer designed to modify the resistance of the back-to-back Schottky diode to enable proper threshold voltages. Hence bidirectional selector switches shall include but not be limited to back-to-back Schottky diodes, complementary resistive switches, mixed ionic electronic conductors, zener diodes, and other elements or constructions that exhibit the necessary non-linear characteristics of bipolar switching for use in crosspoint memory arrays.

Further, the invention disclosed herein shall not be limited to the use of back-to-back Schottky diodes or other switches at each memory element. If for example voltage or current thresholds of the memory elements are sufficiently far apart for On/Off switching for a given matrix array and related drive circuitry and drive method, such switches at each memory element to control sneak paths may not be required.

The pinning layer 55 can be made of alloys such as FeMn, IrMn, PtPdMn, NiMn and similar.

With regard to digital integrated circuits, process technology refers to the particular method used to make silicon chips. The driving force behind the manufacture of integrated circuits is miniaturization, and process technology boils down to the size of the finished transistor and other components. A certain minimum feature size of a process technology is also referred to as a "technology node" or "process node". A feature may be for example the width of a conductive line, width of the MTJ stack or width of a transistor terminal Higher density memory arrays are possible using crosspoint architectures and manufactured at smaller size technology nodes. State of the art process technology nodes have evolved with technology improvements in semiconductor processing from 1,000 nm minimum feature size in 1985, to 180 nm in 1999, to 45 nm in 2008, to 22 nm in 2012, and 14 nm implemented by Intel in 2014. By 2020, 7 nm process technology nodes are expected to be available enabling minimum feature size of 7 nm.

A key advantage of the present invention is that the technology nodes for fabrication of the memory array, including BBSD and conductive lines (collectively the "MTJ layer") and TFT array (TFT layer) are decoupled. In other words, depending on the desired functionality of the TFT layer, one may use the same technology node (for example, 45 nm) used to fabricate the MTJ layer to fabricate the TFTs, or preferably, in order to reduce cost and given the fact there is a significantly smaller number of TFTs needed—using for example ((2×N)+(3×M))—compared to the number of memory elements (M×N), a larger technology node (for example, 65 nm, 90 nm, 130 nm or larger yet) may be employed during the fabrication of the TFTs. In addition, there is no need to place the TFTs along the perimeter of the memory array as disclosed in US 2012/0281465; rather, the TFTs are fabricated directly over or under the memory array to be addressed. Interconnection of the TFTs to their respective conductive lines may be implemented vertically with no need for complex lateral interconnects, thereby providing for high speed operation at low power consumption. TFTs do not require the front end process equipment required in conventional MOS (e.g., CMOS) foundries; hence, the cost of TFTs are substantially lower than MOS based transistors since BEOL facilities can fabricate the transistors. Eliminating the need for MOS based transistors also allows for use of lower cost substrates such as glass, including borasilicate glass, soda lime glass or quartz for example. Further, decoupling of the technology nodes for memory element fabrication and TFT fabrication enables use of larger technology node equipment for TFT fabrication which provides for additional cost reduction. This is due to the fact the equipment for larger technology node TFT fabrication is lower cost since it may likely be fully (or nearly fully) depreciated from having been operational for many years in older semiconductor fabs.

Data can be recorded to a magnetic tunnel junction by a spin-induced switching mechanism or by a hybrid switching mechanism including simultaneous effect of the spin-polarized current and a bias magnetic field applied to the magnetic tunnel junction.

Figure 10A:
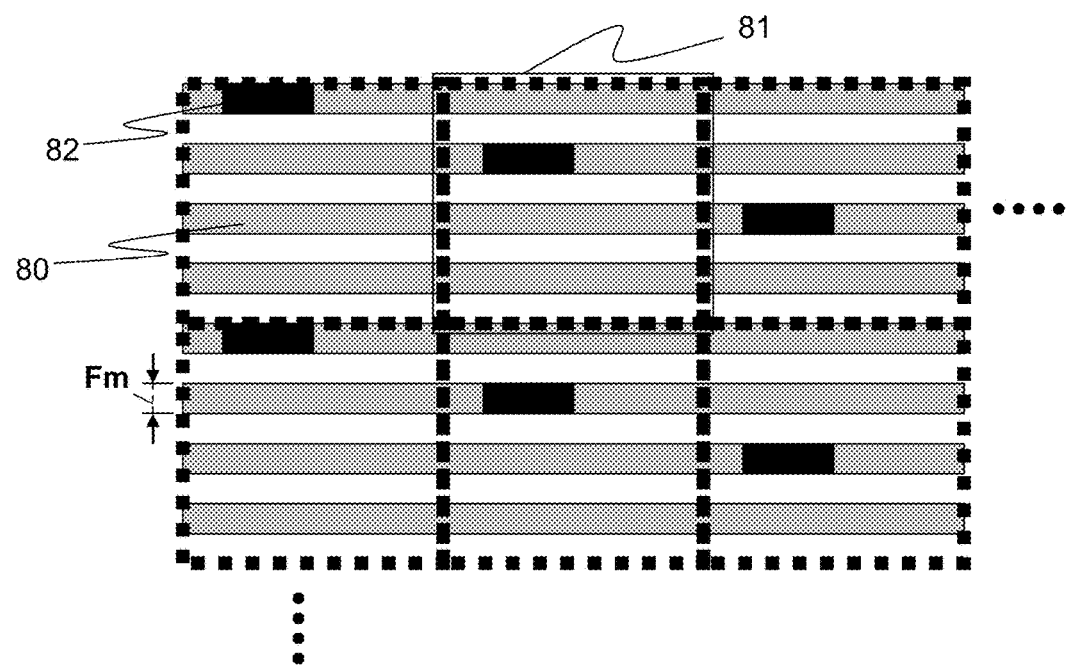
FIG. 10A is a top view illustration showing the interconnects of conductive lines (either bit lines or word lines) at various intermediate points to allow for simple connection to an array of large transistors positioned above or below the memory array area

FIG. 10A is a top view illustration showing a portion of the interconnects of conductive lines (either bit lines or word lines) at various intermediate points to allow for simple connection to an array of large transistors positioned above or below the memory array area. The figure is intended to convey the fact that although the area required to fabricate a TFT is much larger than the area of a memory cell, the TFTs may be arranged across an area above or below the MTJ layer such that interconnects between conductive lines fabricated at Fm technology node are connected to TFT terminals fabricated at Ft technology node without requiring complex lateral interconnect wiring, thereby providing for high speed operation at low power consumption due to lower capacitive conductive lines compared to other designs which would require longer interconnects. A TFT terminal need only connect at a portion of a conductive line and the TFTs may be arranged in a manner to minimize disconnects due to alignment challenges arising from the much larger process technology node used to fabricate the TFT layer compared to that of the MTJ layer.

Figure 10B:
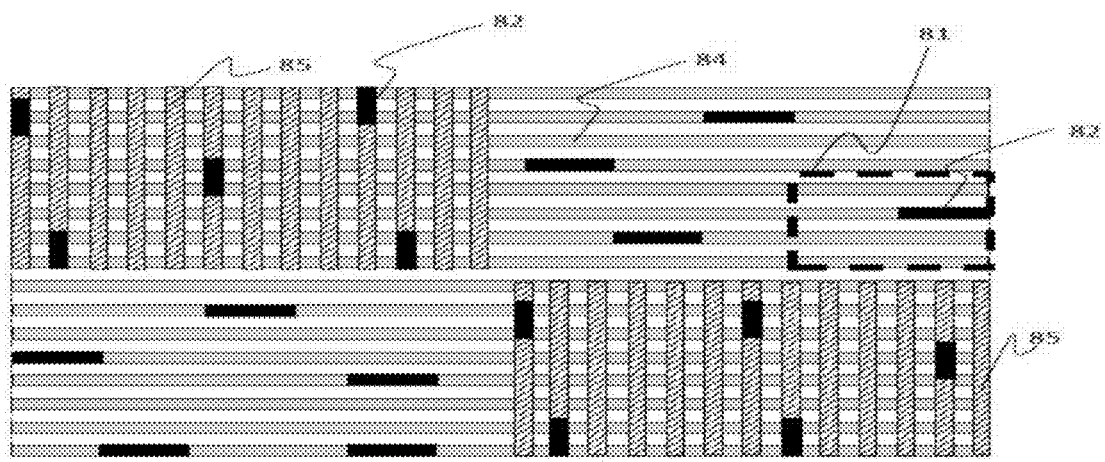
FIG. 10B is a top view illustration showing the interconnects of word and bit lines at various intermediate points to allow for simple connection to an array of large transistors positioned above or below the memory array area FIG. 11A

FIG. 10B is a top view illustration showing a portion of the interconnects of word and bit lines at various intermediate points to allow for simple connection to an array of large transistors positioned above or below the memory array area, but in a configuration where both word and bit lines are facing the same direction for connection to the TFT array. This is appealing in order to use one layer of TFTs to address both word and bit lines, and not require separate fabrication steps for a TFT array for both word and bit lines. FIG. 10 shows for example conductive word lines (85), wrapped from the other side of the memory array to face the same direction as conductive bit lines (84) for interconnection to the TFT array. The areas for interconnect between conductive lines and thin film transistors (82) are appropriately spaced apart to allow for larger minimum feature size transistors to be connected to the smaller feature size conductive lines of the memory array in the available area for the thin film transistors (81). More than one set of conductive lines for a given layer of memory may be wrapped to face the same direction of other conductive lines to be attached to TFTs which would allow for low cost multilayer memory arrays. FIG. 41A through FIG. 41E illustrate additional examples of bringing all the conductive bit and word lines from multiple layers of memory (for example 5 as shown in the FIG. 41A through 41E), to a level where all connections are facing the same direction to the TFT array(s) for interconnect.

FIGS. 11A and 11B further illustrates the advantages of the present invention with respect to decoupling of the process technology nodes—Fm and Ft—in fabrication of the memory array layer, including BBSD and conductive lines (the MTJ layer) and TFT array (the TFT layer). As described in the embodiments below there are many configurations that a designer may choose to place transistors on the various TFT layers disclosed herein. FIGS. 11A and 11B is for one configuration only, namely that of the third embodiment where a single layer TFT array may have at least 2N transistors to provide the bit driver circuitry for an MTJ layer.

A typical size (area) for a TFT is $12Ft^2$ (T), but may be smaller or larger. The size (area) of a crosspoint memory cell normally is $4Fm^2$. [There are cases where the memory cell may have an elliptical or non-square shape; therefore, the cell area may be $6Fm^2$ or even larger. For purposes herein, the normal size of $4Fm^2$ is referred to as the size of a crosspoint memory cell]. For a given matrix or memory block consisting of M×N cells (bits), the area required is $M\times N\times 4Fm^2$. To consider the area required on a TFT layer which interconnects to the bit conductive lines, 2×N TFTs (select transistors) may be required. The area required for the TFTs (assuming a typical area of $12Ft^2$ per TFT) is equal to $24\ Ft^2\times N$. Calculating an equivalent area for both the MTJ layer and TFT layer would provide the maximum Ft for a given matrix of M word lines at a given Fm technology node for the memory cells. Hence, For $M\times N\times 4Fm^2$ (MTJ layer area)=$24\ Ft^2\times N$ (TFT layer area), yields Ft(max)=Square root of $(M\times Fm^2/6)$ Taking Fm=45 nm for example, and a matrix of 100 word lines, the maximum Ft=184 nm. Assuming M=N, a memory block of 100×100 (10 Kbits), would occupy a square area about 9 microns×9 microns. As noted, it is preferable to also include transistors for the decoder logic and bandgap logic in close proximity to the selection transistors. Hence, a designer may elect Ft=130 nm (approximately 288%×Fm) which would provide for up to double the number of transistors in the same space as Ft=184 nm would provide for. It should be noted that in practice 184 nm is not an available process technology node; however, 180 nm is. The intent of FIG. 11A and FIG. 11B is to illustrate that by decoupling the technology nodes required for the MTJ layer from the TFT layer, a wide range of flexibility is available to the designer to select a minimum feature size (technology node) that optimizes the parameters most important to the product design—whether it be cost, speed, density, or power. Staying with Fm=45 nm, in this example, if M=1,000 (1 Mbit memory block assuming M=N), the maximum Ft=581 nm (>1000%×Fm).

The process technology node of 45 nm was introduced in 2008. If one looks at Fm=7 nm (a technology node expected to be available by 2020), and M=10,000, Ft max=286 nm (assuming a TFT area of $12Ft^2$ remains the typical size). A memory block, if M=N is assumed, would have 100 Mbits, occupying an area of 140 microns×140 microns. This is equivalent to about 400 GBytes per square inch. With five (5) MTJ layers, a 2 Terabyte per square inch device could be fabricated, substantially in BEOL facilities, with word and bit driver select transistors, read transistors and decoder logic transistors all included and fabricated at a low cost technology node of 180 nm or 130 nm.

It should be noted herein that the terms "TFT layer" and TFT-L1, TFT-L2, TFT-L3 . . . TFT-Ln used herein in the figures and embodiment descriptions may refer to a single layer TFT array or several layers of TFT arrays. FIG. 11A and FIG. 11B calculations assume a single layer TFT array. However, one may design and fabricate more than one layer of TFTs, which would enable one to use a larger technology node compared to a single layer TFT array. Alternatively, the same technology node but more layers of TFTs provide for more number of transistors that can be placed in the given area. This allows for flexibility in design. For example, FIG. 11B indicates that even at a relatively small sized memory array (M=10), max. Ft is larger than Fm, indicating that TFT drive circuitry for even small sized memory arrays may reside above or below the memory array in the same area. This could be accomplished at the same or slightly larger technology node used for Fm as Ft, or one may add one or more additional layers of TFTs which would relax the technology node requirement and enable larger less expensive technology node TFTs to be fabricated. This could be beneficial for certain embedded memory designs. Design of metal layer interconnects and related insulator layers between TFT layers and connection between TFT terminals and conductive lines of the MTJ layers is a known art and hence the figures and description herein is intended to be illustrative only, with detailed drawings of such interconnects not needed.

It should be noted that although the invention disclosed herein is most suited with crosspoint memory designs which only require one transistor for many memory cells, the invention may also be applied to memory designs which require one transistor per memory cell. By taking advantage of the capabilities of fabricating TFTs in multiple layers (i.e., 3D), the memory array may be configured in a $4Fm^2$ design although the transistors (TFTs) may be much larger. In this case, one layer of n TFTs are fabricated to address a lower number of memory cells and several layers of TFTs are thus required to ensure each memory cell is individually addressed by one TFT.

High Density I/O

The TFTs described herein may also be applied to enable much higher Input-Output (I/O) connections from an IC as currently available with current techniques thereby improving the performance of the IC by enabling it to perform more operations in a shorter period of time. A higher number of I/O connections will help alleviate the I/O bound problem found in most microprocessors and other logic devices. For the purposes described herein Wide I/O is defined as over 2,000 I/O pin connections on a single die or on a substrate to be connected to a single die.

In computer science, I/O bound refers to a condition in which the time it takes to complete a computation is determined principally by the period spent waiting for input/output operations to be completed. This is the opposite of a task being CPU bound. This circumstance arises when the rate at which data is requested is slower than the rate it is consumed or, in other words, more time is spent requesting data than processing it.

The I/O bound state has been identified as a problem in computing almost since its inception. The Von Neumann architecture, which is employed by many computing devices, is based on a logically separate central processor unit which requests data from main memory, processes it and writes back the results. Since data must be moved between the CPU and memory along a bus which has a limited data transfer rate, there exists a condition that is known the Von Neumann bottleneck. Put simply, this means that the data bandwidth between the CPU and memory tends to limit the overall speed of computation. In terms of the actual technology that makes up a computer, the Von Neumann Bottleneck predicts that it is easier to make the CPU perform calculations faster than it is to supply it with data at the necessary rate for this to be possible.

In recent history, the Von Neumann bottleneck has become more apparent. The design philosophy of modern computers is based upon a physically separate CPU and main memory. It is possible to make the CPU run at a high data transfer rate because data is moved between locations inside them across tiny distances. The physical separation between CPU and main memory, however, requires a data bus to move data across comparatively long distances of centimeters or more. The problem of making this part of the system operate sufficiently fast to keep up with the CPU has been a great challenge to designers since as CPU speed gets faster, processes tend to get more I/O bound.

Figure 24:
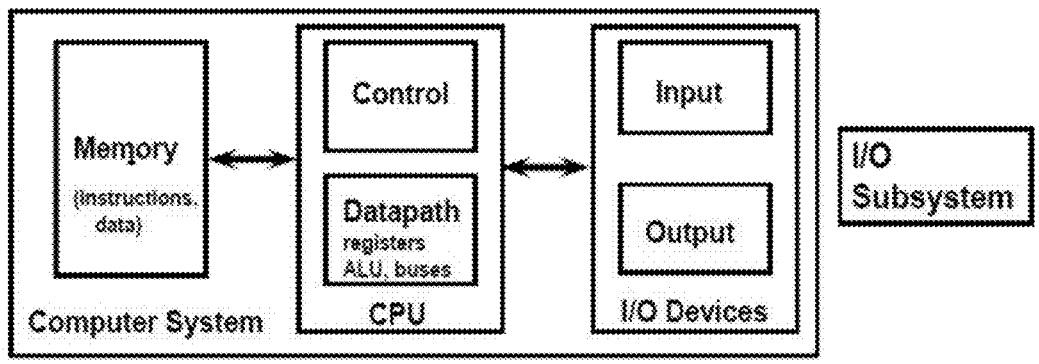
FIG. 24 is a schematic diagram of the Von-Neumann Computer Model according to the prior art
Figure 25:
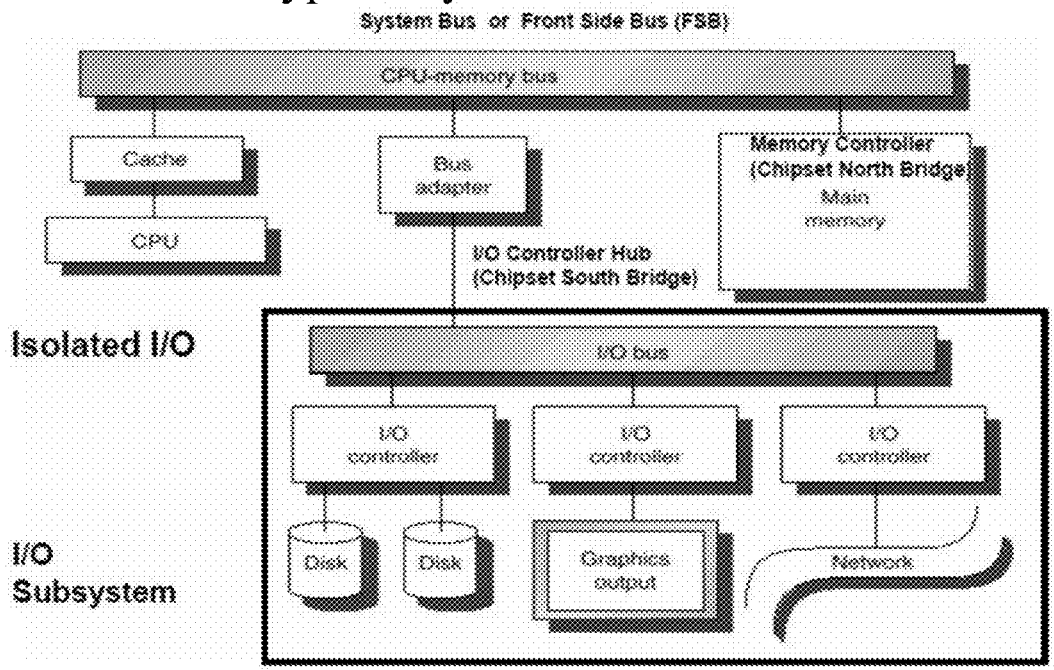
FIG. 25 is a schematic diagram of a Typical System Architecture according to the prior art

FIG. 24 is a schematic of the Von Neumann Computer Model; the computing engine is partitioned into three main components: (1) Central Processing Unit (CPU): Control Unit (instruction decode, sequencing of operations), Datapath (registers, arithmetic and logic unit, buses), (2) Memory: Instruction (program) and operand (data) storage, and (3) Input/Output (I/O): Communication between the CPU and the outside world. The I/O connections, buses and related controller is also commonly referred to as the I/O Interface. FIG. 25 illustrates a typical system architecture with buses connecting the CPU to external resources such as memory, storage (hard disk drives, magnetic tape drives, solid state drives), graphics output devices (displays) and network communications (e.g., Wi-Fi, LAN, Ethernet, internet).

Figure 26:
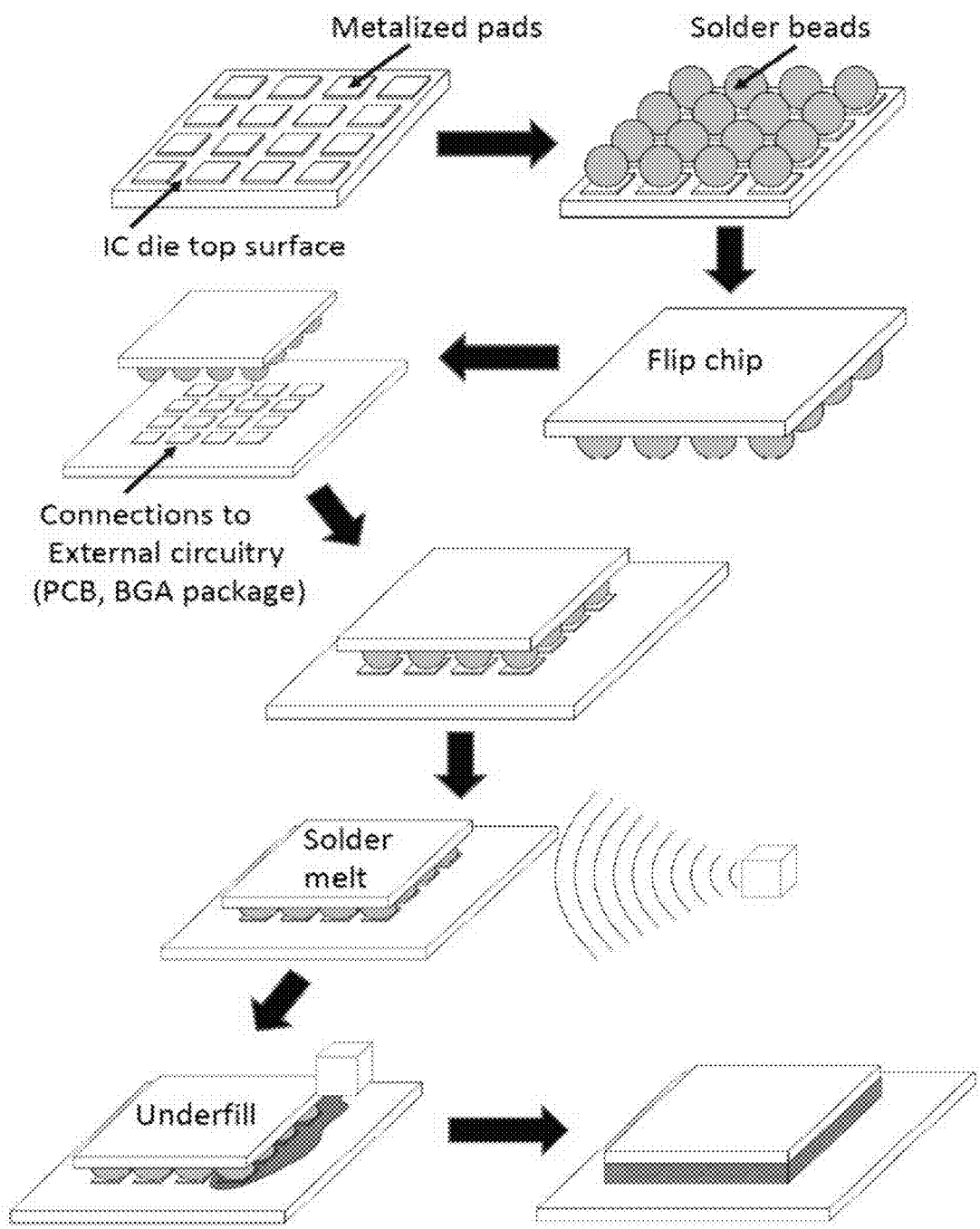
FIG. 26 is a flow chart of a Typical Flip Chip Direct Chip Attach Process according to the prior art

For high density interconnect between a semiconductor chip and other devices, the direct chip attach (DCA) method is increasingly used. DCA is commonly called a "flip chip". It is one type of mounting used for semiconductor devices, like integrated circuits, which does not require wire bonds. Instead the final wafer processing step deposits solder beads on the chip pads. After cutting the wafer into individual dice, the flip chip is then mounted upside down in/on the package and the solder reflowed. Flip chips then normally undergo an underfill process that will cover the sides of the die, similar to the encapsulation process. The terminology flip chip comes from the upside down (flipped) mounting of the die. This leaves the chip pads and their solder beads facing down onto the package, while the backside of the die faces up. The general process flow is illustrated in FIG. 26. This mounting is also known as Controlled Collapse Chip Connection or C4. A flip chip may be mounted into a Ball Grid Array (FIG. 27)—one form of popular packaging in the IC industry or directly onto a printed circuit board (PCB). A flip chip may also be connected directly to another chip—a method to accomplish 3D circuitry, albeit not monolithically, but via stacking of die. Alternatives to solder beads have been introduced as well including gold balls or molded studs, electrically conductive polymer and the "plated bump" process that removes an insulating plating by chemical means.

With multicore CPUs and solid state drives (SSDs) replacing hard disk drives (HDDs), the need for ever increasing bandwidth continues to grow. Solutions to improve bandwidth focus mainly on faster I/O adapters and I/O switches, however, by drastically increasing the I/O connections to a CPU chip, one can also realize significant bandwidth improvement.

The number of pads or I/O connections on a typical CPU is limited and normally comprises about 10-15% of die area, normally located near the periphery of the chip. As noted above, increasing the number of I/O connections would help solve the I/O bound problem; however, this would require additional die area and increased signal path lengths. FIG. 28 illustrates the basic I/O circuits for driving output and input signals. The transistors (291 and 292) for I/O circuitry and related components are normally substantially larger than the transistors for logic and other on-chip circuitry due to the fact I/O signals must be sent a substantially further distance off-chip compared to the short internal distances with on-chip circuitry. Hence, adding more I/O circuitry under current approaches will cause unacceptable die area occupation. A preferred approach to improving I/O performance is to increase the number of connections (pads) on a chip for subsequent interconnect to external devices without requiring unacceptable additional die area. This is accomplished by implementing I/O circuitry with TFTs.

FIG. 29 illustrates a typical example of existing I/O circuitry on chips. As noted earlier, the circuitry on chips for I/O (302) typically accounts for 10-15% of die area located normally around the periphery of the die whereby the core circuitry (301) would reside in the 85-90% interior area. Since conventional chips are fabricated with CMOS circuitry (311), all the circuitry (transistors) must reside on the silicon substrate (314) layer where the necessary p and n channels have been created. In other words, there's no viable means to fabricate transistors above the first layer of CMOS circuitry on the substrate. The I/O pads on the die surface may be spread across the entire area of the die to provide for larger pad pitch for subsequent connection. The invention disclosed herein proposes to utilize TFTs for all or a portion of the necessary transistors for I/O thereby enabling the addition of significantly more I/O connections (pads) and improving the performance bottleneck created by I/O. This is possible due to the fact TFTs may be fabricated above the core circuitry on the substrate (primarily traditional CMOS, but not limited to CMOS) and hence spread across the entire die area and comprised of additional 3D layers if needed. Therefore, whereas typical semiconductor chips may have upwards of 400 or more I/O pads, by utilizing TFTs for some or all of the I/O circuitry requirements, I/O pad count may now increase dramatically, perhaps as high as 10-20× or more. For example, fine pitch DCA can be processed at about 0.1 mm (100 microns) pitch; improvements in pitch density continue to evolve with recent technologies enabling die and wafer stacking at 20 microns and less pitch.

Figure 30:
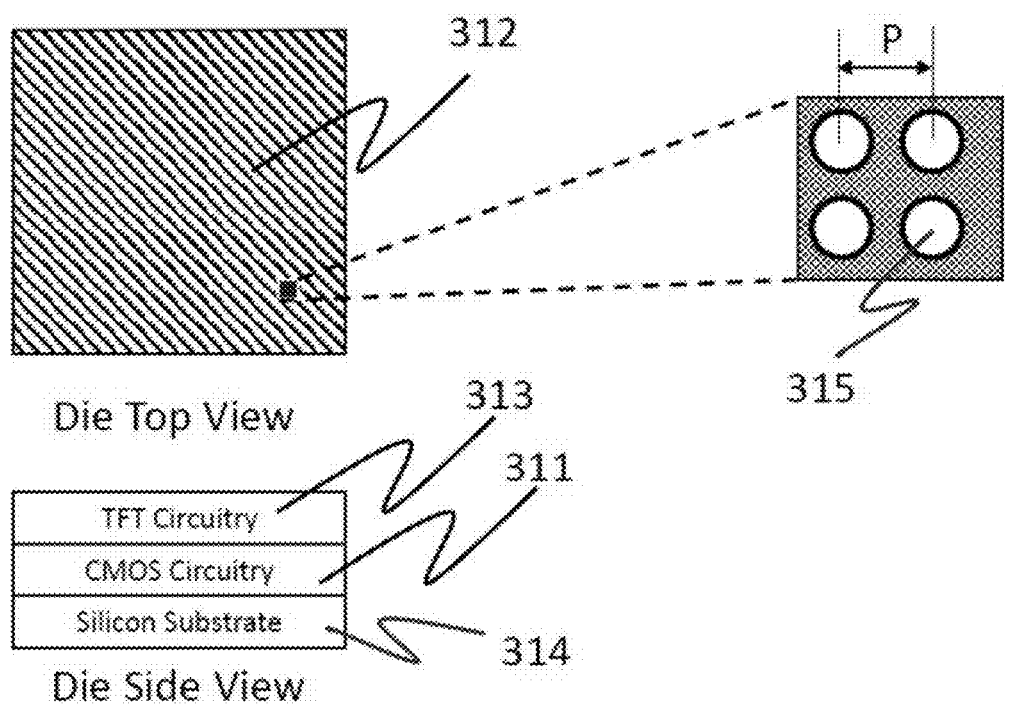
FIG. 30 is an illustration of TFT-based I/O circuitry on a traditional CMOS semiconductor device made in accordance with an embodiment of the present invention

FIG. 30 illustrates the basic principles of the invention disclosed herein. By utilizing TFT circuitry (313) rather than conventional CMOS, the I/O circuitry (312) may be fabricated on top of the underlying core circuitry which may be traditional crystalline silicon CMOS (311) or TFTs. Hence, most of the entire area of the chip may be utilized solely for I/O circuitry thereby enabling a much higher pad count for off-chip interfacing and thereby increased performance. For example, a chip that measures 1 cm×1 cm may now contain up to 10,000 I/O pads if needed assuming a pad pitch (P) of 100 microns. A chip with 10,000 I/O pads may now contain for example, 6,000 signal I/O pins, 3,000 Vdd and Vss pins and 1,000 heat sink pins for thermal management.

By allowing such a high number of I/O connections, an ultra wide data bus of say 4,096 bits or 8,192 bits may be employed at a relatively low (compared to LPDDR4) pin bus speed of 200 Mbps or 100 Mbps respectively to provide for a total data transmission bandwidth of 102.4 GB/sec to and from the chip. A similar transmission rate can be accomplished by using much higher bus speed circuits and lower I/O pad counts; for example, 3,200 Mbps×256 I/O connections will provide 102.4 GB/sec transmission bandwidth. A bus speed of 3,200 Mbps is equivalent to a bus speed identified in the Low Power Double Data Rate 4 (LPDDR4) standard (JESD209-4) established and published by the Arlington, Va. based standards organization JEDEC Solid State Technology Association (JEDEC) in August 2014. A 128 pin bus width at 3,200 Mbps/pin will provide 51.2 GB/sec transmission bandwidth.

An ultra wide bus had been promoted by the Association of Super-Advanced Electronics Technologies' (ASET), Integration Basic Technology Research Lab (Japan) in 2013. The implementation technique described by ASET however involves a complex wafer to wafer attach method with a very thin silicon interposer wafer as an interconnect—a complex through silicon via (TSV) process which is a major manufacturing challenge suggesting yield problems. The proposed logic to memory chip interconnect I/O circuitry would not include large ESD blocks and would not require excessively large transistors since the transmission length (chip to chip) is quite short compared to off-chip communications to adjacent chips on a printed circuit board for example. Hence, the technique described by ASET would not be feasible for off-chip communications to other adjacent chips due to the fact the I/O circuitry would not be designed and rated for such higher power signaling requirements. In order to communicate to such adjacent chips, the size of the I/O circuitry for such a high number of I/O pads would not be feasible economically to accomplish with conventional CMOS circuitry. By utilizing TFTs however, according to the invention disclosed herein, such large I/O circuitry can be fabricated across most of the die area above the underlying core circuitry thereby enabling ultra wide bus interfacing between chips on a printed circuit board.

JEDEC further published in August 2014 the WideIO2 standard (JESD229-2) setting the minimum requirements for future mobile memory interfacing. The WideIO2 standard also is promoting slower bus speeds coupled with wider buses to achieve the future high data transmission bandwidth requirements. A bus speed of 800 Mbps/pin is specified in WideIO2. Hence, to achieve the same 51.2 GB/Sec data transmission provided by LPDDR4 at 3,2000 Mbps/pin with 128 pin bus width, WideIO2 at 800 Mbps/pin would require a 512 pin bus width. A 4× reduction in bus pin speed requires a 4× increase in bus width to achieve the same data rates. The slower bus speed of 800 Mbps/pin specified in WideIO2 for achieving high data transmission bandwidth is a parameter which is more compatible with comparatively slower TFTs. Even lower bus speeds (such as 200 Mbps) at wider bus width (such as 2,048 pins) can provide 51.2 GB/Sec data rates with TFT-based IO circuitry.

Another advantage of fabricating I/O circuitry with TFTs is that the location of the I/O pads may be closer to the related circuitry on chip intended for each individual I/O thereby reducing the distance of the on-chip signal path. TFTs with slower switching speed will adversely impact the I/O speed of each individual I/O that comprises TFTs; however the benefit of substantially increasing I/O pad count greatly outweighs the impact of the slower TFTs. Delays in I/O come not from the on-chip circuitry alone but also from the off-chip long distance signal paths and the related resistance, capacitance and inductance. Hence RCL time delays in I/O are significant contributing reasons for throughput challenges. By increasingly substantially the I/O pad count, even with slower switching TFTs, the I/O bottleneck may be solved for many if not all semiconductor chip applications ranging from CPUs (microprocessors), GPUs (graphical processing units), microcontrollers, ASICs, FPGAs, GPUs, PLDs, DSPs, ASSPs, MEMS and more.

The lower mobility of TFTs compared to conventional CMOS is the reason for slower switching speed of TFTs. The circuit designer must consider this when designing TFT-based I/O circuitry to meet the signal power requirements and bus speeds. It would be preferable to implement TFT I/O circuitry at the slower bus speeds of 800 Mbps (WideIO2) or even 200 Mbps or 100 Mbps suggested above by implementing ultra wide bus widths up to 4,096 or even 8,192. The required clock speed (tCK) for WideIO2 (800 Mbps/pin) is about 1.25 ns and that required for the lower 200 Mbps/pin with ultra wide bus width is about 5 ns. This compares to the much faster LPDDR4 clock speed of about 0.3 ns for 3,200 Mpbs/pin bus speed. A slower clock speed translates to lower power consumption and hence lower heat dissipation challenges. This is particularly important for both portable devices such as mobile phones and for data centers where power consumption is a huge cost component of operational expenses. Lower temperatures also translates to higher reliability and lifetime of the devices.

Due to the speed requirements in I/O, the preferred TFTs to be implemented in the disclosed invention herein are those with high mobility, including but not limited to CdSe, Poly-Si, IGZO, ZTO/ITO and other hybrid TFT technologies including the use of graphene and carbon nanotube materials under development. Mobility of these TFTs have been reported in the range of 20 to 124 $cm^2/Vs$ and higher.

Current state of the art reports on AOS TFTs indicate switching speeds of 500 to 3,000 ns. However, such reports are related with transistors sized at 10 to 60 microns Width or Length of the semiconductor channel. Switching is primarily related to the parasitic capacitance of the channel Hence, it is estimated that AOS TFTs fabricated with minimum features size of 0.13 micron (a factor of nearly 6,000× in area compared to 10 micron minimum feature size) or less, will exhibit the needed sub 1 ns switching speed required for 51.2 GB/sec and greater data speeds envisioned by WideIO2 and ultra wide bus IO schemes.

Graphene-based TFTs on the other hand have shown much faster speeds than AOS TFTs and faster than crystalline silicon transistors. Hence, use of graphene-based TFTs and other fast TFTs will offer incredibly faster data rate transmission rates than envisioned by current solutions. The following tables illustrate the possibilities. Table 1 for example indicates that a 2 TeraByte/sec (2,048 GB/sec) data rate is possible with a bus speed of 2,000 Mbps and 8,192 I/O pad count for data lines. Table 2 indicates such number of I/Os (8,192) could be spaced at 110 micron pitch over a die area measuring 1 cm×1 cm. Such performance is possible with the TFT-based I/O circuitry described by the disclosure and embodiments disclosed herein.

TABLE 1

Data Transmission Rate (GB/sec) as a function of Bus Speed and I/O Count

| | | I/O Count (# of data bus lines) GB/sec | | | |
|---|---|---|---|---|---|
| | | 4,096 | 8,192 | 16,384 | 32,768 |
| Bus | 100 | 51 | 102 | 205 | 410 |
| Speed | 200 | 102 | 205 | 410 | 819 |
| (Mbps) | 800 | 410 | 819 | 1,638 | 3,277 |
| | 2,000 | 1,024 | 2,048 | 4,096 | 8,192 |
| | 3,200 | 1,638 | 3,277 | 6,554 | 13,107 |

TABLE 2

I/O Pad Pitch as a function of Die Area and I/O Count

| | | I/O Count (# of data bus lines) Microns | | | |
|---|---|---|---|---|---|
| | | 4,096 | 8,192 | 16,384 | 32,768 |
| Die | 10 | 156 | 110 | 78 | 55 |
| Area | 15 | 234 | 166 | 117 | 83 |
| Edge | 20 | 313 | 221 | 156 | 110 |
| mm | 25 | 391 | 276 | 195 | 138 |
| | 30 | 469 | 331 | 234 | 166 |

TFTs have been discussed for use in 3D devices by Or-Bach in U.S. Patent Application 2013/0193488. Or-Bach teaches [in paragraph 455] that TFTs for 3D devices are limited by performance whereas he does not teach that the performance can be enhanced by enabling wide I/O as taught in the invention disclosed herein. Or-Bach makes reference [paragraph 181] to improved TFTs and the possibilities of higher performance for the programming circuitry of FPGAs, but makes no suggestion whatsoever of utilizing improved performance TFTs in I/O circuits. Furthermore, Or-Bach teaches stacking of die whereby the invention described herein describes monolithic fabrication of TFTs on a single substrate—such as above the substrate where conventional crystalline silicon circuitry resides.

Figure 33A:
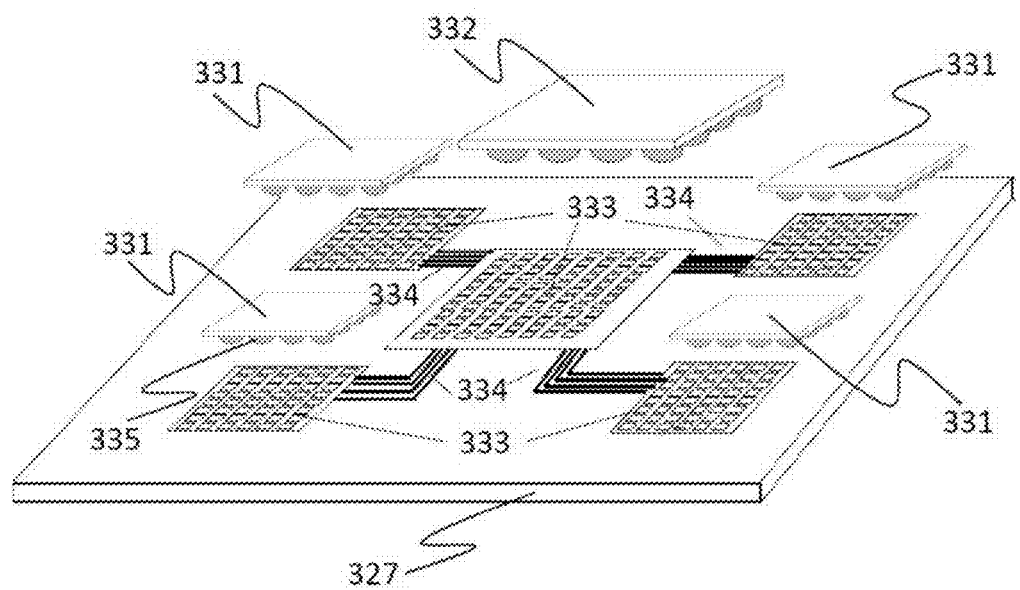
FIG. 33A is a diagram of TFT-based I/O circuitry on a first substrate for core memory and processor circuitry residing on a second substrate in accordance with an embodiment of the present invention

The I/O circuitry of chips may actually be fabricated off-chip, yet provide the functionality of I/O for the chip. FIG. 33A shows a substrate (330) which may be a printed circuit board (PCB), glass substrate, quartz substrate, silicon substrate or other suitable substrate that can be used for fabrication of TFT-based I/O circuitry (333) and related metal line interconnects or bus lines (334). There are various standards for I/O. In order to increase performance, the DDR4 standard has strict requirements for the metal line interconnects between integrated circuits (chips). These requirements must be strictly adhered to by the I/O designer and PCB designer which normally are two different persons. It would be advantageous to combine the two design efforts—I/O circuitry (333) and metal line interconnects (334)—into a single verified design and component. Isolating the I/O circuitry from the core circuitry would reduce the likelihood of additional design cycles and related costs. Design of the I/O circuitry is a significant portion of overall chip design. When the I/O is fabricated off-chip and tied to a known circuit board dimension, the amount of design work required for the I/O circuitry is reduced and the performance of the I/O can be enhanced.

The chips to be mounted (via DCA) on the PCB or other processed substrate may include for example a microprocessor (332) and several memory chips (331). The chips may have I/O circuitry embedded, but a substantial amount of the I/O circuitry (333) is not present on the chip but rather will be interconnected via solder bumps or other technique. One advantage of decoupling the fabrication of I/O circuitry from on-chip to off-chip is that thermal dissipation may be improved since larger metal vias may be connected to the TFTs of the I/O circuitry. The interconnects (334) between chips are metal lines—also referred to as bus lines—fabricated if needed on several layers of the PCB or several layers of metallization if the substrate is glass, quartz, silicon or other. Further, this approach opens up a business model whereby Outsourced Semiconductor Assembly and Test (OSAT) firms may elect to move up the food chain and offer I/O circuitry fabrication services to their chip customers or flat panel producers may elect to leverage their TFT expertise to enter new markets.

The following figures illustrate the wide variety of products and components that may be fabricated with TFTs to enable high density, high speed, low cost non-volatile memory related products:

To be clear, when "TFT for Memory" is used in certain figures for abbreviation (FIG. 46A through FIG. 46H), or elsewhere, "TFT for Memory" means the TFTs for operation of the memory array including but not limited to the transistors for the drivers, decoder logic, sense circuits and bandgap circuits. Furthermore, "Medium Speed" and "High Speed" are general descriptions to indicate that if Wide I/O is not implemented on a connected chip to memory such as a microprocessor, then the module including that microprocessor will be "medium" speed and if Wide I/O is implemented on the microprocessor or cache memory is utilized as described herein (FIG. 21A), then the module including that microprocessor is "high" speed. These are just general descriptions and shall not limit the implementation of the invention described herein. Further, 'core circuitry' shall mean in the case of memory, the substantial portion of the circuitry which enables operation of the device, including but not limited to, the memory array and transistors related to drivers, decoder logic, sensing and bandgap circuits, excluding I/O circuitry. For microprocessors or other chips 'core circuitry' shall mean the substantial portion of the circuitry which comprises and enables operation of the device (e.g., logic) excluding I/O circuitry. The term 'resides' or 'residing' on a substrate when referring to for example, core circuitry residing on a substrate, shall mean that the core circuitry was fabricated on such substrate in a monolithic and not die attached or connected to such substrate by other means.

Figure 38:
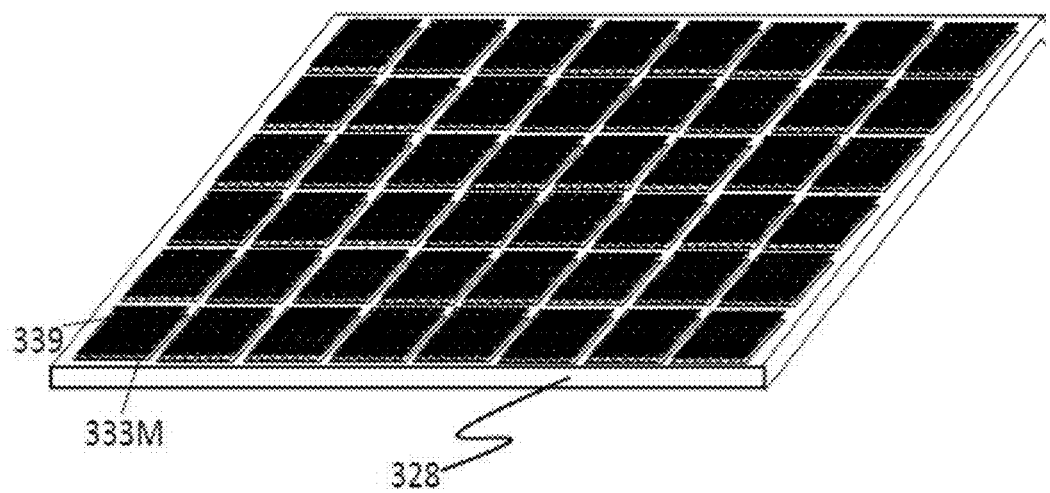
FIG. 38 is a diagram of TFT-based I/O circuitry and TFTs for memory drivers, decoder logic, sense circuits and bandgap logic on a second substrate
Figure 41A:
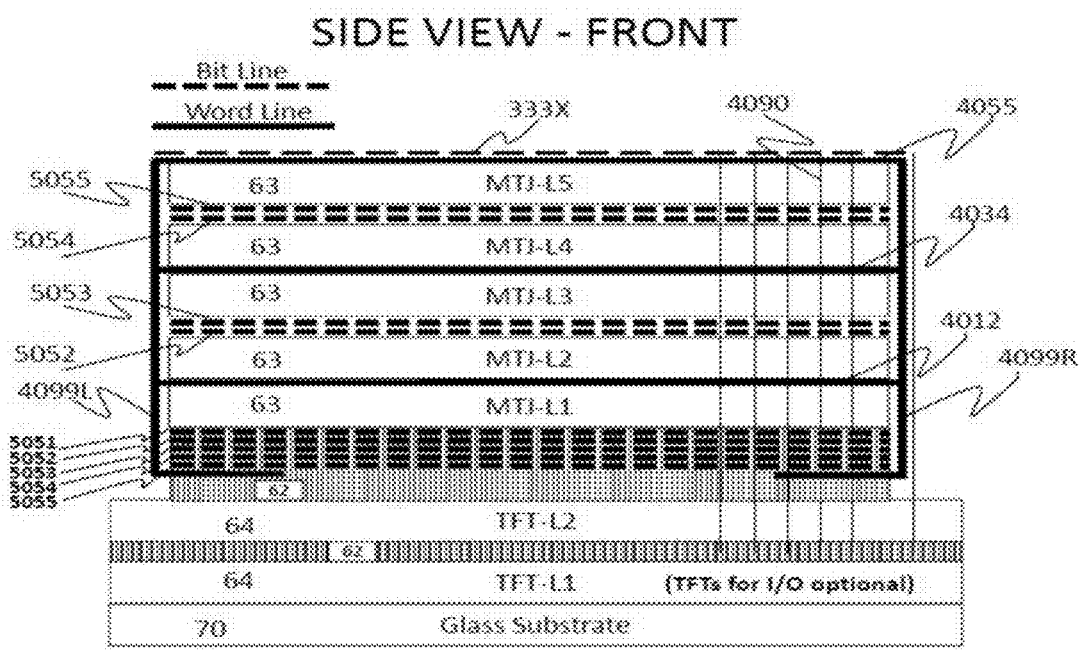
FIG. 41A is a cross section side view (front) of a 3D non-volatile crosspoint memory device in accordance with an embodiment of the present invention
Figure 41B:
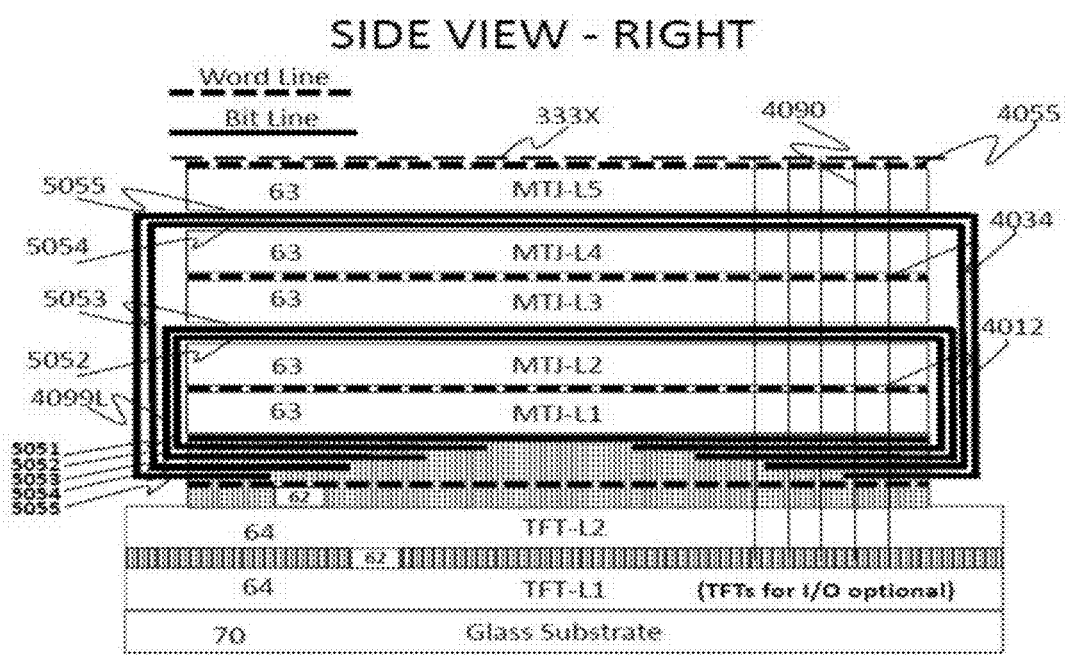
FIG. 41B is a cross section side view (right) of a 3D non-volatile crosspoint memory device in accordance with an embodiment of the present invention
Figure 41C:
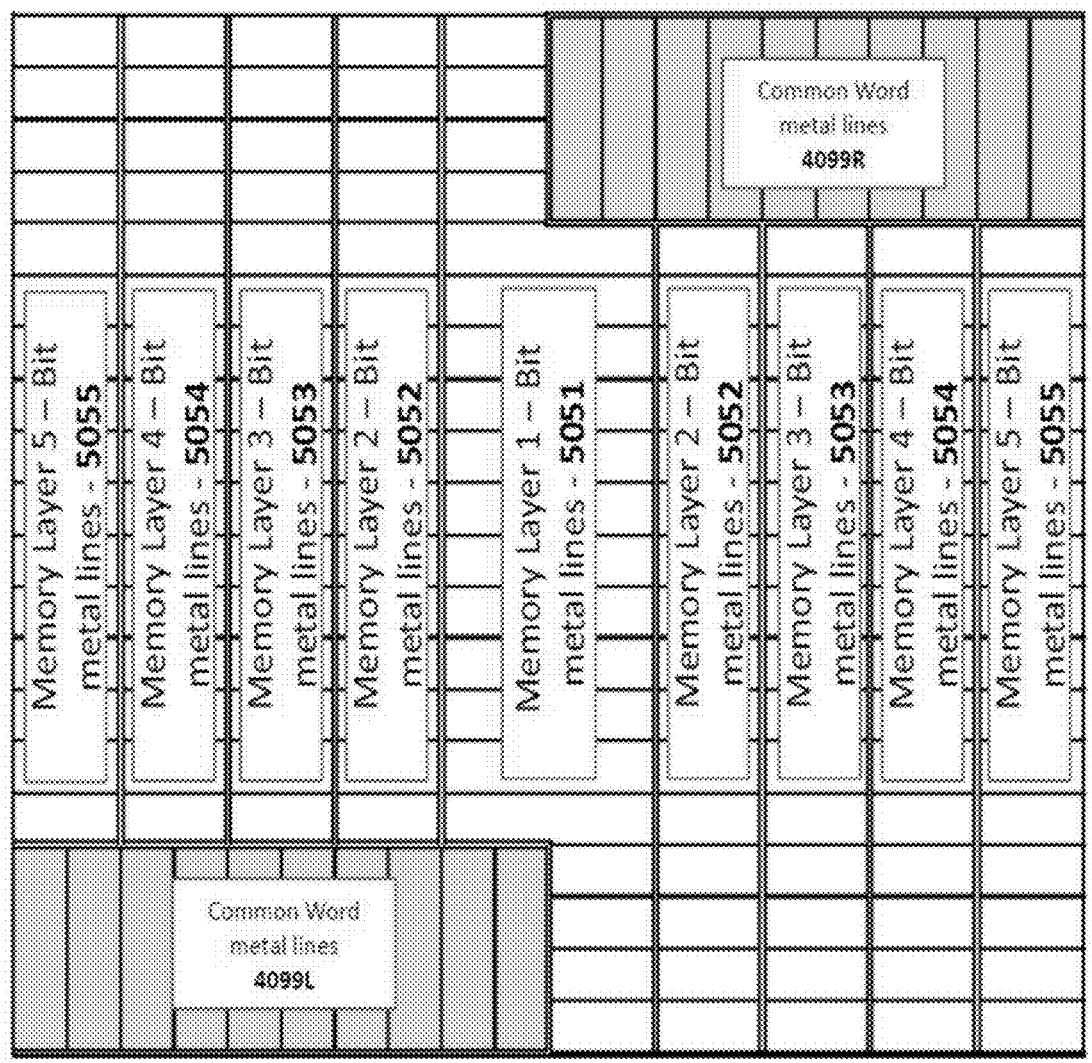
FIG. 41C is an illustration of an example of a design of the interconnect areas of TFTs for word and bit lines of a 3D non-volatile crosspoint memory device in close proximity to and facing the TFT layers in accordance with an embodiment of the present invention
Figure 41D:
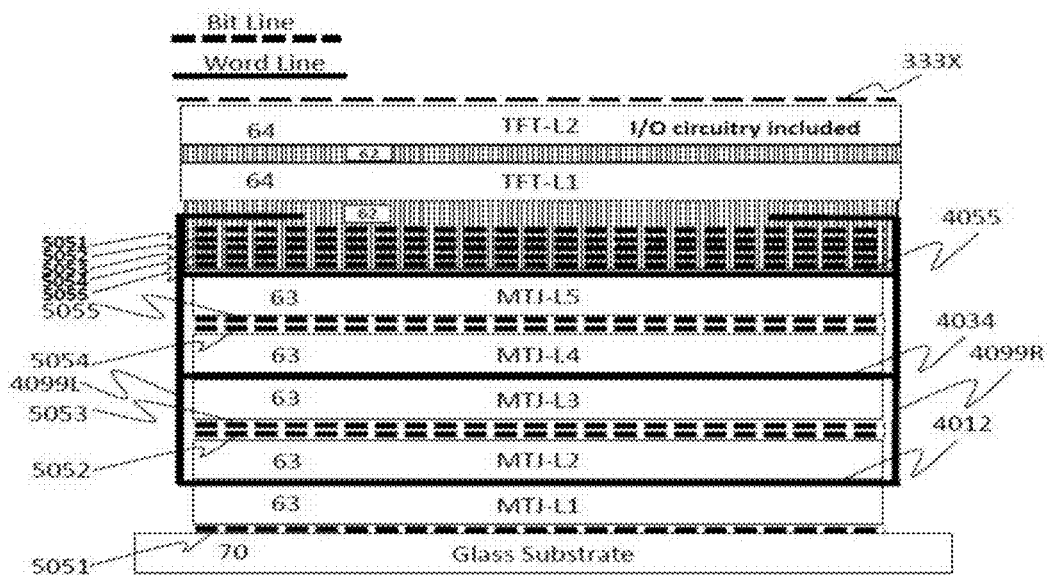
FIG. 41D is a cross section side view (front) of a 3D non-volatile crosspoint memory device in accordance with an embodiment of the present invention
Figure 41E:
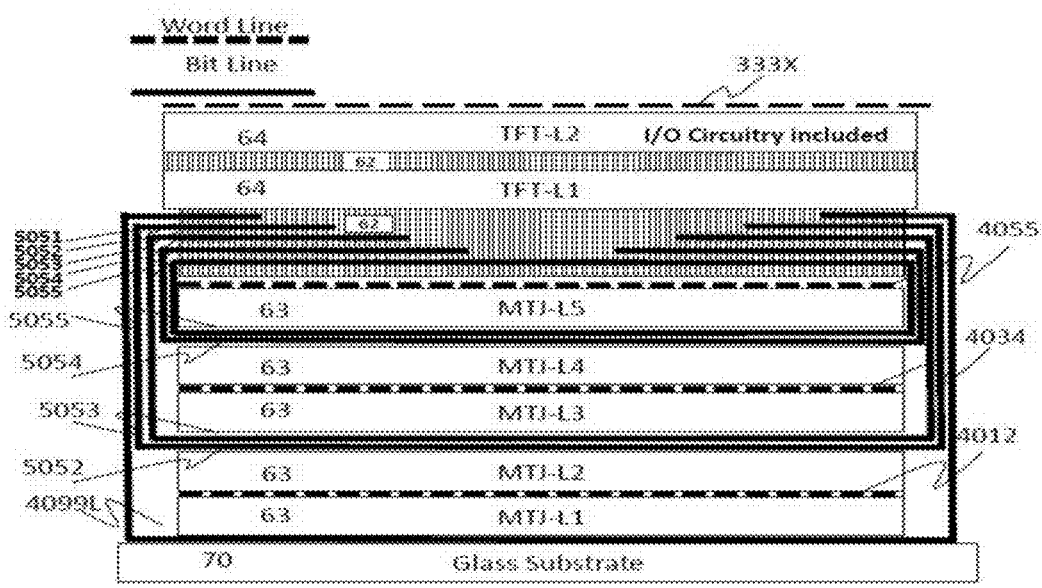
FIG. 41E is a cross section view (right) of a 3D non-volatile crosspoint memory device in accordance with an embodiment of the present invention
Figure 45:
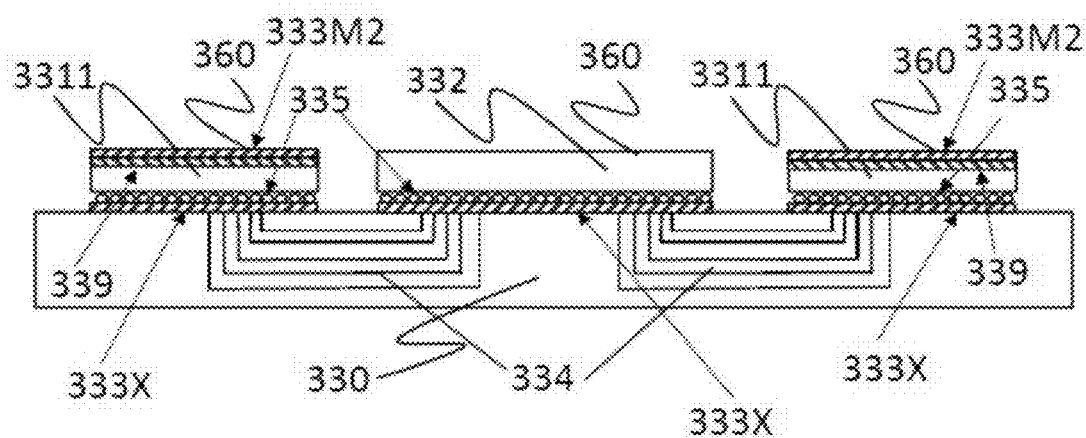
FIG. 45 is a side view cross section of a multilayer (PCB) first substrate with direct chip attachment of memory and processor chips in accordance with an embodiment of the present invention
Figure 46A:
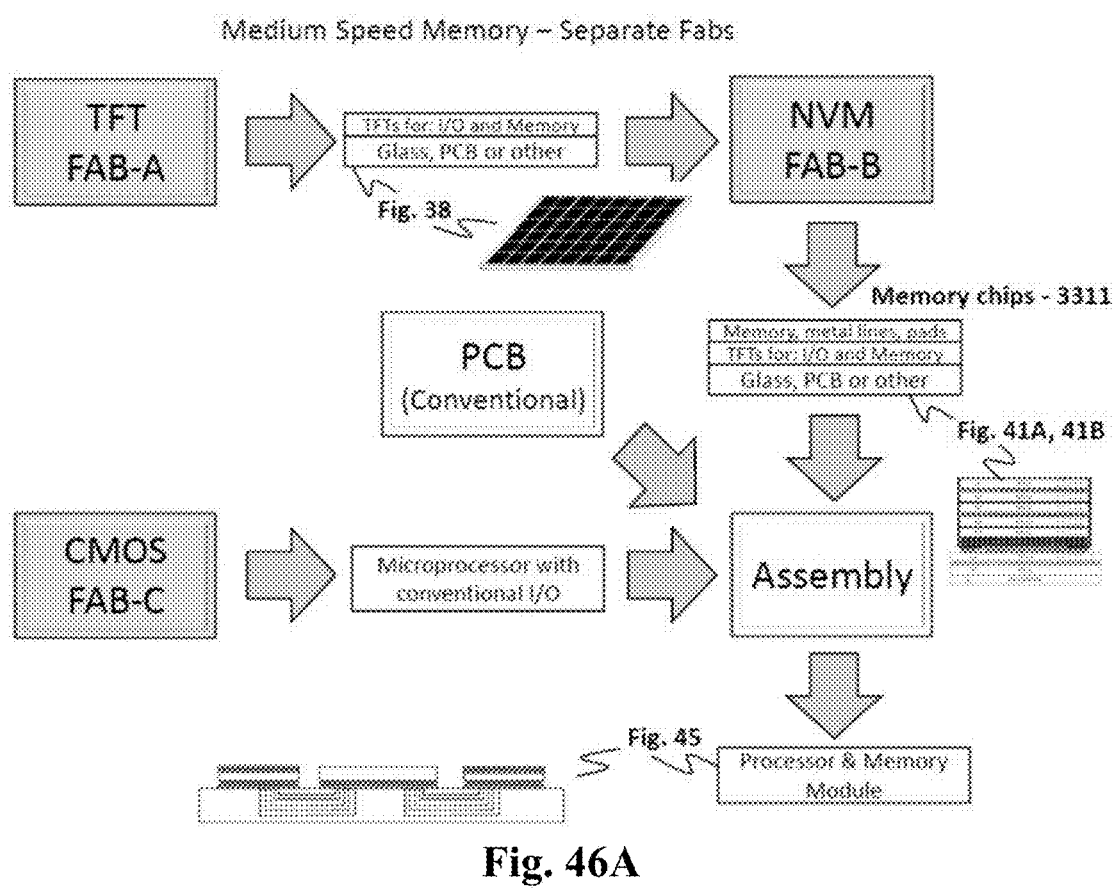
FIG. 46A-46H are illustrations of a wide variety of business models whereby memory chips and memory and processor modules may be fabricated in accordance with embodiments of the present invention
Figure 46B:
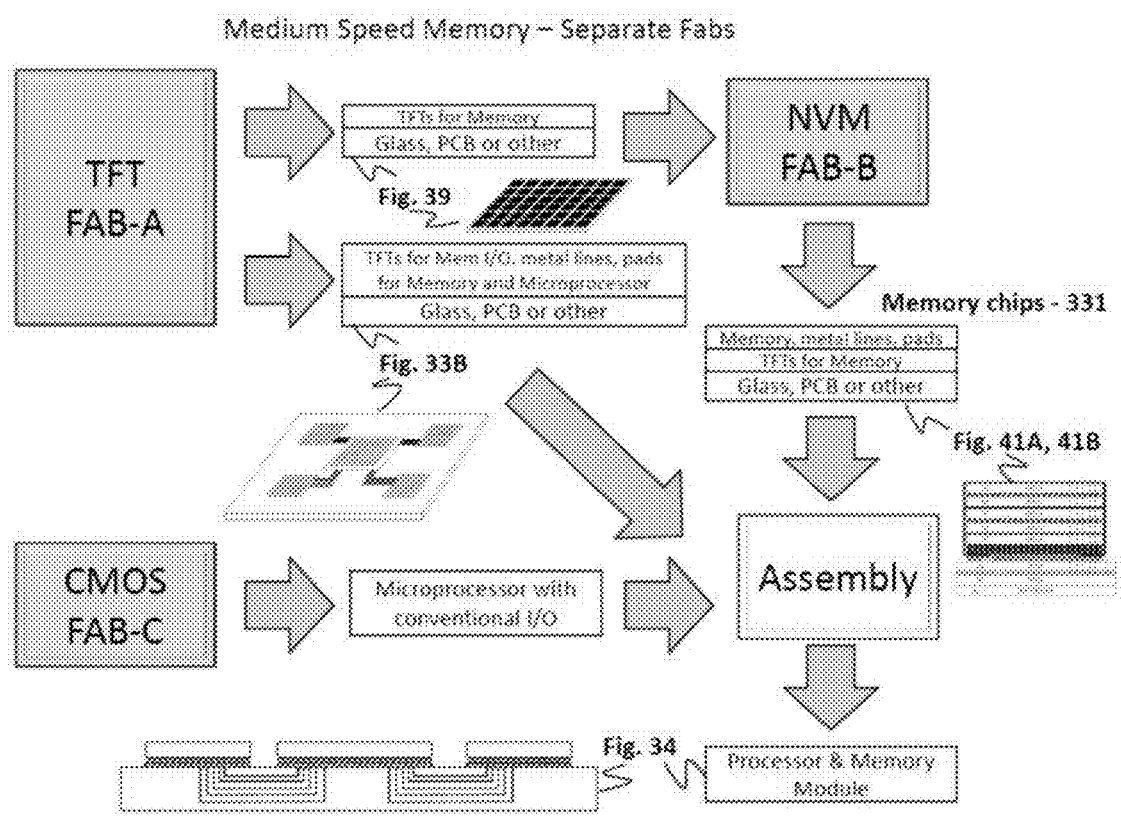
Figure 46C:
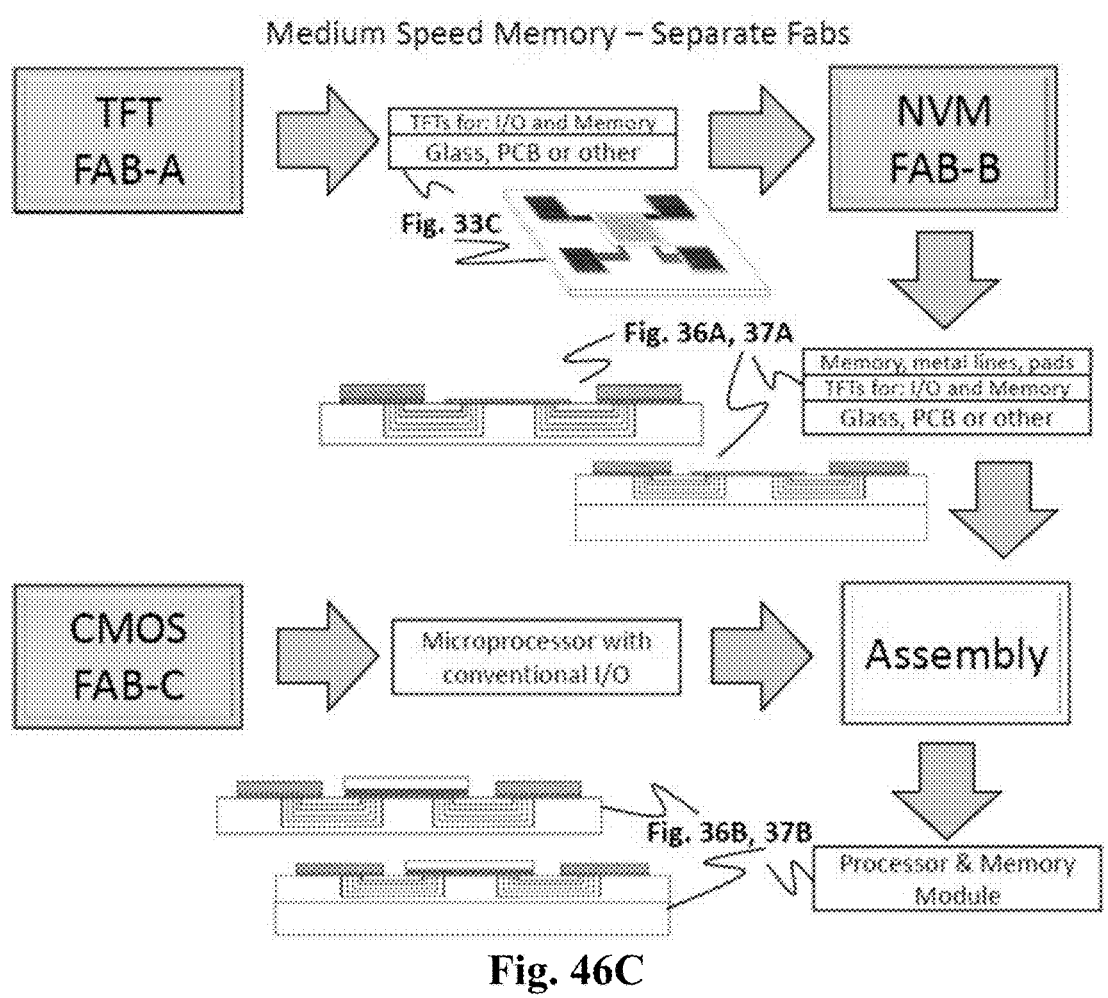
Figure 46D:
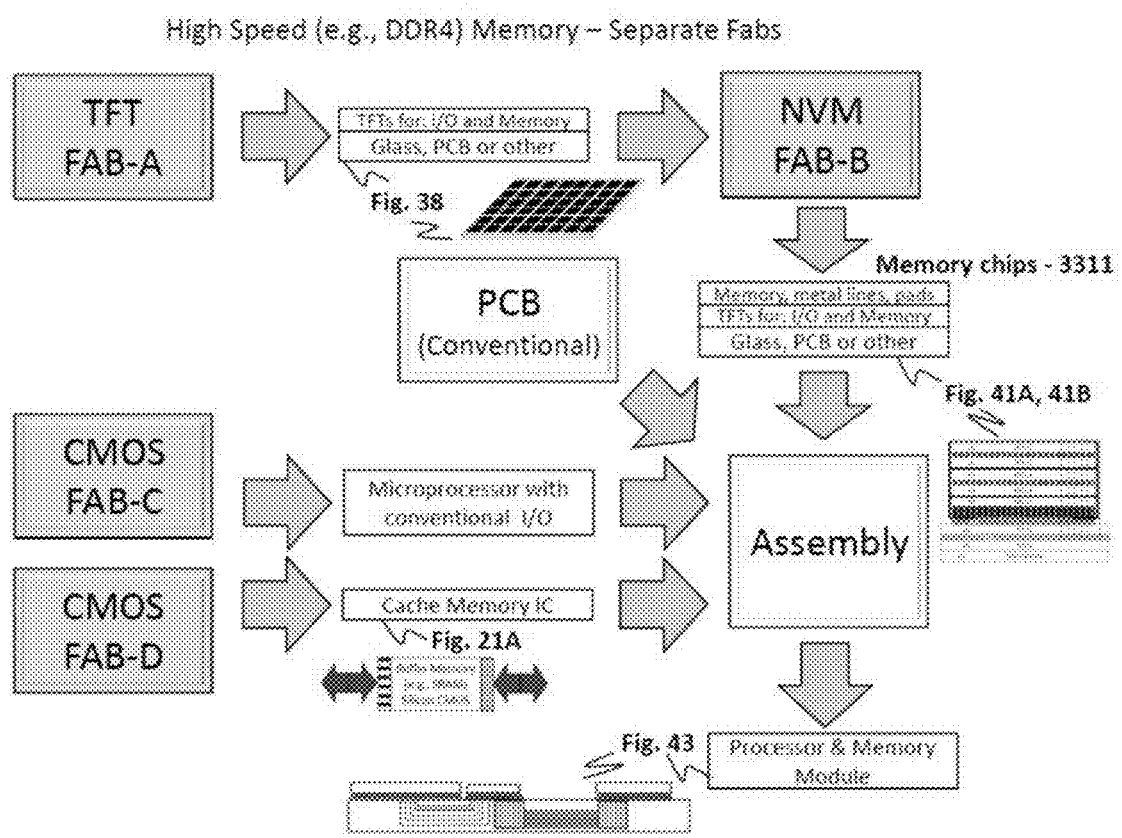

FIG. 38 is a diagram of TFT-based I/O circuitry and TFTs for memory drivers, decoder logic, sense circuits and bandgap logic on a second substrate. This processed substrate may be provided for further processing to a fab dedicated to the non-volatile memory layer processes. The NVM fab would further process the substrate and produce memory chips (3311) in various configurations (such as shown in FIGS. 41A and 41B, for example) and supply to assembly firms for integration into modules such as described in FIG. 45 which shows a side view cross section of a multilayer (PCB) first substrate with direct chip attachment of memory and processor chips in accordance with an embodiment of the present invention. FIG. 46A shows the business model for this case which utilizes conventional PCB and assembly methods for making the modules. If cache memory were employed as discussed herein (FIG. 21A), the module assembled by the firm would be 'high speed' and as that described in FIG. 43—a side view cross section of a multilayer (PCB) first substrate with direct chip attachment of memory, cache memory, and processor chips in accordance with an embodiment of the present invention. FIG. 46D shows the business model for this case.

Figure 46E:
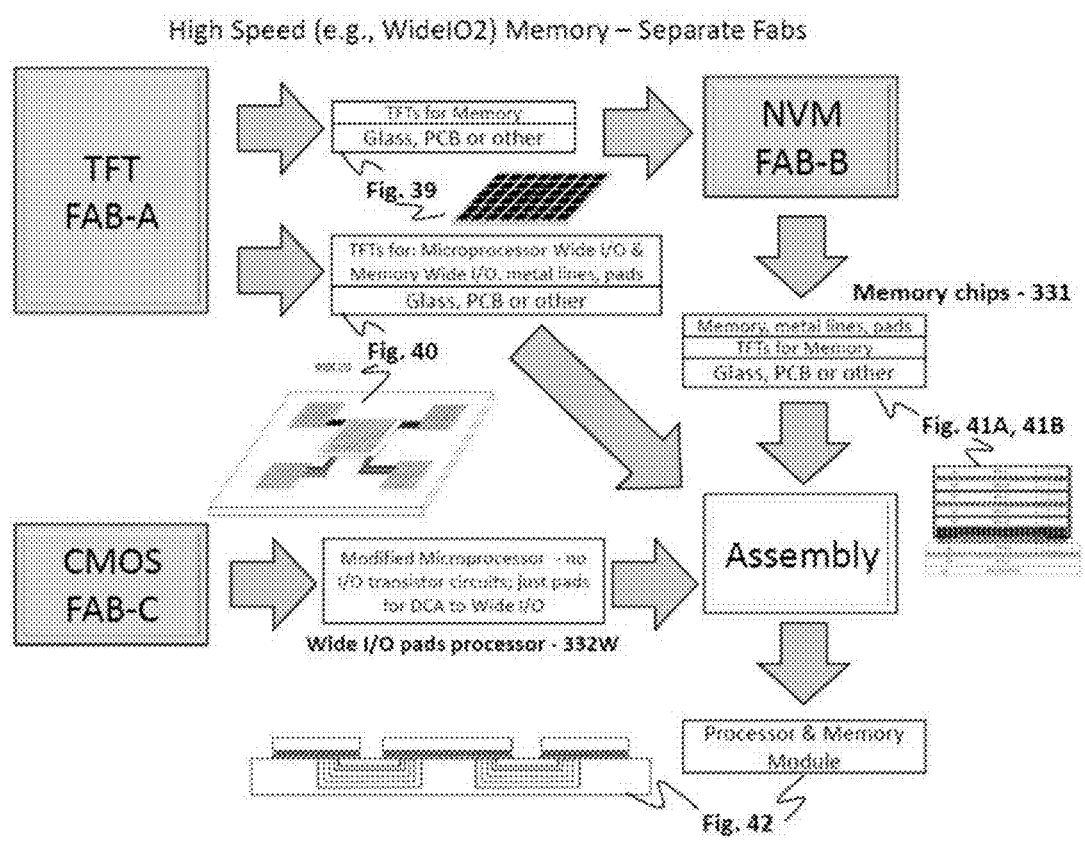
Figure 46F:
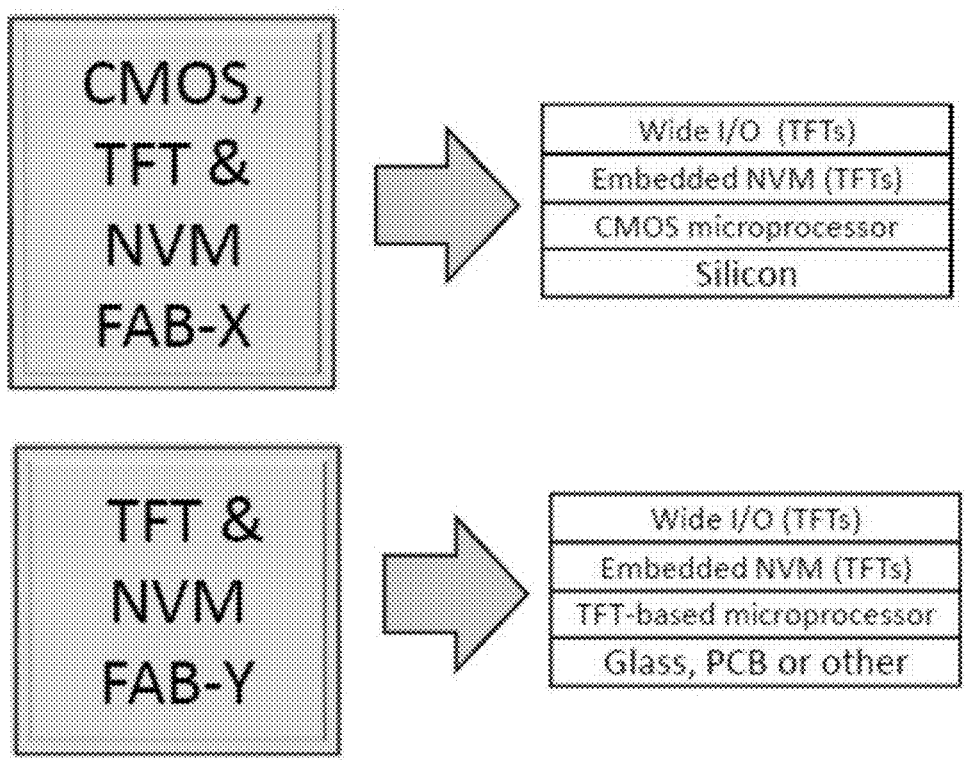
Figure 46G:
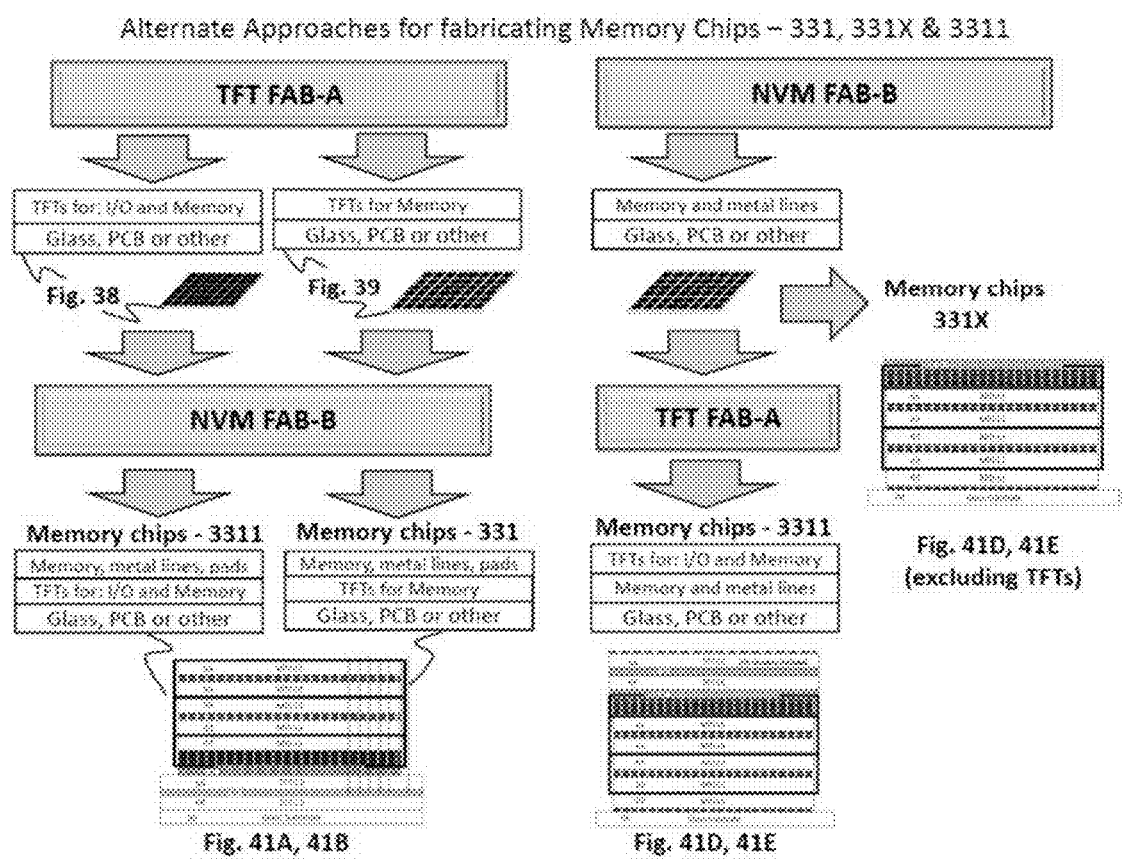
Figure 46H:
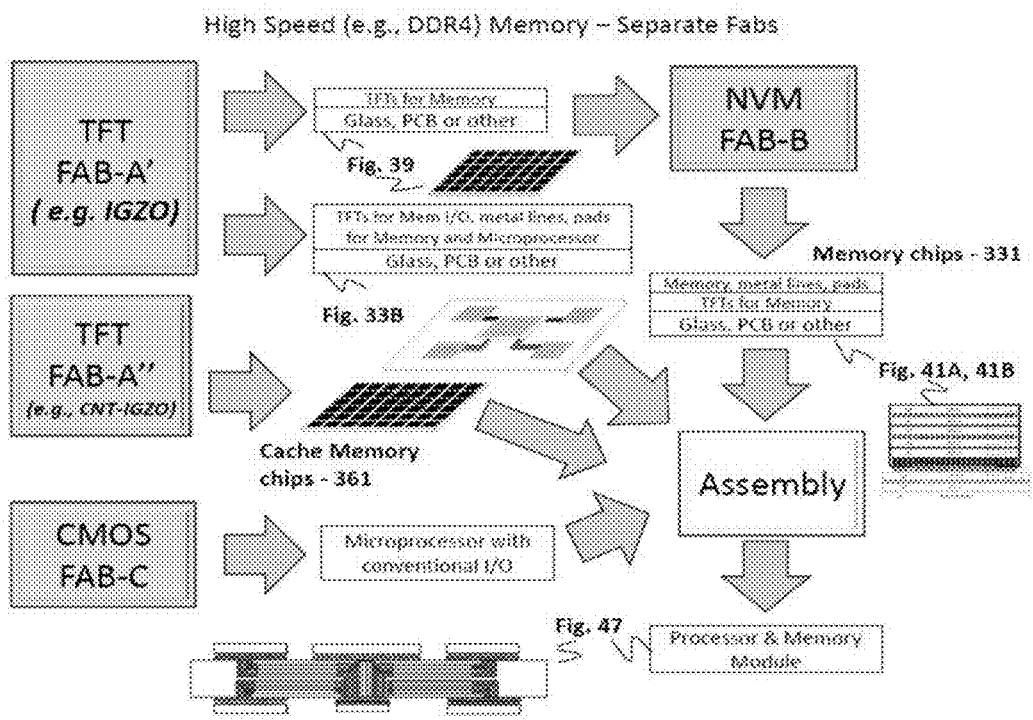
Figure 47:
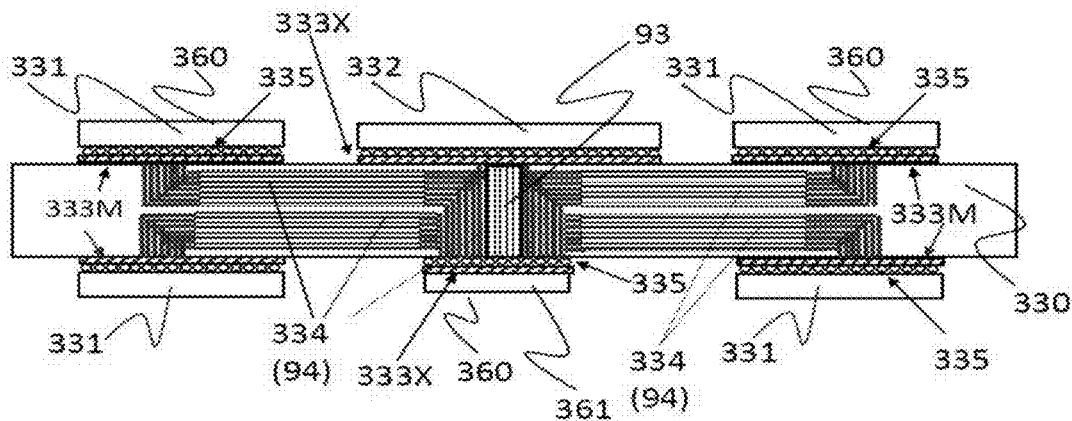
FIG. 47 is a side view cross section of a multilayer (PCB) first substrate with direct chip attachment of memory, cache memory, and processor chips on both sides of the multilayer first substrate in accordance with an embodiment of the present invention.

A cache memory chip (361) may be fabricated from high speed TFTs—e.g., CNT-IGZO, poly-Si, CdSe, or higher mobility AOS TFTs—and hence, the business model shown in FIG. 46H may be employed whereby 'high speed' modules may be assembled as described in FIG. 47—a side view cross section of a multilayer (PCB) first substrate with direct chip attachment of memory, cache memory, and processor chips on both sides of the multilayer first substrate in accordance with an embodiment of the present invention. The double-sided assembly of memory chips (331) and assembly of the cache chip (361) opposite to the microprocessor (332) to the first substrate enables a very efficient routing of the bus lines (93) from the processor (332) to the cache chip (361) and routing of the bus lines (94) from the cache chip (361) to several memory chips (331).

Figure 33B:
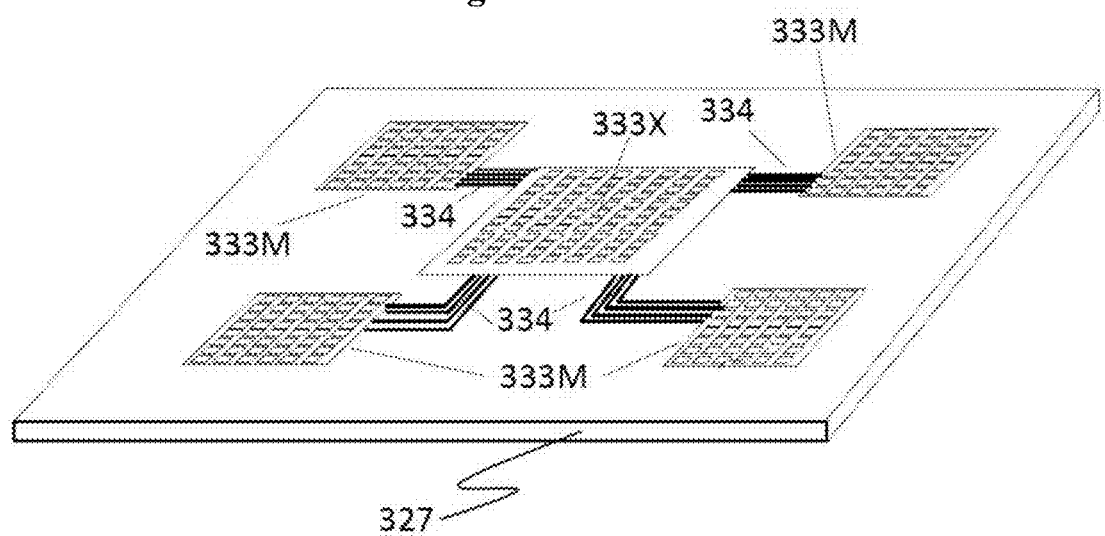
FIG. 33B is a diagram of TFT-based I/O circuitry on a first substrate for core memory and I/O pads only for processor circuitry in accordance with an embodiment of the present invention
Figure 34:
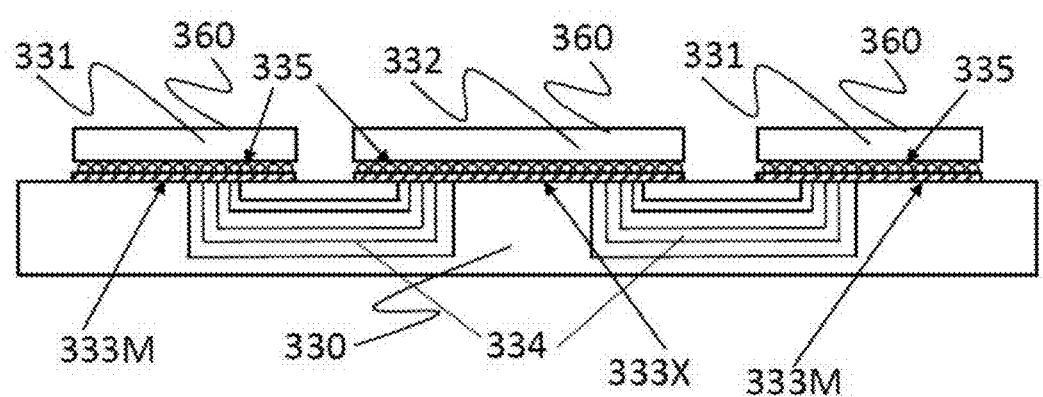
FIG. 34 is a side view cross section of TFT-based I/O circuitry on a multilayer (PCB) first substrate attached to core circuitry memory and microprocessor chips residing on second substrates in accordance with an embodiment of the present invention
Figure 39:
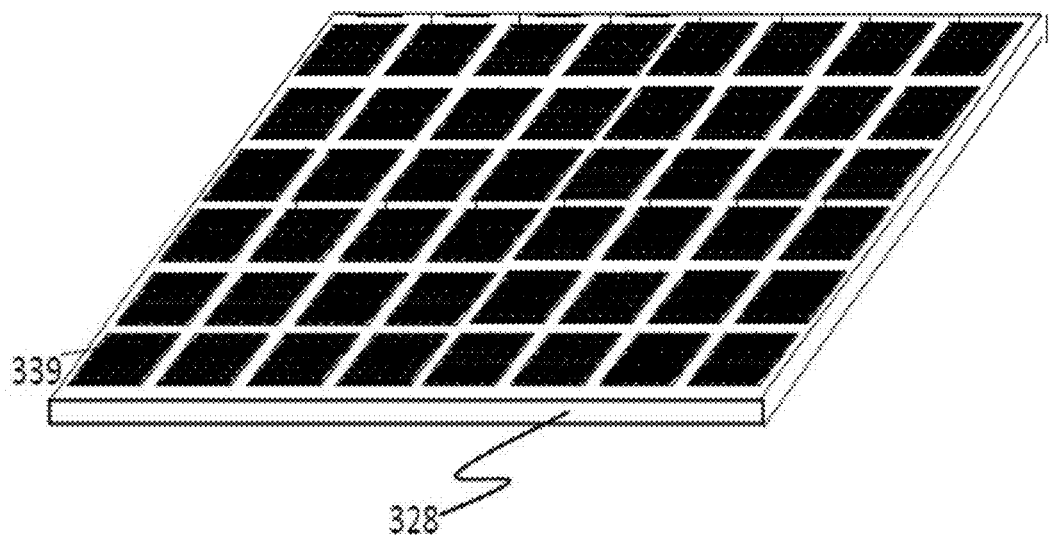
FIG. 39 is a diagram of TFTs for memory drivers, decoder logic, sense circuits and bandgap logic on a second substrate

FIG. 33B is a diagram of TFT-based I/O circuitry on a first substrate for core memory and I/O pads only for processor circuitry in accordance with an embodiment of the present invention. This processed substrate component may be offered as a component to assembly firms which assemble memory and processor modules as shown in FIG. 46B. Another processed component is shown in FIG. 39 which is a diagram of TFTs for memory drivers, decoder logic, sense circuits and bandgap logic on a second substrate. This processed substrate is supplied for further processing to a fab dedicated to the non-volatile memory layers. Memory chips (331) in various configurations (such as shown in FIGS. 41A and 41B, for example) may then be supplied to the assembly firm for module assembly. The assembly firm may assemble a module as shown in FIG. 34 which is a side view cross section of TFT-based I/O circuitry on a multilayer (PCB) first substrate attached to core circuitry memory and microprocessor chips residing on second substrates in accordance with an embodiment of the present invention.

Figure 40:
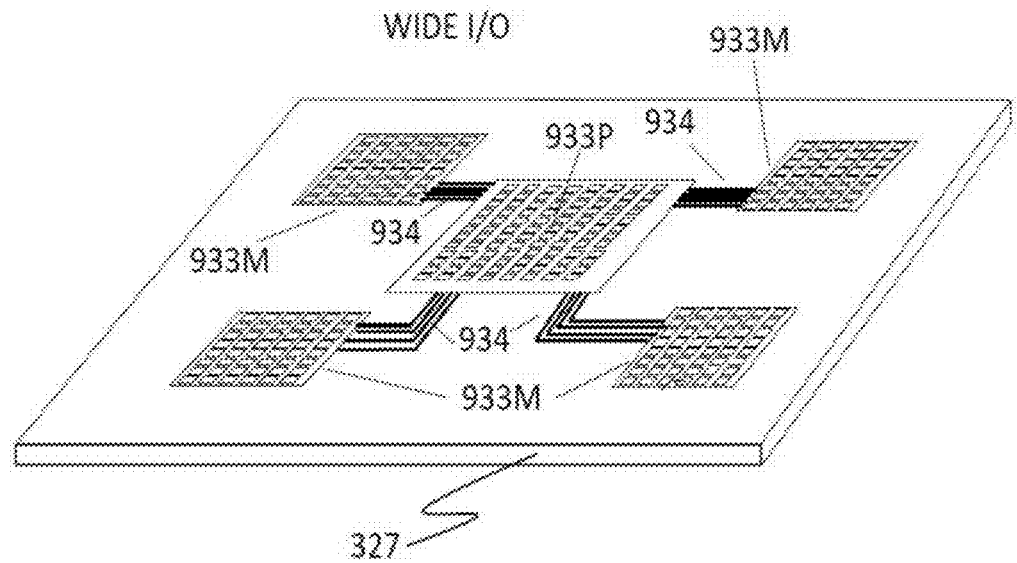
FIG. 40 is a diagram of TFT-based Wide I/O circuitry on a first substrate for core memory and processor circuitry residing on a second substrate in accordance with an embodiment of the present invention
Figure 42:
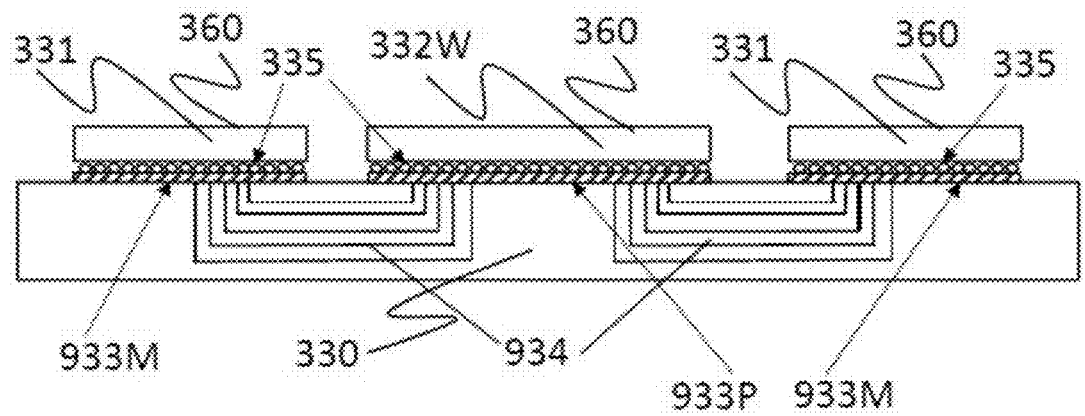
FIG. 42 is a side view cross section of TFT-based Wide I/O circuitry on a first multilayer substrate direct attached to core memory and processor circuitry residing on second substrates

To fully utilize the high speed capabilities enabled by the invention herein with TFT-based Wide I/O, a processed substrate would include TFT-based I/O circuitry not solely for the memory (as in FIG. 33B), but also for the microprocessor as indicated in FIG. 40—a diagram of TFT-based Wide I/O circuitry on a first substrate for core memory and processor circuitry residing on a second substrate in accordance with an embodiment of the present invention. Existing providers of microprocessors would need to modify their chips for the higher I/O capabilities and need not place the I/O circuitry (i.e., transistors) on their chip (332W), just the Wide I/O pads for subsequent attachment via DCA or other methods. This business model is shown on FIG. 46E and the assembled module is shown on FIG. 42—a side view cross section of TFT-based Wide I/O circuitry on a first multilayer substrate direct attached to core memory and processor circuitry residing on second substrates in accordance with an embodiment of the present invention.

Figure 33C:
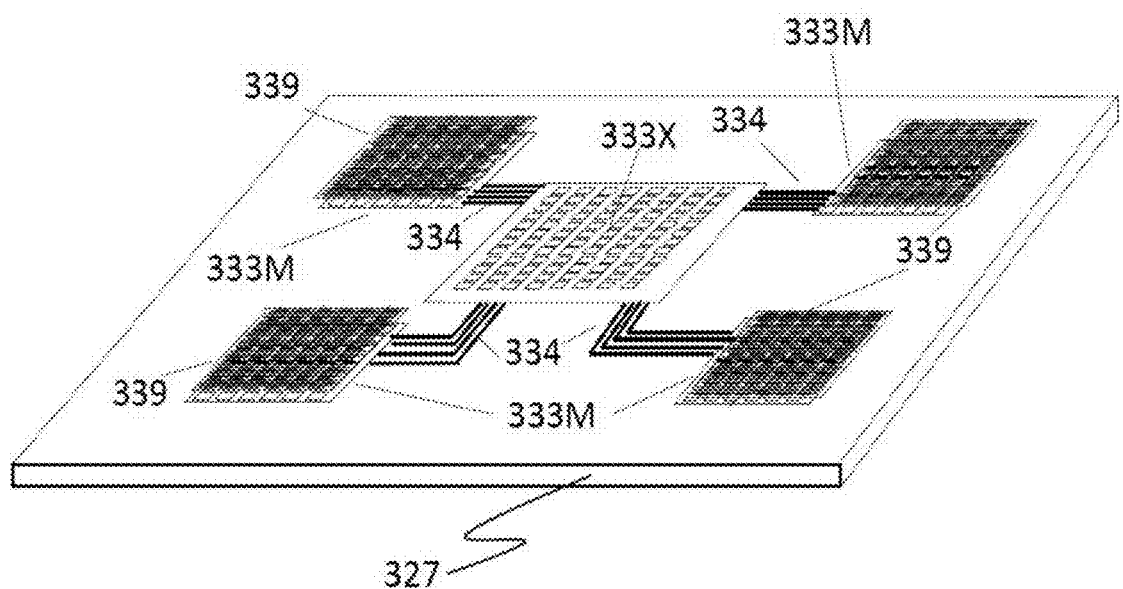
FIG. 33C is a diagram of TFT-based I/O circuitry on a first substrate for core memory, I/O pads only for processor circuitry and TFT circuitry for memory drivers, decoder logic, sense circuits and bandgap circuitry on a first substrate in accordance with an embodiment of the present invention
Figure 36A:
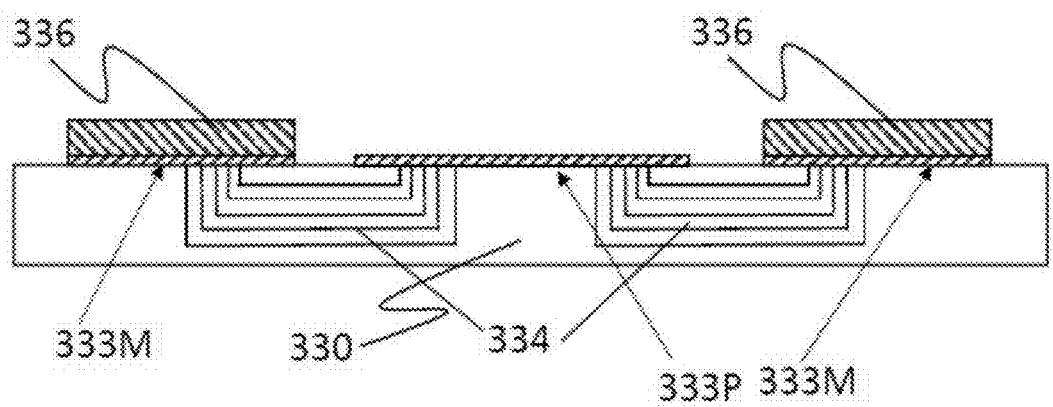
FIG. 36A is a side view cross section of integrated circuits including TFT-based I/O and memory circuitry fabricated on a common multilayer (PCB) first substrate in accordance with an embodiment of the present invention
Figure 36B:
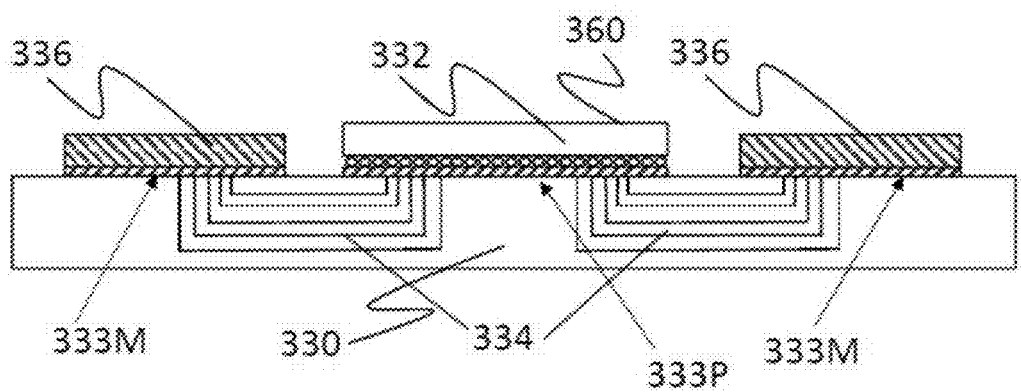
FIG. 36B is a side view cross section of a device according to FIG. 36A with a microprocessor chip on a second substrate direct attached to the TFT-based I/O circuitry fabricated on the multilayer first substrate
Figure 37A:
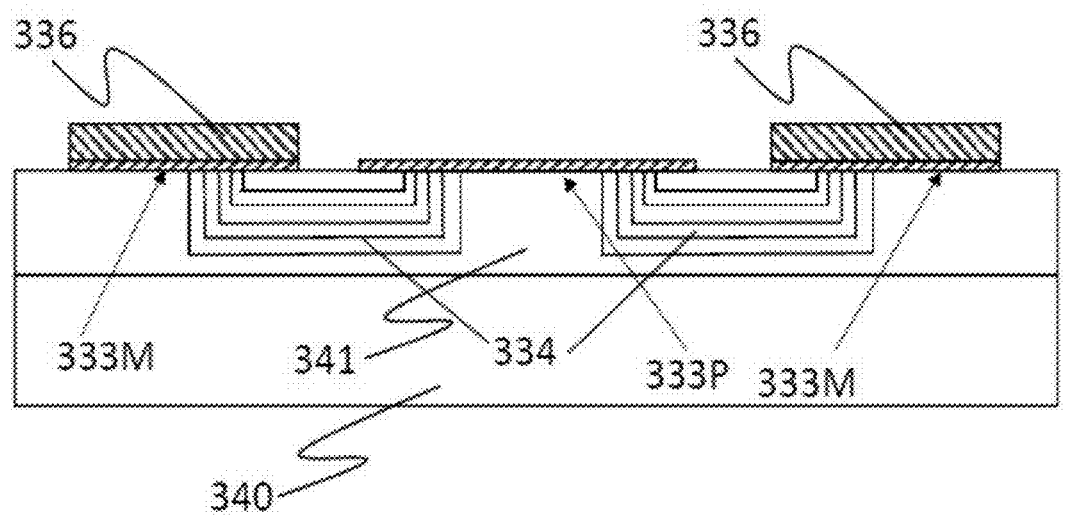
FIG. 37A is a side view cross section of integrated circuits including TFT-based I/O and memory circuitry fabricated on a common glass or other first substrate in accordance with an embodiment of the present invention
Figure 37B:
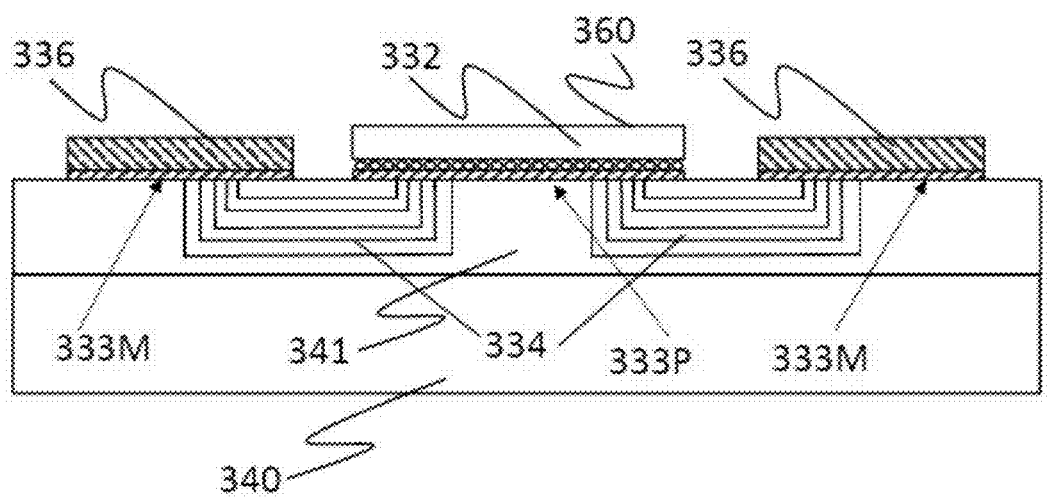
FIG. 37B is a side view cross section of a device according to FIG. 37A with a microprocessor chip on a second substrate direct attached to the TFT-based I/O circuitry fabricated on the glass or other first substrate

Another substrate component would be that described in FIG. 33C which is a diagram of TFT-based I/O circuitry on a first substrate for core memory, I/O pads only for processor circuitry and TFT circuitry for memory drivers, decoder logic, sense circuits and bandgap circuitry on a first substrate in accordance with an embodiment of the present invention. This processed substrate component may be supplied for further processing to a fab dedicated to the non-volatile memory layers as indicated in FIG. 46C. The NVM fab further processes the substrate and may provide the processed substrate to an assembly firm. These processed substrates may be as described in FIG. 36A and FIG. 37A. FIG. 36A is a side view cross section of integrated circuits including TFT-based I/O and memory circuitry fabricated on a common multilayer (PCB) first substrate in accordance with an embodiment of the present invention, and FIG. 37A is a side view cross section of integrated circuits including TFT-based I/O and memory circuitry fabricated on a common glass or other first substrate in accordance with an embodiment of the present invention. The assembly firm may assemble a module as shown in FIG. 36B and FIG. 37B. FIG. 36B is a side view cross section of a device according to FIG. 36A with a microprocessor chip on a second substrate direct attached to the TFT-based I/O circuitry fabricated on the multilayer first substrate and FIG. 37B is a side view cross section of a device according to FIG. 37A with a microprocessor chip on a second substrate direct attached to the TFT-based I/O circuitry fabricated on the glass or other first substrate.

FIG. 41A through FIG. 41E illustrate for example how a five (5) layer memory chip may be fabricated—either with TFTs nearest the substrate first surface (FIG. 41A, 41B) for later stacking of memory layers on top or with the memory layers on the substrate first surface (FIG. 41D, 41E), for later stacking of TFT layers on top.

FIG. 46G illustrates the alternate approaches which may be taken in fabrication of memory chips (3311, 331, and 331X) by the cooperation of a TFT Fab-A with NVM Fab-B.

The following ten (10) references are all hereby incorporated herein by reference in their entirety. The references represent an example of the many developments in high mobility amorphous oxide TFTs which are the preferred TFTs to be implemented with the invention described herein. 1—Amorphous ZTO/ITO Stacked-Channel TFTs with Field Effect Mobility over 50 cm$^2$/Vs and Resistant to Channel Thickness Dispersion, Wakana, Kawamura, Fujii, Uchiyama, and Hatano, SID 2010 Digest, ISSN 0097-966X/10/4103-1287, 2—High Performance a-IGZO TFT with Nano-Dots Doping, Zan, Tsai, Chen, Tsai, and Meng, SID 2011 Digest, ISSN 0097-966X/11/4201-0028, 3—High Mobility Oxide TFTs for Future LCD Applications, Song, Lim, Ahn, Lee, SID 2013 Digest, ISSN 0097-966X/13/4401-0093, 4—High Speed a-IGZO TFT-based Gate Driver by using Back Channel Etched Structure, Ulm, Mativenga, Geng, Li and Jang, SID 2014 Digest, ISSN 0097-966X/14/4503-0968, 5—High-Speed Shift Register for High Resolution AMD with Self-aligned Coplanar a-IGZO TFTs, Geng, Kang, Seok, Mativenga and Jang, SID 2012 Digest, ISSN 0097-966X/12/4301-0008, 6—Improving Switching Characteristics of Amorphous-InGaZnO$_4$, Thin-Film Transistors by Dual-Gate Driving, Mativenga, Geng, Um, Seok, Kang, Jang, Mruthyunjaya, Heiler and Tredwell, SID 2013 Digest, ISSN 0097-966X/13/4403-1062, 7—High-Performance a-IGZO Thin-Film Transistor Using Ta2O5 Gate Dielectric, Chiu, Chang, and Chang, IEEE ELECTRON DEVICE LETTERS, VOL. 31, NO. 11, November 2010, 8—Oxide TFT with Multilayer Gate Insulator for Backplane of AMO-LED Device, Lee, Kyung, Sung, D. Y. Kim, Kang, S J Kim, C N Kim, H G Kim and S T Kim, Journal of the SID 16/2, 2008, 9—Oxide-TFT Technologies for Next-Generation AMOLED Displays, Arai, Journal of the SID 20/3, 2012, 10—A Novel Self-Aligned Top-Gate Oxide TFT for AM-OLED Displays, Morosawa, Ohshima, Morooka, Arai and Sasaoka, SID 2011 Digest, ISSN 0097-966X/11/4201-0479.

Thermal Management

One of the major concerns of any high performance high density integrated circuit is power and heat management. Many devices and methods such as metal heat sinks or even liquid nitrogen flowing over the chip are utilized to remove the heat generated by the chip. When TFTs are utilized thermal management will still be a concern. However, according to the embodiments of the present invention, and the way TFTs are employed in 3D integrated circuits, better thermal management is enabled. For example, in a semiconductor design, most of the heat is generated on the silicon surface. Most of the heat is removed either through the back side of the wafer or through the limited number of I/O pins. In the embodiments described herein of the present invention, heat may still be removed through the back side of the substrate. In contrast to conventional CMOS chips, the embodiments herein describe chips in which there are multiple layers of TFT circuitry and metal line conductors which provides an architecture to allow heat sinks between layers of circuitry where the heat is generated. Hence, a separation of heat generation sources provides for easier thermal management. In particular, the high density I/O enabled by the present invention provides more power I/O pins for heat removal. These power I/O pins may easily be distributed among the several layers of TFT circuitry as described in the present invention.

Microdisplay

The ability to fabricate TFTs in 3D enables the fabrication of microdisplays above the core circuitry of an integrated circuit. Such microdisplays may be of a variety of technologies, including but not limited to: 1) liquid crystal on reflective backing, 2) emissive light emitting (OLED, LED, EL), 3) electrophoretic, 4) MEMS-based displays (reflective mirrors, micro-shutters) and 5) bi-stable displays such as cholesteric LCD. Microdisplays are components used in head-mounted wearable display products such as Google Glass™, (Google, Inc.), Occulus Rift (Facebook), and many others for wearable computing and augmented reality applications. The military has also used microdisplays in head-mounted display applications used by pilots of fighter jets. Microdisplays also are used in so-called pico-projectors which enable projection displays in a portable (pocket size) product. Pico-projectors are now also found embedded in notebook PCs, tablets, and smartphones. As resolutions of these displays continue to increase, the necessary data rate requirements will increase. Power reduction and increased system on chip features will be desirable. Hence, the advantages of using TFTs in 3D integrated circuit devices lends itself well to fabrication of microdisplays on a System on Chip (SoC) device.

A preferred display technology for microdisplays is organic light emitting diode (OLED) given its pixel power on demand feature, no light loss due to polarization elements, and high efficient production of red, green and blue light.

Figure 31:
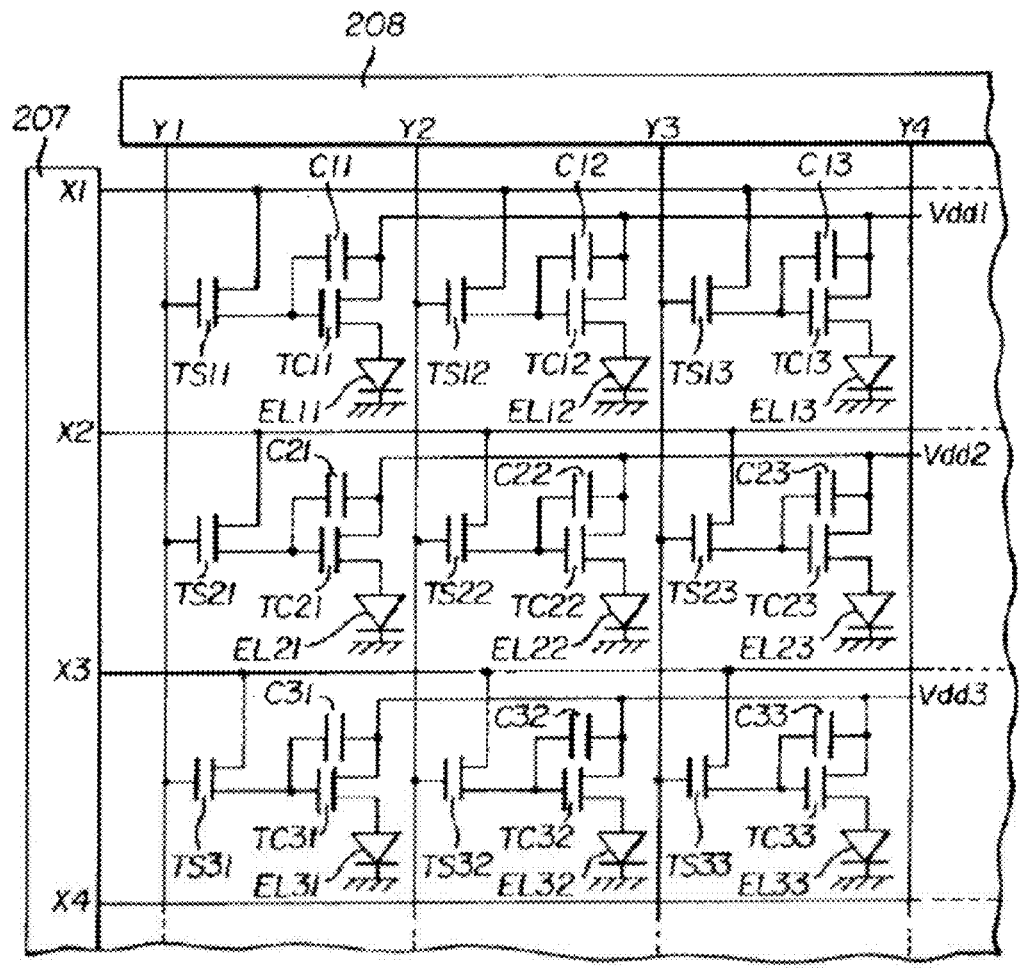
FIG. 31 is an active matrix circuit for an OLED display in accordance with the prior art

An additional benefit of using TFTs is that multiple layers of displays may be fabricated. U.S. Pat. No. 6,872,472 (Liao et. al.) describes a stacked OLED display and is incorporated herein in its entirety by reference. FIG. 31 shows an active matrix 2T/1C pixel circuit for driving a single layer of an OLED microdisplay.

Figure 32A:
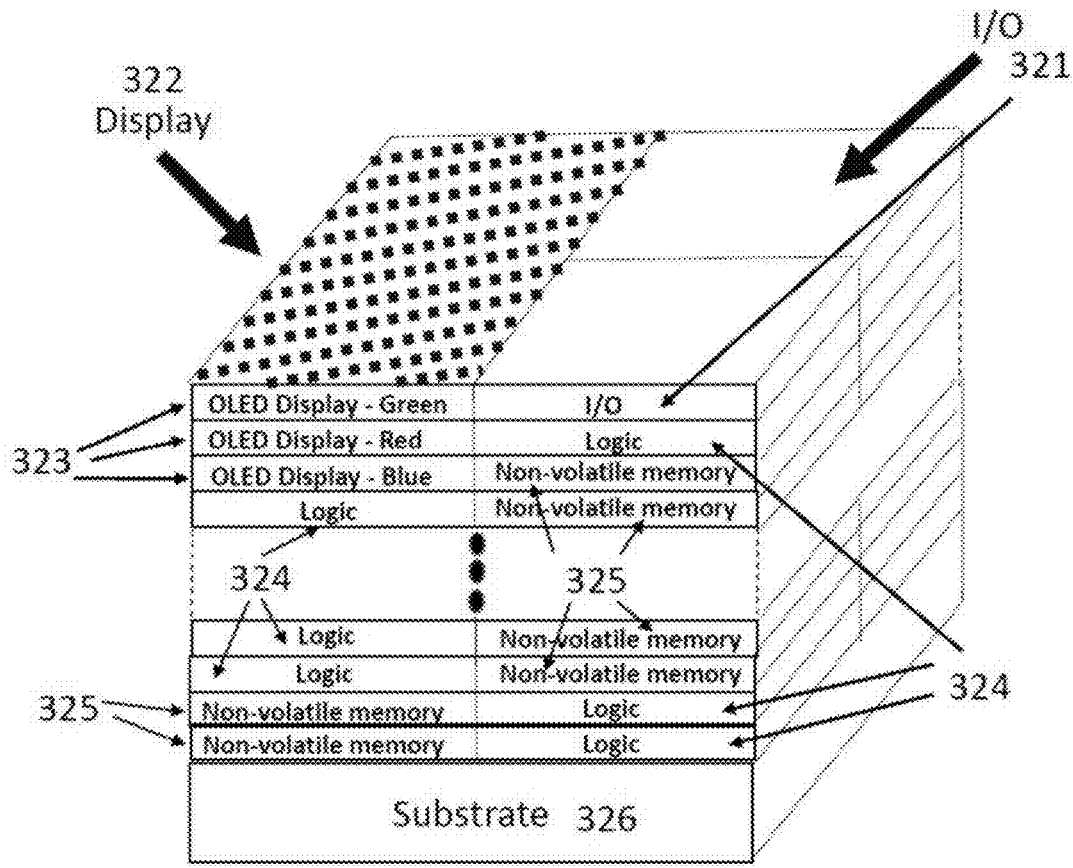
FIG. 32A and FIG. 32B illustrate a 3D chip with embedded logic, memory, display and I/O made in accordance with an embodiment of the present invention
Figure 32B:
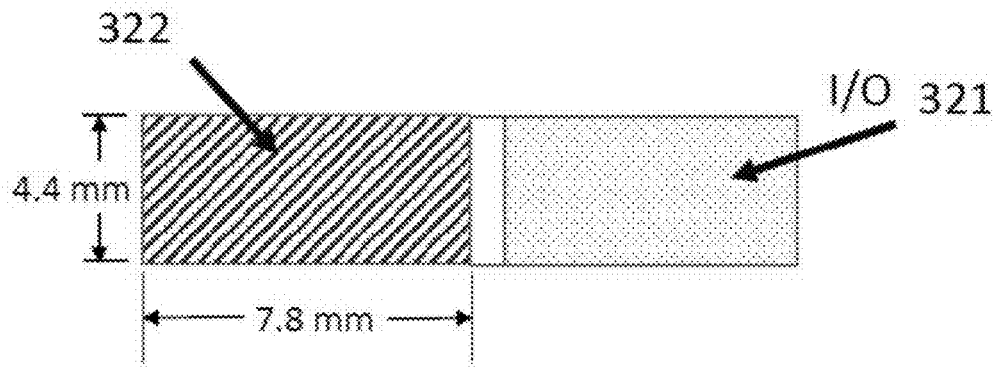

By utilizing the principles of the invention described herein, an integrated circuit (IC) may be fabricated either on a glass substrate or silicon substrate, with conventional CMOS or TFT circuitry on the base layer above the substrate, and one or more TFT layers above the base layer circuitry to provide for additional logic, memory, drive electronics and IO to improve overall performance. FIG. 32a illustrates an example of such an IC in which multiple layers of non-volatile memory (325) and logic circuitry (324)—which could be a microprocessor—reside over a substrate (326); on the most upper level(s) of the device a microdisplay (322) is formed on a portion of the top layer(s) adjacent to the I/O circuitry (321). FIG. 32b illustrates an arrangement whereby a high definition display (322) with 1920× 1080 pixels at 4 micron pixel pitch would occupy just 4.4 mm×7.8 mm of die area. I/O circuitry (321) would be adjacent to the display area. This configuration shown in FIG. 32b allows for a very compact microdisplay embedded on a microprocessor with memory for wearable devices such as Google Glass™ promoted by Google Inc. Those skilled in the art recognize that although the device in FIG. 32 indicates a stacked OLED microdisplay of independent red, green and blue display layers (323), many arrangements may be configured of different display technologies—such as those technologies mentioned above—which do not depart from the spirit and scope of the invention described herein. A single layer display may be fabricated with sub-pixel red, green and blue elements or driven to employ a field sequential color technique. The display may also be configured to employ angular color projection techniques as described in U.S. Pat. No. 8,845,109, Sep. 30, 2014—Wang, and U.S. Pat. No. 5,897,190, Apr. 27, 1999—Takahashi, both of which are incorporated herein in their entirety by reference. The display may be OLED, LCD, MEMS (DMD), LED, reflective, or other technology which may enable display of images. MEMS and reflective displays would require an external light source for illumination and display of an image.

There is wide latitude for the choice of materials and their thicknesses within the embodiments of the present disclosure.

The pinned layer 12 can have a thickness of about 1-100 nm and more specifically of about 3-50 nm and coercivity measured along its easy axis of about 1000 Oe or higher and more specifically of about 2000-5000 Oe. The layer 12 can be made of magnetic material with perpendicular anisotropy such as Co, Fe or Ni-based alloys such as FePt, FePd, CoFeB, FeB, CoFeCrB, CoFeVB or similar, and/or their based multilayers or/and laminates such as CoFe/CoFeTb, CoFeB/CoGd, Fe/TbFe, CoFe/Ta, CoFeB/W, CoFeB/Cr, Co/Pt, Co/Pd, Co/Au, CoFe/Pt, Fe/Pt, Fe/Pd, Ni/Cu or similar.

The free layer 16 can have a thickness of about 1-5 nm and more specifically of about 1.5-2.5 nm and coercivity less than 1000 Oe and more specifically of about 200-500 Oe. The free layer 16 can be made of soft magnetic material with perpendicular anisotropy such as Co, Fe or Ni-based alloys such as CoFeB, FeB, CoFeCrB, CoFeVB, FeCrB, FeVB or similar, and/or multilayers and/or laminates such as CoFeB/(CoFe/Pt), CoFeB/(Co/Pd), CoFe/W, CoFeB/Ta, CoFeB/Cr, Co/Pt, Co/Pd, Co/Au, CoFe/Pt, Fe/Pt, Fe/Pd, Ni/Cu or similar.

The tunnel barrier layer 14 can have a thickness of about 0.5-2.5 nm and more specifically of about 0.8-1.3 nm. The tunnel barrier layer can be made of MgO, $Al_2O_3$, $Ta_2O_5$, $TiO_2$, Mg—MgO, ZrOx and similar materials and/or their based multilayers.

TFTs are widely used in the flat panel display industry; hence, it is well known in the art how to fabricate such transistors with top or bottom gate structures (inverted staggered) and coplanar or staggered TFT structures and hence, the invention is not limited to a particular structure and may be applied in the embodiments described herein without regard to a particular TFT structure. Furthermore, the invention is not limited to and may use either single-gate, dual-gate or other multi-gate TFTs having multiple channel formation regions. A wide range of materials for such transistors will be described, but is not intended to limit the present invention to such materials. Furthermore, much research and development is ongoing in the field of TFTs; in particular, the amorphous oxide TFTs and graphene and CNT based TFTs are emerging to play a large role in the flat panel display and is expected to play a larger role in the semiconductor industry which the invention herein is related to. Many prior art references of the emerging TFTs mentioned have been included in the disclosure herein, but the invention is not to be limited to such TFTs currently available commercially or in development, as many new material sets are expected to be investigated certain to lead to further TFT options to consider using with the invention disclosed herein.

The TFT insulator layer can be made of $SiO_2$, $Al_2O_3$, SiN, and other similar materials and/or their based laminates, or polymer films such as backed photo-resist, polyimide and other similar materials. Thickness of the insulator layer 31 can be in a range from less than 100 nm through 5 μm.

A TFT semiconductor layer can be made of amorphous silicon (a-Si), poly-Si, CdSe and others, or more preferably from a host of amorphous oxide semiconductor (AOS) materials including but not limited to $SnO_2$, $In_2O_3$, CdO, $Cu_2O$, InGaZnO (IGZO), ZnSnO (ZTO), ZnSnO, ZnO, InZnO, $AgSbO_3$, $2CdO.GeO_2$, $2CdO.PbO$, $CdS.In2S_x$, $InGaO_3(ZnO)_m$ (m<=4) and others comprising of Au, Hg, Tl, Pb, As, or Bi. Incorporation of thin film oxide semiconductor transistors in electronic devices are disclosed in the following four references which are hereby incorporated herein in their entirety by reference. (1) Present status of amorphous In—Ga—Zn—O thin-film transistors, Toshio Kamiya, Kenji Nomura and Hideo Hosono, 2010 Sci. Technol. Adv. Mater. 11 044305, (2) Short channel device performance of amorphous InGaZnO thin film Transistor, Sanghun Jeon, Anass Benayad, Seung-Eon Ahn, Sungho Park, Ihun Song, Changjung Kim, and U-In Chung, APPLIED PHYSICS LETTERS 99, 082104 (2011), (3) Nanometer-Scale Oxide Thin Film Transistor with Potential for High-Density Image Sensor Applications, Sanghun Jeon, Sungho Park, Ihun Song, Ji-Hyun Hur, Jaechul Park, Hojung Kim, Sunil Kim, Sangwook Kim, Huaxiang Yin, U-In Chung, Eunha Lee, and Changjung Kim, Applied Materials & Interfaces, Vol. 3, No. 1, 1-6, 2011, and (4) Wager J F et al. An amorphous oxide semiconductor thin-film route to oxide electronics. Curr. Opin. Solid State Mater. Sci. (2013). http://dx.doi.org/10.1016/j.cossms.2013.07.002. A thickness of the semiconductor layer 32 can be in a range from 10 nm through 5000 nm, and more specifically in a range from 50 nm through 200 nm. The preferred AOS TFT for the invention disclosed herein is IGZO; the following references are hereby incorporated herein in their entirety by reference: U.S. Patent Application publication 2014/0021038, Jan. 23, 2014—Kusumi et. al., U.S. Patent Application publication 2014/0273340, Sep. 18, 2014—Van Duren et. al., and U.S.

Patent Application publication 2013/0200365, Aug. 8, 2013—Yamazaki ZTO is another preferred AOS TFT. Other AOS TFTs under development by such firms as CBRITE (see www.cbriteinc.com and U.S. patent publication 20140001462, Shieh, Chan-Long et. al.), with promise of higher mobilities, are also preferred AOS TFTs for the invention disclosed herein. Such AOS TFTs developed by CBRITE may include $In_2O_3$ and InZnO materials in the active layer. The complete disclosure of U.S. patent publication 2014/0001462 (High Mobility Stabile Metal Oxide TFT) is hereby incorporated herein in its entirety by reference. There are other developments underway to improve mobilities in AOS TFTs including for example, a new structure of a-IGZO TFT with nano-meter-scale dotted channel doping proposed by researchers at National Chiao Tung University (NCTU), Taiwan. The NCTU work suggests that with a simple process, the mobility of a-IGZO TFT can reach 79 $cm^2/Vs$. Other developments in the field of AOS TFTS indicate that when a high-k gate dielectric or multi-layer gate insulator is used, mobility can be as high as 62 or 124 $cm^2/Vs$, respectively. (See Reference: High Performance a-IGZO TFT with Nano-Dots Doping, Hsiao-Wen Zan, Wu-Wei Tsai, Chia-Hsin Chen, Chuang-Chuang Tsai and Hsin-Fei Meng, SID Symposium Digest of Technical Papers, Volume 42, Issue 1, pages 28-31, June 2011). These high mobility (>10 $cm^2/Vs$) AOS TFTs can be fabricated at low temperatures (<450 C) enabling 3D layers of memory cells to be fabricated which, when substantially positioned above or below the memory array and not in the peripheral area of the array, provides the high density low cost high speed memory enabled by the invention disclosed herein.

A preferred TFT to be used in the invention described herein include the crystalline form of IGZO reported by Semiconductor Energy Lab (Japan) and named C-Axis Aligned Crystal (CAAC). CAAC IGZO has been commercialized by Sharp Electronics in the display industry. The following patent publications are hereby incorporated herein by reference in their entirety to the extent they are complimentary to the devices described herein and teach methods of fabricating IGZO TFTs and related devices: U.S. Patent Application publication 2014/0035478, Feb. 6, 2014—Kitakado, et. al., U.S. Patent Application publication 2013/0175521, Jul. 11, 2013—Moriguchi, et. al., U.S. Patent Application publication 2014/0231803, Aug. 21, 2014—Yamazaki, U.S. Pat. No. 8,726,176, May 13, 2014—Yamazaki, U.S. Patent Application publication 2012/0132910, May 31, 2012—Yamazaki, et. al., U.S. Pat. No. 8,115,201, Feb. 14, 2012—Yamazaki, et. al., U.S. Patent Application publication 2014/0340608, Nov. 20, 2014—Yamazaki, et. al., U.S. Patent Application publication 2014/0340116, Nov. 20, 2014—Okamoto, et. al., U.S. Patent Application publication 2014/0340117, Nov. 20, 2014—Takemura, U.S. Patent Application publication 2014/0340115, Nov. 20, 2014—Kurokawa, U.S. Patent Application publication 2014/0340888, Nov. 20, 2014—Ishisone, et. al., U.S. Patent Application publication 2014/0339560, Nov. 20, 2014—Yamazaki, et. al., U.S. Patent Application publication 2014/0339549, Nov. 20, 2014—Yamazaki, et. al., U.S. Patent Application publication 2014/0339548, Nov. 20, 2014—Yamazaki, et. al., U.S. Patent Application publication 2014/0339547, Nov. 20, 2014—Hondo, et. al., U.S. Patent Application publication 2014/0339546, Nov. 20, 2014—Yamazaki, et. al., U.S. Patent Application publication 2014/0339545, Nov. 20, 2014—Yamazaki, U.S. Patent Application publication 2014/0339541, Nov. 20, 2014—Kato, et. al., U.S. Patent Application publication 2014/0339540, Nov. 20, 2014—Takemura, et. al., U.S. Patent Application publication 2014/0339539, Nov. 20, 2014—Yamazaki, et. al., U.S. Patent Application publication 2014/0339538, Nov. 20, 2014—Yamazaki, et. al., U.S. Patent Application publication 2014/0333365, Nov. 13, 2014—Takahashi, et. al., U.S. Patent Application publication 2014/0332800, Nov. 13, 2014—Hanaoka, U.S. Patent Application publication 2014/0326998, Nov. 6, 2014—Honda, U.S. Patent Application publication 2014/0326994, Nov. 6, 2014—Tanaka, U.S. Patent Application publication 2014/0326993, Nov. 6, 2014—Oikawa, et. al., U.S. Patent Application publication 2014/0326992, Nov. 6, 2014—Hondo, et. al., U.S. Patent Application publication 2014/0326991, Nov. 6, 2014—Matsubayashi, et. al., U.S. Patent Application publication 2014/0325249, Oct. 30, 2014—Toyotaka, U.S. Patent Application publication 2014/0319517, Oct. 30, 2014—Noda, et. al., U.S. Patent Application publication 2014/0319516, Oct. 30, 2014—Tanaka, et. al., U.S. Patent Application publication 2014/0319514, Oct. 30, 2014—Noda, et. al., U.S. Patent Application publication 2014/0226401, Aug. 14, 2014—Yamazaki, et. al, U.S. Patent Application publication 2014/0097867, Apr. 10, 2014—Koyama, U.S. Patent Application publication 2014/0061639, Mar. 6, 2014—Yamazaki, et. al., U.S. Patent Application publication 2014/0035671, Feb. 6, 2014—Shionoiri, et. al., U.S. Patent Application publication 2014/0015566, Jan. 16, 2014—Yoneda, et. al., U.S. Patent Application publication 2014/0266305, Sep. 18, 2014—Shionoiri, et. al., In addition to AOS TFTs, emerging carbon nanotube (CNT) and graphene-based TFTs are preferred TFTs to be used in the invention described herein. In particular CNT-IGZO and hybrid graphene IGZO, MoS2 (molybdenum disulfide), SnS2 (tin disulfide) and cobaltites (Bi2Sr2Co2O8) TFTs hold the promise of higher mobility and speed compared to AOS TFTs. The following references are hereby incorporated herein by reference to the extent they teach fabrication of TFTs to be utilized in the invention described herein: Few-layer molybdenum disulfide transistors and circuits for high-speed flexible electronics, Rui Cheng, Shan Jiang, Yu Chen, Yuan Liu, Nathan Weiss, Hung-Chieh Cheng, Hao Wu, Yu Huang & Xiangfeng Duan, Nature 5, Article number: 5143 doi: 10.1038/ncomms6143, Highly Flexible Electronics from Scalable Vertical Thin Film Transistors, Yuan Liu, Hailong Zhou, Rui Cheng, Woojong Yu, Yu Huang, and Xiangfeng Duan, Nano Letters, dx.doi.org/10.1021/nl404484s, Vertically stacked multi-heterostructures of layered materials for logic transistors and complementary inverters, Woo Jong Yu, Zheng Li, Hailong Zhou, Yu Chen, YangWang, Yu Huang and Xiangfeng Duan, NATURE MATERIALS, Vol. 12, March 2013, DOI: 10.1038/NMAT3518, Transferred wrinkled Al2O3 for highly stretchable and transparent graphene-carbon nanotube transistors, Sang Hoon Chae,Woo Jong Yu, Jung Jun Bae, Dinh Loc Duong, David Perello, Hye Yun Jeong, Quang Huy Ta, Thuc Hue Ly, Quoc An Vu, Minhee Yun, Xiangfeng Duan and Young Hee Lee, NATURE MATERIALS, Vol. 12, May 2013, DOI: 10.1038/NMAT3572, High-mobility ambipolar ZnO-graphene hybrid thin film transistors, Wooseok Song, Soon Yeol Kwon, Sung Myung, Min Wook Jung, Seong Jun Kim, Bok Ki Min, Min-A Kang, Sung Ho Kim, Jongsun Lim & Ki-Seok An, SCIENTIFIC REPORTS |4: 4064| DOI: 10.1038/srep04064, High-performance $MoS_2$ transistors with low-resistance molybdenum contacts, Jiahao Kang, Wei Liu and Kaustav Banerjee, Appl. Phys. Lett. 104, 093106 (2014), Contact research strategy for emerging molybdenum disulfide and other two-dimensional field-effect transistors, Yuchen Du, Lingming Yang, Han Liu, and Peide D. Ye, APL Materials 2, 092510 (2014); doi: 10.1063/1.4894198, High-mobility and low-power thin-film transistors based on multilayer MoS$_2$ crystals, Sunkook Kim, Aniruddha Konar, Wan-Sik Hwang, Jong Hak Lee, Jiyoul Lee, Jaehyun Yang, Changhoon Jung, Hyoungsub Kim, Ji-Beom Yoo, Jae-Young Choi, Yong Wan Jin, Sang Yoon Lee, Debdeep Jena, Woong Choi & Kinam Kim, *Nature Communications* 3, Article number: 1011 doi: 10.1038/ncomms2018, Graphene-based flexible and stretchable thin film transistors, Chao Yan, Jeong Ho Cho and Jong-Hyun Ahn, Nanoscale, 2012, 4, 4870 DOI: 10.1039/c2nr30994g, Large-scale complementary macroelectronics using hybrid integration of carbon nanotubes and IGZO thin-film transistors, Haitian Chen, Yu Cao, Jialu Zhang, Chongwu Zhou, *Nature Communications,* 2014, DOI: 10.1038/ncomms5097, U.S. Patent Application publication 2014/0077161, Mar. 20, 2014—Duan, et. al., U.S. Patent Application publication 2014/0206182, Jul. 24, 2014—Chen, et. al. and U.S. Patent Application publication 2014/0008616, Jan. 9, 2014—Geim, et. al., U.S. Patent Application publication 2014/0197459, Jul. 17, 2014—Kis, et. al.

Although the 3D stacking and related short interconnects and lower capacitance metal lines related to the larger technology node transistors provides for reduced RC delays, the mobility of AOS TFTs are still currently well below traditional crystalline silicon CMOS transistors and hence, will provide a speed penalty until further improvements in TFTs are made. However, the design of relatively small memory blocks (for example arrays in size of 256×256 cells or less; preferably 128×128, 64×64, 32×32, or 16×16) will enable the writing to and reading from multiple memory blocks simultaneously thereby enabling parallel processing techniques to improve overall speed at the device level by utilizing a cache memory. Smaller memory blocks also provide for lower leakage and hence lower power consumption.

Figure 7:
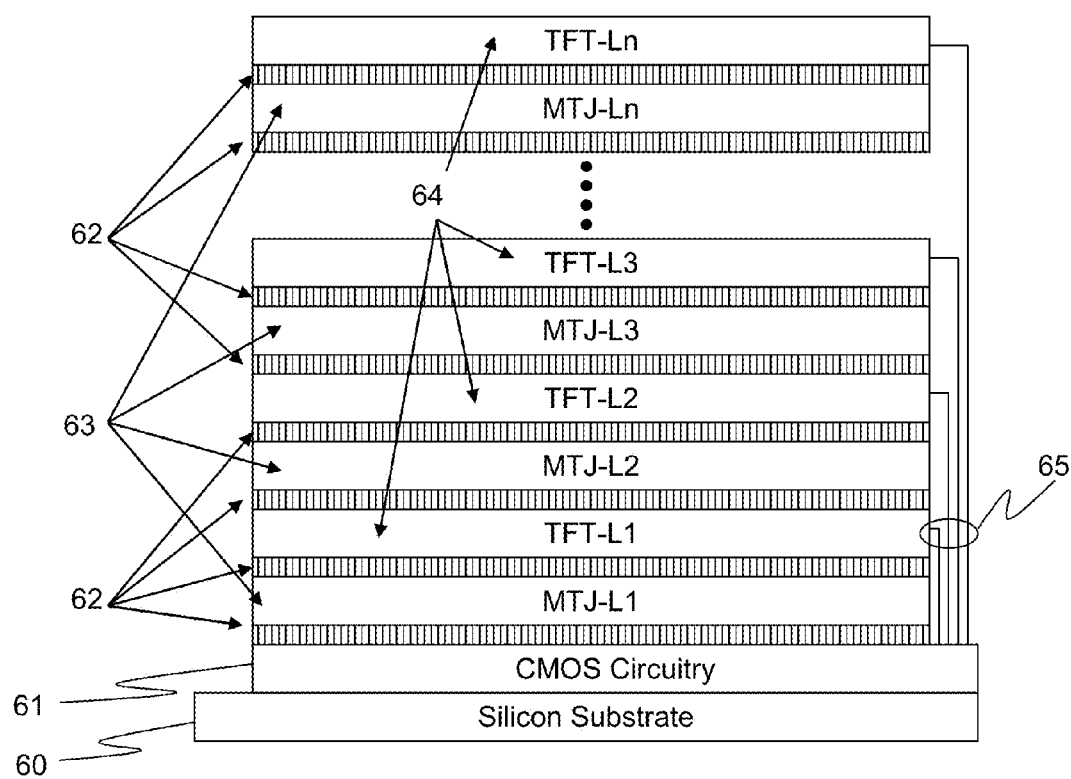
FIG. 7 is a cross section view of a three-dimensional memory array made in accordance with a first embodiment of the present invention
Figure 21A:
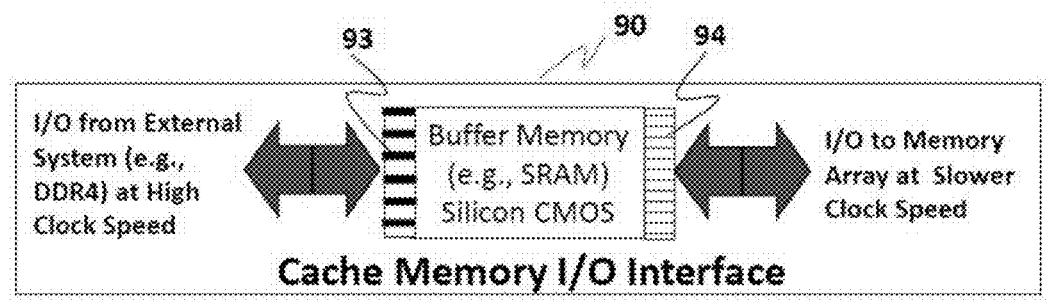
FIG. 21A is a schematic diagram of a cache memory I/O interface
Figure 21B:
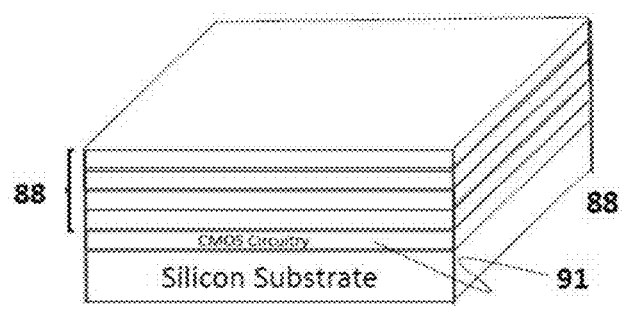
FIG. 21B is a schematic diagram of a memory device with an embedded cache memory I/O interface
Figure 21C:
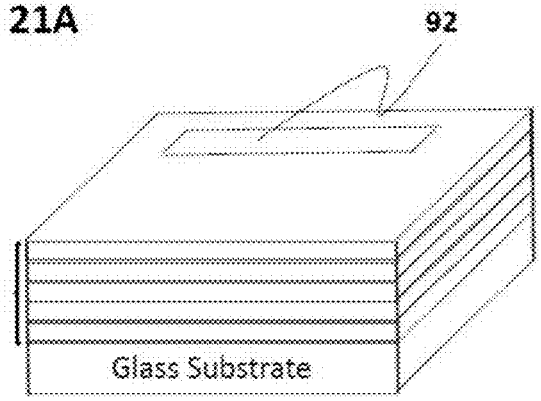
FIG. 21C is a schematic diagram of a memory device with a die attached cache memory I/O interface
Figure 43:
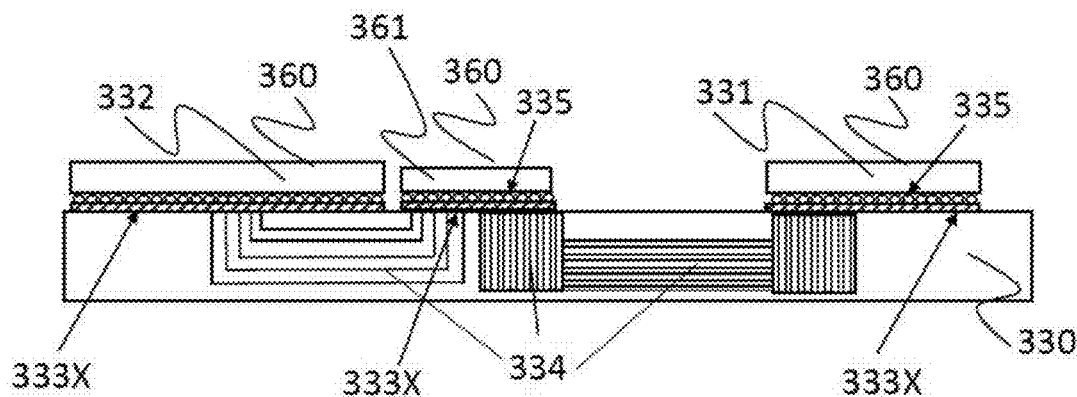
FIG. 43 is a side view cross section of a multilayer (PCB) first substrate with direct chip attachment of memory, cache memory, and processor chips in accordance with an embodiment of the present invention
Figure 44:
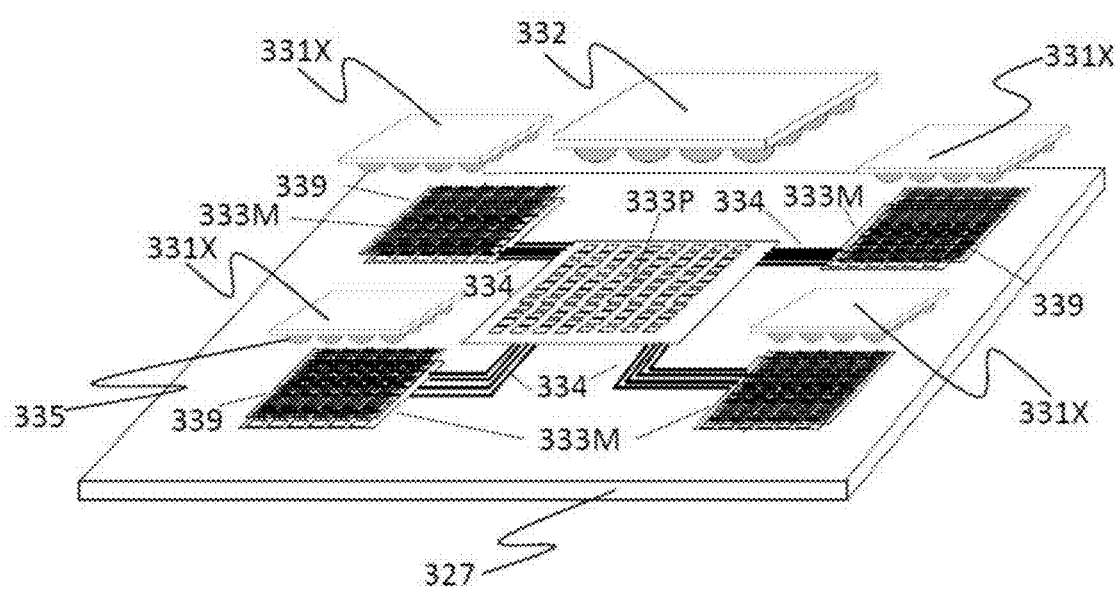
FIG. 44 is a diagram of TFT-based I/O circuitry on a first substrate for core memory and processor circuitry and TFT circuitry for memory drivers, decoder logic, sense circuits and bandgap circuitry on a first substrate in accordance with an embodiment of the present invention

FIG. 21A is a schematic diagram showing a cache memory—which may be SRAM or other high speed memory—input/ouput (I/O) interface (90) whereby the data transfer rates from external sources—such as a microprocessor—are at a high rate, for example DDR4. The I/O interconnect (94) pads for this data transfer are provided normally as solder bumps on the chip package for connection to a printed circuit board (not shown) which is part of a memory module (not shown). An alternative to a printed circuit board, the I/O pads may be interconnected to another integrated circuit by attaching directly to another die (die stacking). Other forms of interconnect design are possible and shall not depart from the spirit and scope of the invention disclosed herein. The specifications for this data transfer including pin connections and transfer speed is defined for example in the DDR3 and DDR4 specifications. A buffer (cache) memory is utilized which through simultaneous addressing of multiple nonvolatile memory blocks at lower clock speed, is able to maintain effectively the same data transfer speed required by the external source at higher clock speed. There are substantially more I/O interconnects (94) (bus lines) operating at slower clock speed—compared to number of I/O interconnects (93) (bus lines) operating at higher clock speed such as specified by the DDR3 or DDR4 standards. The buffer memory may be an SRAM memory fabricated with silicon CMOS circuitry or with high speed TFT circuitry. FIG. 21B illustrates an example of how this memory interface (91) could be incorporated into the silicon CMOS circuitry such as in the type of devices described in the first embodiment (FIG. 7). The interconnects (93 and 94) are necessarily routed (not shown) to their respective I/O source or destination, i.e., either the nonvolatile memory array with TFTs (88) or I/O pads on the memory chip which are later connected to an external source or destination. In the second and third embodiments (FIG. 8 and FIG. 9 respectively), where no silicon CMOS circuitry is provided for on the base substrate, a separate silicon CMOS chip (92) may be fabricated including the cache memory I/O interface and die attached to the nonvolatile memory device as shown in FIG. 21C. The interconnects (93 and 94) to the CMOS chip (92) are necessarily routed (not shown) to their respective I/O source or destination, i.e., either the nonvolatile memory array with TFTs (88) or I/O pads on the memory chip which are later connected to an external source or destination. Embodiments of applying cache memory as described above are show in FIG. 43 and FIG. 47. FIG. 43 is a side view cross section of a multilayer (PCB) first substrate with direct chip attachment of memory, cache memory, and processor chips in accordance with an embodiment of the present invention. FIG. 47 is a side view cross section of a multilayer (PCB) first substrate with direct chip attachment of memory, cache memory, and processor chips on both sides of the multilayer first substrate in accordance with an embodiment of the present invention.

To enable fast data rates of DDR4 for example, the cache memory noted above may be required for AOS TFT based devices made in accordance with the invention disclosed herein but may not be required if faster higher mobility AOS TFTs are developed. If graphene-based TFTs are employed in the devices made according to the invention disclosed herein, then it is most likely the cache memory will not be required to achieve DDR4 or higher data rates given the ultra high mobility reported in the graphene-based TFTs as discussed below and in the references noted above.

Another advantage of the low temperature fabrication process of the devices described herein, is that it is possible to fabricate devices which enable subsequent liftoff of the device from the substrate, thereby allowing for reuse of the substrate. This enables an environmentally friendly manufacturing process and further savings in material costs since the substrate is reusable.

A TFT gate insulator layer can be made of SiO$_2$, SiON, SiN$_x$ alumina, or other suitable dielectric material. A thickness of the gate insulator layer can be in a range from 10 nm through 1000 nm, and more specifically in a range from 50 nm through 200 nm.

The bit BL and word WL conductor lines can be made of Cu, Al, Au, Ag, AlCu, Ta/Au/Ta, Cr/Cu/Cr, TiN, poly-Si and/or similar materials and/or their based laminates.

The amorphous semiconductor layer 18, when coupled to a conductive line and one of the metal layers of the MTJ comprises a back to back Schottky diode, can be made of Silicon (Si), Zinc Oxide (ZnO), Indium Gallium Zinc Oxide (IGZO or InGaZnO), Zinc Tin Oxide (ZTO or ZnSnO), or a host of other semiconductor materials.

Although the drawings and embodiments discussed herein have illustrated the implementation of the invention with MRAM memory cells, the term memory cells (and memory elements) applies to all nonvolatile memory cells (and memory elements) which can be arranged in a crosspoint (or crossbar) arrangement and switched electrically during a writing stage. Such memory cells and memory elements include but are not limited to ferroelectric RAM (Fe-RAM or FRAM, such as in those products produced by Texas Instruments), MRAM with perpendicular anisotropy materials (such as those disclosed herein)—also referred to as STT-MRAM (spin torque transfer MRAM), MRAM with in-plane anisotropy materials (such as in the MRAM products produced and marketed by Everspin Technologies, Inc., Chandler, Ariz. www.everspin.com), thermally assisted switching MRAM (such as in the products under development by Crocus Technology, Santa Clara, Calif. http://www.crocus-technology.com/), orthogonal MRAM (such as in the OST-MRAM™ products in development by Spin Transfer Technologies, Inc. www.spintransfer.com), resistive RAM (Re-RAM or RRAM such as in the products under development by Crossbar, Santa Clara, Calif. http://www-.crossbar-inc.com/), solid electrolyte conductive bridge RAM (CBRAM such as in the products developed by Adesto Technologies, Sunnyvale, Calif. http://www.adesto-tech.com/), PCRAM (such as in the PCRAM products produced and marketed by Micron Technology who acquired Numonyx the developer of the PCRAM technology), Nano-RAM carbon nanotube based memory (such as in the NRAM™ products produced and marketed by Nantero, Woburn, Maas. http://www.nantero.com/, http://en.wikipedia.org/wiki/Nano-RAM) and organic ferroelectric RAM (ORAM, such as in the technology reported by Northwestern University: *Nature* 488, 485-489 (23 Aug. 2012) doi:10.1038/nature11395, Received, 4 Jun. 2012, Accepted 11 Jul. 2012 Published online 22 Aug. 2012). Further, memory cells based on voltage or electric field effect switching rather than current may also be applied to the invention disclosed herein and may be a preferred memory cell for lower power consumption and ease of addressing and reading. One such example is MeRAM (Magnetoelectric Random Access Memory), a voltage-based MRAM technology developed at UCLA, based on voltage controlled magnetic anisotropy (VCMA) materials and cell designs. The following references are hereby incorporated herein in their entirety by reference to the extent they teach fabrication of VCMA/MeRAM memory cells and application of such memory cells to the invention disclosed herein: U.S. Patent Application publication, 2014/0177327, Jun. 26, 2014—Khalili Amiri, et. al., U.S. Patent Application publication, 2014/0169085, Jun. 19, 2014—Wang, et. al., U.S. Patent Application publication, 2014/0124882, May 8, 2014—Khalili Amiri, et. al., PCT Patent publication WO 2012/159078, Nov. 22, 2012—Khalili Amiri et. al., U.S. Patent Application publication 2014/0071732, Mar. 13, 2014—Khalili Amiri et. al., U.S. Patent Application publication 2014/0071728, Mar. 13, 2014—Khalili Amiri et. al., and U.S. Patent Application publication 2014/0070344, Mar. 13, 2014—Khalili Amiri et. al. The characteristics of VCMA/MeRAM memory cells are attractive for implementing simultaneous writing or reading of multiple bits on a single array word line (WL). In contrast, the high current densities of other MRAM (e.g., STT-MRAM) memory cells would make such an addressing scheme more problematic from a design standpoint. Hence, VCMA/MeRAM memory cells are preferred memory cells for the invention disclosed herein. It may also be possible to multiplex a large array of VCMA memory cells without the need for a bidirectional selector element (such as a back-to-back schottky diode).

Similar field effect magnetic memory cells have also been developed at The Johns Hopkins University (U.S. Patent Application publication 2013/0015542, Jan. 17, 2013—Wang et. al. is hereby incorporated herein in its entirety by reference.). Recent work has also been reported on voltage controlled magnetic materials and memory cells at MIT—the following reference is hereby incorporated herein by reference: Magneto-ionic control of interfacial magnetism, Uwe Bauer, Lide Yao, Aik Jun Tan, Parnika Agrawal, Satoru Emori, Harry L. Tuller, Sebastiaan van Dijken & Geoffrey S. D. Beach, *Nature Materials*, (2014) doi:10.1038/nmat4134.

IBM's so-called racetrack memory is another such field effect memory. Other multiferroic materials and cell structures are being investigated which enable field induced, assisted spin torque.

Furthermore rare earth nitrides (REN) may lead to further improvements in MRAM type of devices which utilizes the invention disclosed herein; reference: Europium Nitride: A Novel Diluted Magnetic Semiconductor, Do Le Binh, B. J. Ruck, F. Natali, H. Warring, H. J. Trodahl, E.-M. Anton, C. Meyer, L. Ranno, F. Wilhelm, and A. Rogalev, Physical Reviews Letters, PRL 111, 167206 (2013).

A preferred RRAM memory cell to be used with the present invention are the SiOx-based memresistor cells taught by Tour; U.S. Patent Application publication 2013/0264536, Oct. 10, 2013—Tour, et. al. is hereby incorporated herein by reference in its entirety.

In each of the nonvolatile memory technologies noted above, the principles of the invention disclosed herein may be applied. Although many prior art nonvolatile memory technologies have been disclosed herein and incorporated by reference, the invention is not to be limited by the nonvolatile memory technologies listed. Much research and development is underway to study new materials which provide for a controlled resistance state and will lead to novel new nonvolatile memory technologies which may be applied to the invention disclosed herein.

Writing, erasing, and reading methods differ amongst the nonvolatile memories; however, the basic construction of a single or multiple layer crosspoint memory as disclosed herein may be applied—that is, the utilization of back-to-back Schottky diodes (if required) or other bidirectional switch element in series with each memory element and transistors (silicon CMOS and/or thin film transistors) made with a minimum feature size (technology node) larger size than the minimum feature size of the memory elements, connected to the conductive lines across the memory array area. For example, rather than an MTJ as the memory element, a resistive switching element may be employed in the memory array (RRAM). By the same token, a phase change memory element may be employed (PCRAM) rather than an MTJ. Variations may occur in the construction of the optional bidirectional switch elements (e.g. back to back Schottky diodes) connected in series with the memory element; however, the spirit of the invention disclosed herein applies to all such nonvolatile memory elements which are electrically switchable to different resistive states either by applying appropriate current through the cell or applying an appropriate electric field (voltage) across the cell.

Figure 22A:
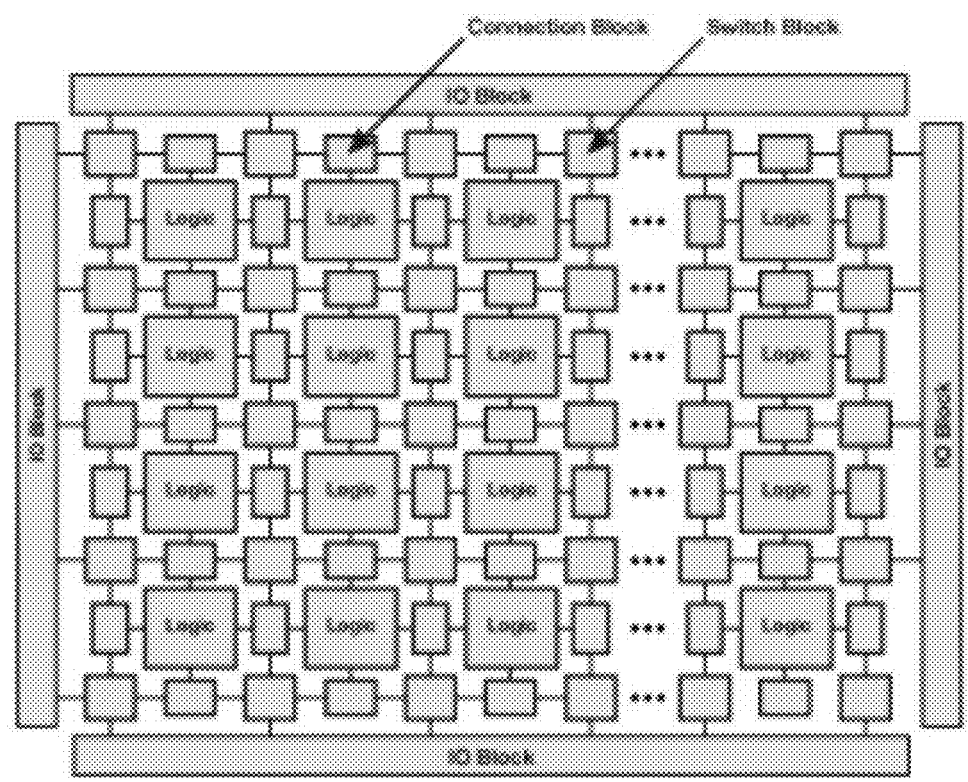
FIG. 22A is a schematic diagram of conventional logic block circuits layout in 2D according to the prior art
Figure 22B:
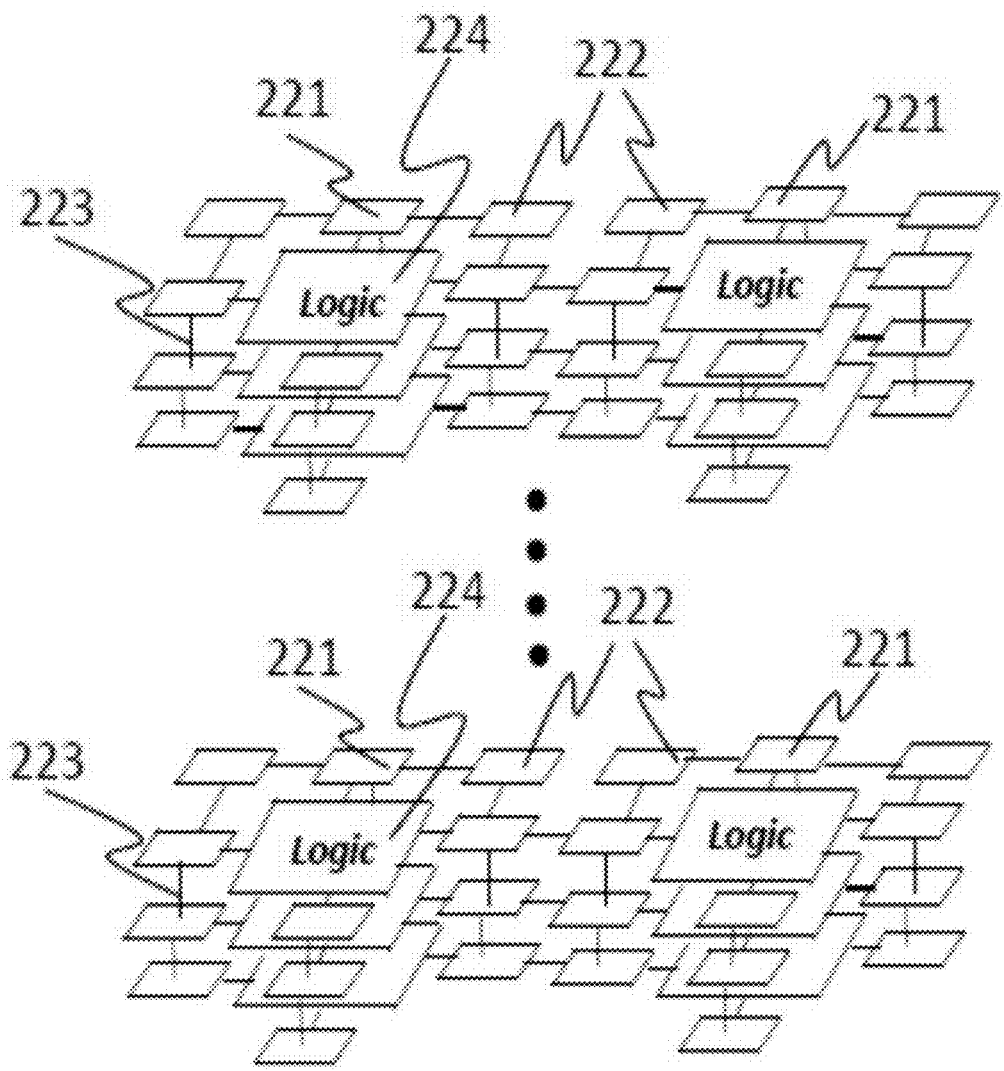
FIG. 22B is a schematic diagram of logic block circuit layout in 3D according to an embodiment of the present invention

The principles of shorter interconnects and higher density enabled by 3D stacking of transistors and memory elements described above may also be applied to logic circuitry; in particular stacking of logic blocks fabricated with thin film transistors to enable novel 3D integrated circuit devices. Conventional layout of logic block circuitry is shown in FIG. 22A. FIG. 22B illustrates that stacking of such logic blocks (224), switch blocks (222), and connection blocks (223) with vertical interconnects (221) leads to drastically reduced interconnection lengths and hence lower capacitance interconnects enabling faster speed. The speed of a circuit is limited by the longest conductive path or connection between one functional logic block to another. Hence, the 3D stacking provides for substantial reduction of the longest conductive connection path between logic blocks on a circuit. For an illustrative example only, consider that a 15 mm×15 mm single layer integrated circuit may have a longest connection path say of 21.2 mm, the diagonal of the IC. Note that the path may be longer yet, since a straight line is unlikely, but the purpose here is just for a comparable comparison to illustrate the advantage of the 3D logic stack. If this same circuit were constructed in four (4) layers of an IC measuring 7.5 mm×7.5 mm, the longest connection path may be reduced to 10.6 mm, the diagonal of the smaller die area. Note that vertical interconnects (221) are minimal (say <5 microns) and may be disregarded for this general analysis. Hence a major advantage of the invention described herein is that the longest conductive interconnect path of an integrated circuit (IC) is reduced by 50% or more by employing a 3D design compared to a single layer IC design with same functionality. The 3D stacking also allows much higher density for a given substrate area.

As technology nodes shrink the RC time delays of conductive lines and high leakage current of transistors become key issues. Hence, 3D designs as described herein are key to shortening the conductive lines between memory and logic blocks and between one functional logic block to another functional logic block. Non-volatile logic and 'normally off computing' techniques as described in the following references will be important to reducing start-up times and reducing power consumption and related thermal issues. The following five (5) references related to this subject matter of nonvolatile logic and 'normally off computing' are hereby incorporated herein in the entirety by reference: 1: U.S. Patent Application publication 2012/0307549, (Nonvolatile Latch Circuit), Dec. 12, 2012—Agan et. al., 2: U.S. Patent Application publication 2012/0313688, (Nonvolatile Multiplexer Circuit), Dec. 13, 2012—Agan et. al., 3: U.S. Pat. No. 8,405,421, (Nonvolatile Full Adder Circuit), Mar. 26, 2013—Agan et. al., 4: Non-Volatile Memory and Normally-Off Computing, T. Kawahara, Central Research Laboratory, Hitachi, Ltd., ASP-DAC 2011, Jan. 26, 2011, Yokohama, Japan and 5: Spin-transfer torque magnetoresistive random-access memory technologies for normally off computing. K. Ando, S. Fujita, J. Ito, S. Yuasa, Y. Suzuki, Y. Nakatani, T. Miyazaki, and H. Yoda. Journal of Applied Physics, 2014 DOI: 10.1063/1.4869828

Figure 23A:
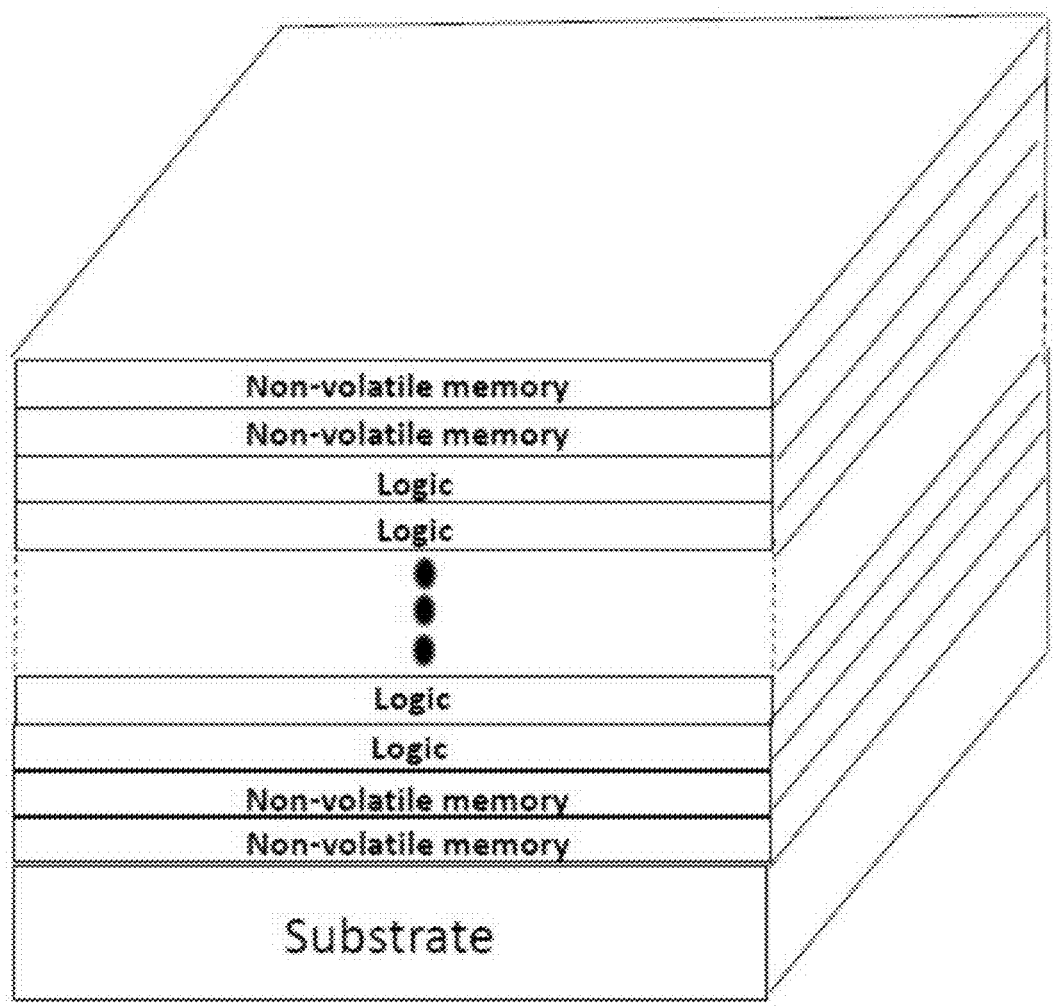
FIG. 23A and FIG. 23B are schematic diagrams of 3D circuits of a plurality of nonvolatile memory layers and logic layers according to embodiments of the present invention
Figure 23B:
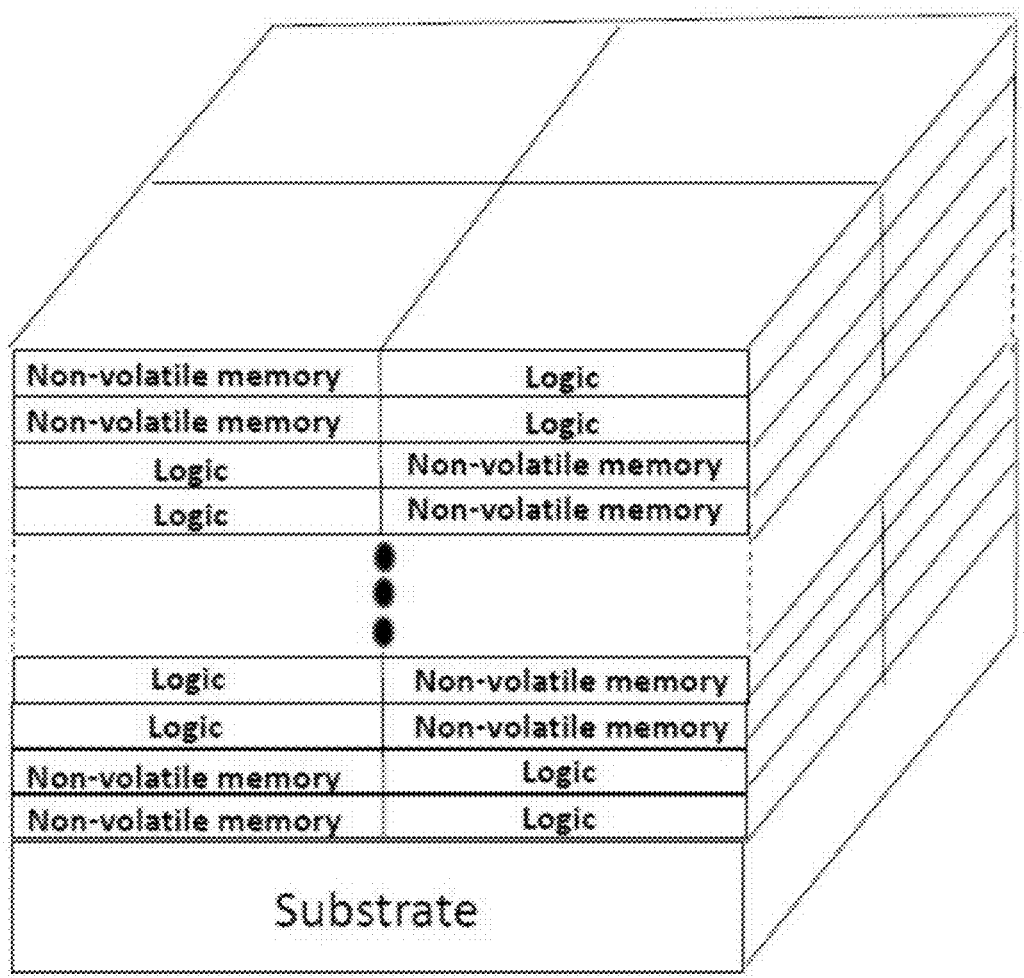

FIG. 23A and FIG. 23B illustrate in general the fabrication of a plurality of layers in a 3D integrated circuit comprised of nonvolatile memory layers and logic layers in an embodiment of the invention described herein. A non-volatile memory layer in FIG. 23A and FIG. 23B is comprised of the memory elements, conductive bit and word lines, select transistors, bandgap and decoder logic, and sense amplifiers and related transistors. Also included in the nonvolatile memory layer are insulating layers, well known to those skilled in the art for semiconductor design and fabrication. The substrate may be silicon, glass, or other material suitable for depositing and patterning the required transistor and memory elements. If the substrate is a silicon substrate, the first layer of circuitry may consist of CMOS circuitry, with layers above comprising of TFT based circuitry and memory elements. The logic layers may also include the elements of non-volatile latches, full adders and multiplexers described in the 5 references noted in the paragraph above here and incorporated herein in their entirety by reference. Each layer of an integrated circuit may be solely a memory layer or a logic layer, or a combination of both, depending on the specific functionality of the integrated circuit and which design would optimize the speed and power through minimal length interconnects and other factors the designer may consider. The architecture described is quite beneficial in multi-core massively parallel processing chips such as promoted by Adapteva mentioned above in the description of the First Embodiment. The multiple layers in a monolithic integrated circuit are enabled by the low temperature processing of thin film transistors and memory elements; hence the integrated circuit may be fabricated substantially or entirely in BEOL facilities. This further enables low cost, yet the device will be of high density memory and logic, low power and fast speed. Devices made according the invention described herein may be considered either a microprocessor, microcontroller, FPGA, GPU, PLD, ASIC, ASSP, DSP, MEMS device or a hybrid thereof. One such hybrid device could be an improved integrated microprocessor, FPGA and shared memory device similar to that promoted by SRC Computers and described in U.S. Pat. No. 7,282,951, Reconfigurable processor module comprising hybrid stacked integrated circuit die elements incorporated herein in its entirety by reference. FIG. 23C shows the hybrid device taught by Huppenthal et. al. which includes stacked die of a microprocessor, FPGA and memory. The contact points are much larger in scale and hence cannot provide a high number of interconnects as in the monolithic 3D design described herein. The thinning of die and stacking such die according to the prior are includes a level of complexity eliminated by the invention described herein.

A prior art example of using TFTs for programming circuitry—not operating circuitry—in FPGAs are the following references of Madurawe all of which are incorporated herein in their entirety by reference: U.S. Patent Application publication 2014/0346571, Nov. 27, 2014— Udaya, U.S. Patent Application publication 2013/0002296, Jan. 3, 2013—Madurawe, U.S. Pat. No. 8,856,699, Oct. 7, 2014—Madurawe, U.S. Pat, No. 8,829,664, Sep. 9, 2014— Madurawe, U.S. Patent Application publication 2012/0319728, Dec. 20, 2012—Madurawe, U.S. Patent Application publication 2014/0117413, May 1, 2014—Madurawe, U.S. Patent Application publication 2009/0128189, May 21, 2009—Madurawe, et. al., U.S. Patent Application publication 2009/0004788, Jan. 1, 2009—Madurawe, U.S. Pat. No. 7,635,988, Dec. 22, 2009—Madurawe, U.S. Pat. No. 7,265, 421, Sep. 4, 2007—Madurawe, U.S. Pat. No. 7,018,875, Mar. 28, 2006—Madurawe, U.S. Pat. No. 7,777,319, Aug. 17, 2010—Madurawe, U.S. Pat, No, 7,656,192, Feb. 2, 2010—Madurawe, U.S. Pat. No. 7,538,575, May 26, 2009—Madurawe, U.S. Pat. No. 7,446,563, Nov. 4, 2008— Madurawe, U.S. Pat. No. 7,112,994, Sep. 26, 2006—Madurawe, U.S. Patent Application publication 2004/0004239, Jan. 8, 2004—Madurawe. Madurawe teaches the use of amorphous silicon (a-Si) TFTs for the fabrication of SRAM above the base layer of circuitry as a programming level for FPGAs. The invention disclosed herein on the other hand teaches the use of TFTs for operational circuitry (logic) in 3D for a wider variety of purposes including memory and I/O.

Additional devices may also be incorporated into system on chip devices made in accordance to the examples listed above for FIGS. 23A and 23B such as an image sensor (camera), RF circuitry (wireless communications), MEMS device, I/O circuitry, energy storage and related power electronics, and other digital or analog circuitry—all fabricated with thin film transistors in BEOL facilities.

BEST MODE TO CARRY OUT THE INVENTION

The best mode for carrying out the invention is presented in terms of the first, second, third, fourth, fifth, sixth, seventh and eighth embodiments disclosed.

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses a device or method for embodying the technical idea of the present disclosure. Therefore, the technical idea of the present disclosure does not limit the materials, structures, arrangements, and the like of constituent parts to those described below. The technical idea of the present disclosure can be variously changed within the scope of the appended claims.

First Embodiment

FIG. 7 is a cross section view of a three-dimensional memory array made in accordance with a first embodiment of the present invention. Memory arrays (63) are crosspoint MRAM arrays made according to FIG. 6A whereby a BBSD is incorporated into each memory element. A silicon wafer substrate (60) is provided with CMOS circuitry (61) fabricated on the substrate. Such circuitry is fabricated at a technology node (Fe) which may be the same size as the technology node for the MTJ layers (Fm) or smaller or larger, depending on the nature of the CMOS circuitry. For example, a microprocessor or high end FPGA may be fabricated at a smaller technology node Fc compared to the embedded memory array (Fm) which resides above the circuitry. This embedded memory is lower cost than a separate chip and provides for higher speeds as no off chip delays a required. Lower power consumption is also realized due to the reduced circuitry. On the other hand, a stand alone memory device may have a larger technology node Fc compared to the technology node of the memory array (Fm). In a dedicated memory device, high density is critical for low cost; hence the technology node of the memory array (Fm) would be as small as possible, whereas the CMOS circuitry would be relatively less complex compared to a microprocessor and hence, for lower cost, could be fabricated at a technology node (Fc) larger than the technology node of the memory array (Fm). Such circuitry may include the bandgap and decoder logic for the memory arrays (63), as well as selection transistors for the first memory array (MTJ-L1). Additional circuitry for the memory arrays (MTJ-L1-MTJ-Ln) is provided in various layers (64) of thin film transistors (TFT-L1-TFT-Ln) disposed between the memory arrays. The TFT circuitry is fabricated at a technology node (Ft) substantially larger than Fm, such as 40% to 1,000% larger than Fm. Interconnect layers (62) are fabricated at technology node Fm to provide for interconnection of the word and bit lines to the respective word driver and bit driver circuitry. The placement of the relatively large thin film transistors across a large area, as indicated in FIG. 10A, enables interconnection to the bit and word lines not at the end of such lines, but at various intermediate points along the lines, thereby minimizing the complexity of interconnection. Additional interconnects (65) are made from one or more TFT layers to related bandgap and decoder logic (not shown) which may or may not reside on the CMOS circuitry layer. Preferably, bandgap and decoder logic transistors are located on the same layer or in close proximity to the respective bit or word selection transistors in order to provide for shorter interconnects, which provides for higher speed operation and lower cost due to lower complexity of construction, in which case such transistors would be on the TFT layer. A TFT layer preferably includes both word driver circuitry for an MTJ layer either above or below it, and bit driver circuitry for an MTJ layer either above or below it. For example, TFT-L1 could include the bit driver transistors for MTJ-L1 and the word driver transistors for MTJ-L2; TFT-L2 could include the bit driver transistors for MTJ-L2 and the word driver transistors for MTJ-L3; and so forth. The word driver transistors for MTJ-L1 would reside on the CMOS circuitry layer. In this case, each TFT layer, except the top layer, TFT-Ln, would include at least (M×3)+(N×2) transistors, plus additional transistors if decoder and bandgap logic circuitry resides on the TFT layer.

As noted earlier, the memory device as indicated in FIG. 7 can be produced as the embedded memory above the CMOS layer of a semiconductor circuit such as an ASIC, ASSP, FPGA, PLD, GPU, programmable system on chip, DSP, microcontroller or microprocessor chip, providing even lower cost and easy fast access to nonvolatile memory without having to go off chip. As noted earlier, several smaller blocks of memory are preferred over fewer larger blocks of memory for numerous benefits. First, more sneak paths are available in a large memory block; hence, power consumption will be increased if writing to a larger memory block compared to a smaller block. The smaller the memory block, the less an issue sneak paths are. Having multiple smaller memory blocks allows the designer to assign smaller memory blocks to each of the logic blocks in the underlying CMOS circuitry, such as in a microprocessor, FPGA, GPU, PLD, ASIC, ASSP, DSP, microcontroller or programmable system on chip. The multiple smaller blocks can be accessed simultaneously; that, along with shorter interconnects to the memory block, results in faster operation at lower power due to shorter wait times. Hence, medium to small sized arrays are more beneficial for embedded memory applications for more efficient addressing of memory banks. One can read more bits simultaneously if more smaller arrays are available as opposed to fewer large arrays. Power consumption will be higher writing and reading from a large array compared to smaller arrays. An example of how the memory technology herein may be applied in an embedded memory application of the future is in the processor chip developed by Adapteva. Adapteva is a semiconductor company that has developed an energy efficient multicore scalable processor chip designed for parallel computing with their Epiphany architecture. Adapteva's roadmap http://www.adapteva-.com/introduction/shows 64K (252×252) cores per chip each with 1 MB memory at 7 nm technology node by 2018. If chip size were say 10 mm×10 mm, that's a core size of 40 microns>40 microns. A single layer, single array 8 Mb (1 MB) memory would be 2828×2828 bits which equates to 14 nm (2F @ 7 nm technology node) pitch. This assumes large array devices can be made with sufficient solutions to the leak paths discussed herein with proper high On/Off ratio select switches. Alternatively, the 1 MB memory could be comprised of 100 smaller arrays each measuring 283×283 bits. Rather than implementing the memory layers with the 7 nm technology node, which the microprocessor layer is fabricated at, one could choose a 14 nm or even 22 nm technology node for the memory layers would reside above the CMOS logic area. The memory size of 1 MB could be achieved with additional layers (4 layers if 14 nm node; 10 layers if 22 nm node) stacked and with TFTs not occupying precious peripheral area outside the memory array area, but rather would be positioned in the area directly above or below the memory array area. Furthermore, the TFT technology node could be larger yet compared to the memory technology node, such as 32 nm or 45 nm. If there's no penalty in die area size for a given layer of memory, one would prefer multiple smaller memory arrays compared to fewer large arrays. Speed of writing and reading, lower power consumption, and broader availability of suitable materials for diodes and memory elements are all benefits of designing smaller memory arrays over larger memory arrays. This can only be accomplished without a penalty in die size area if the TFTs are placed not on the periphery but substantially under or over the memory array area. Such placement of TFTs across the area of the array also provides for substantial area to allow for lower cost, larger technology node to be implemented for the TFT fabrication step. Hence, the technology disclosed herein for embedded memory is the optimal architecture for a device such as Adapteva's Epiphany architecture by providing above CMOS layer memory, multiple small memory arrays per core, and interlayer TFT placement which does not increase die area required for memory array. This all points to faster operation, low power consumption, smaller die size and lower cost.

Second Embodiment

Figure 8:
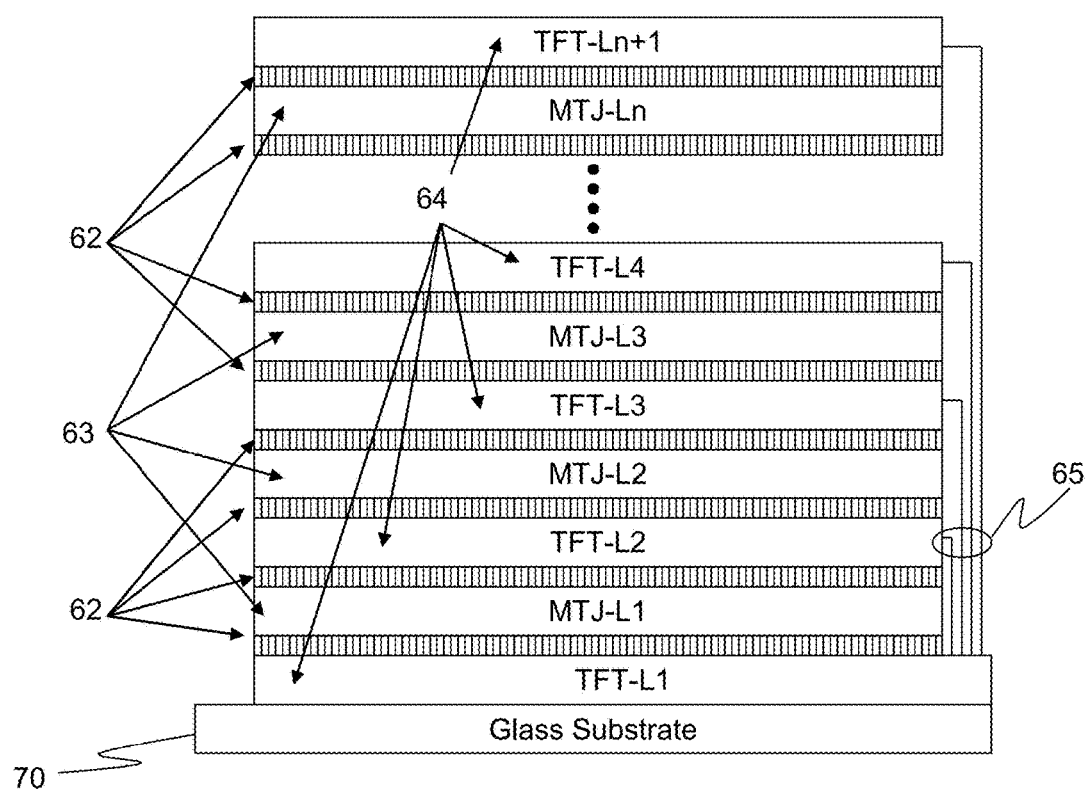
FIG. 8 is a cross section view of a three-dimensional memory array made in accordance with a second embodiment of the present invention

FIG. 8 is a cross section view of a three-dimensional memory array made in accordance with a second embodiment of the present invention. Memory arrays (63) are crosspoint MRAM arrays made according to FIG. 6A whereby a BBSD is incorporated into each memory element. A low cost glass substrate (70) is provided with the first thin film transistor layer (TFT-L1) circuitry fabricated on the substrate. Such circuitry is fabricated at a technology node (Ft) which may be the same size as the technology node for the MTJ layers (Fm) but preferably for cost savings may be larger than Fm. Such circuitry may include the bandgap and decoder logic for the memory arrays (63), as well as selection transistors for the first memory array (MTJ-L1). Additional circuitry for the memory arrays (MTJ-L1-MTJ-Ln) is provided in various additional layers (64) of thin film transistors (TFT-L2-TFT-Ln+1) disposed between the memory arrays. The TFT circuitry is fabricated at a technology node (Ft) substantially larger than Fm, such as 40% to 1,000% larger than Fm. Interconnect layers (62) are fabricated at technology node Fm to provide for interconnection of the word and bit lines to the respective word driver and bit driver circuitry. The placement of the relatively large thin film transistors across a large area, as indicated in FIG. 10A, enables interconnection to the bit and word lines not at the end of such lines, but at various intermediate points along the lines, thereby minimizing the complexity of interconnection. Additional interconnects (65) are made from one or more TFT layers to related bandgap and decoder logic (not shown) which may or may not reside on the TFT-L1 circuitry layer. Preferably, bandgap and decoder logic transistors are located on the same layer or in close proximity to the respective bit or word selection transistors in order to provide for shorter interconnects, which provides for higher speed operation and lower cost due to lower complexity of construction, in which case such transistors would be on the TFT layer. A TFT layer preferably includes both word driver circuitry for an MTJ layer either above or below it, and bit driver circuitry for an MTJ layer either above or below it. For example, TFT-L1 could include the word driver transistors for MTJ-L1; TFT-L2 could include the bit driver circuitry for MTJ-L1 and the word driver transistors for MTJ-L2; TFT-L3 could include the bit driver transistors for MTJ-L2 and the word driver transistors for MTJ-L3; and so forth. In this case, each intermediate TFT layer (excluding the bottom and top layer) may include at least (M×3)+(N×2) transistors, plus additional transistors if decoder and bandgap logic circuitry resides on the TFT layer.

Third Embodiment

Figure 5:
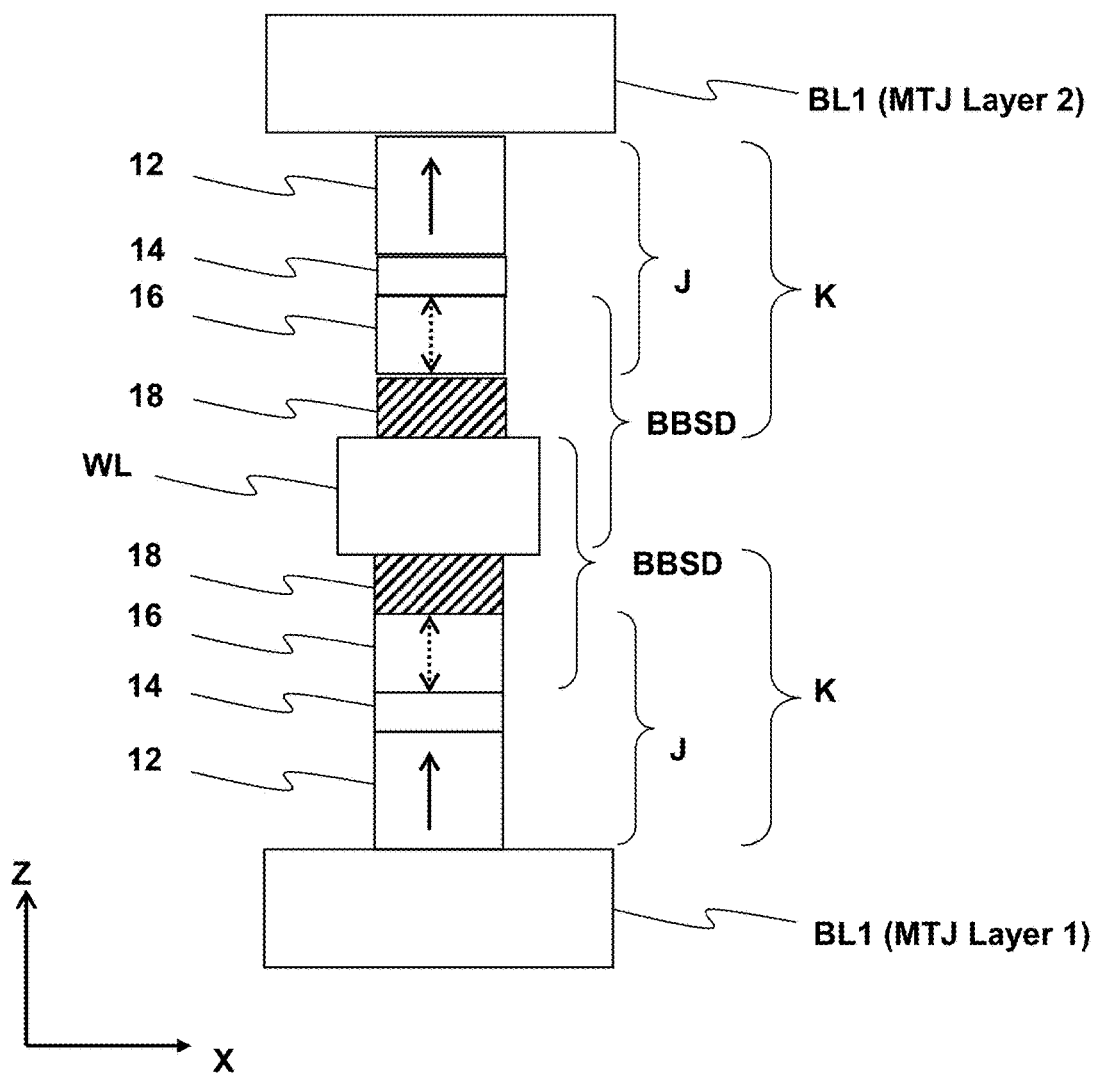
FIG. 5 is a cross sectional view of a stacked magnetic memory cells made with perpendicular magnetic materials including a back to back Schottky diode built into the structures whereby the two stacked memory cells share a common word line
Figure 9:
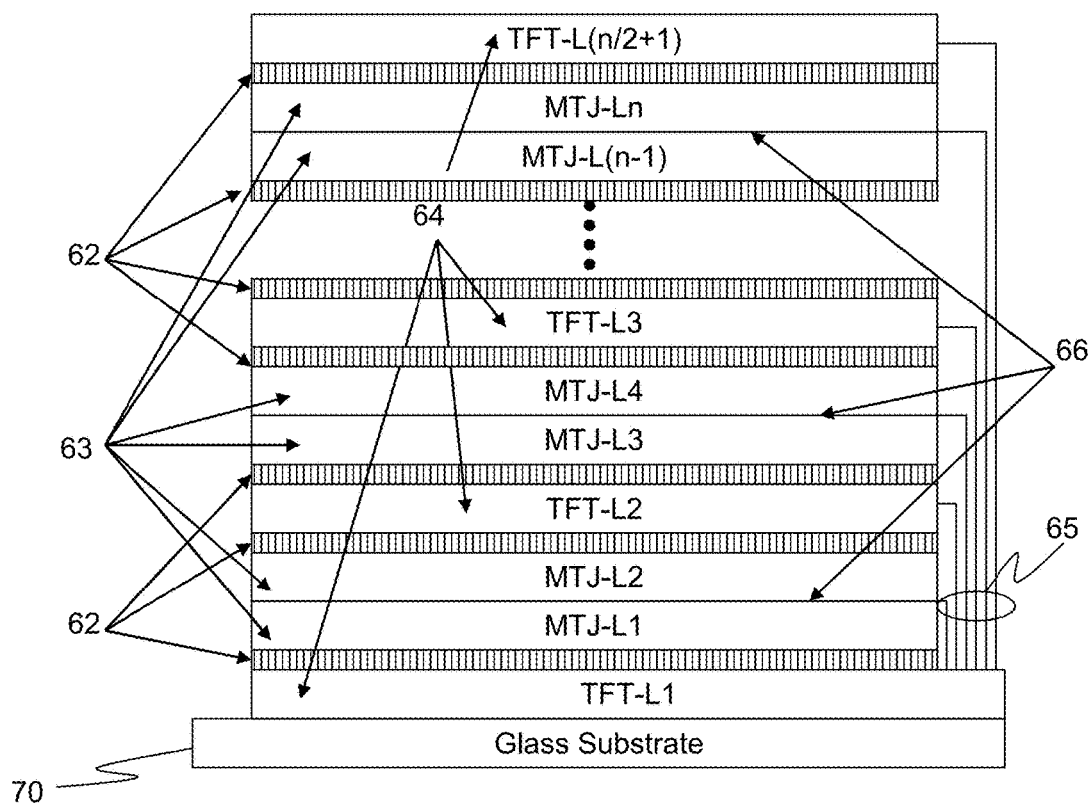
FIG. 9 is a cross section view of a three-dimensional memory array made in accordance with a third embodiment of the present invention

FIG. 9 is a cross section view of a three-dimensional memory array made in accordance with a third embodiment of the present invention. Memory arrays (63) are crosspoint MRAM arrays made according to FIG. 6A whereby a BBSD is incorporated into each memory element. A low cost glass substrate (70) is provided with the first thin film transistor layer (TFT-L1) circuitry fabricated on the substrate. Such circuitry is fabricated at a technology node (Ft) which may be the same size as the technology node for the MTJ layers (Fm) but preferably for cost savings may be larger than Fm. Such circuitry may include the bandgap and decoder logic for the memory arrays (63), as well as selection transistors for the first memory array (MTJ-L1). Additional circuitry for the memory arrays (MTJ-L1-MTJ-Ln) is provided in various additional layers (64) of thin film transistors (TFT-L2-TFT-L(n/2+1)) disposed between every two memory arrays. The TFT circuitry is fabricated at a technology node (Ft) substantially larger than Fm, such as 40% to 1,000% larger than Fm. Interconnect layers (62) are fabricated at technology node Fm to provide for interconnection of the bit lines to the respective bit driver circuitry. Alternating pairs of memory arrays share common word lines (66) which are interconnected to a TFT layer (for example TFT-1) by interconnects (65). FIG. 5 shows a cross sectional view of the respective memory cells on different memory arrays that share a common word line at the interface (66) of the two memory arrays. Construction variations of FIG. 9 may include memory cells on different memory layers that share common bit lines (BL) as in FIG. 20, rather than share common word lines (WL, 66) as in FIG. 9. Furthermore, interconnects (65) may connect to CMOS circuitry rather than TFTs; therefore, not all conductive lines in the memory array would necessarily be connected to TFTs. The TFTs could be connected only to the first set of conductive lines (e.g., Word Lines) in a memory array, or only to the second set of conductive lines (e.g., Bit Lines) or both. The TFTs however, do enable 3D construction of the memory device due to the fact the TFTs can be fabricated at low temperatures without destroying the memory element (magnetic layer).

Fourth Embodiment

FIG. 23A and FIG. 23B are illustrations of 3D circuits which can be designed and fabricated in accordance with a fourth embodiment of the present invention. A plurality of memory and logic layers allow for ultra high density and short signal paths which results in high speed and lower power. Utilizing TFTs for the 3D layers above the first substrate layer provides for low cost fabrication of true monolithic 3D ICs.

Fifth Embodiment

FIG. 30 is an illustration of TFT-based I/O circuitry on a traditional CMOS semiconductor device made in accordance with a fifth embodiment of the present invention, The I/O circuitry area (312) of a semiconductor device is partially or fully fabricated with TFTs thereby enabling a high I/O pad count and use of a majority of the area on top of the device for placement of pads (315). The core CMOS circuitry (311) utilizes most or all of the area on the silicon substrate (314) for the core functions of the device. The semiconductor device may be a microprocessor (CPU), microcontroller, GPU (graphical processing unit), FPGA, PLD, ASSP, DSP, ASIC, or other semiconductor device with I/O circuitry. The I/O pad pitch (P) may be 100 microns or less, for example, which enables over 5,000 I/O pads per square centimeter and even over 10,000 I/O pads per square centimeter of semiconductor device die area. Wide I/O (4,096 data signal pads) and ultra wide I/O is therefore enabled on a conventional sized IC die with a pad pitch suitable for direct chip attach assembly methods. The die may be bonded directly to a PCB or other substrate or to an interposer substrate for subsequent attachment to a PCB or other substrate.

Sixth Embodiment

FIG. 32A is an illustration of a 3D integrated circuit (chip) comprised of a plurality of layers of non-volatile memory (325), logic (324), display (323) and I/O (321) with the related transistors of the circuits substantially TFTs. Optionally, the substrate (326) may be silicon with the first layer of circuitry comprised of traditional single crystalline silicon CMOS. Alternatively, the substrate (326) is preferably glass, quartz or other suitable substrate, and all layers therefore employ TFTs for the required circuitry. The display (322) is preferably based on a light emitting technology such as OLED or LED and comprised of more than one layer to provide for high brightness requirements of microdisplays for wearable computing applications. FIG. 32B shows that the orientation of the microdisplay (322) area relative to the I/O (321) area of the chip may be designed to allow for a thin profile chip suitable for the compact requirements of wearable computing device designs.

Seventh Embodiment

FIG. 33A is a diagram of I/O circuitry fabricated off-chip on a multilayer substrate (330) in accordance with an embodiment of the present invention and FIG. 34 is a side view cross section of I/O circuitry fabricated off-chip on a multilayer substrate attached to related chips in accordance with an embodiment of the present invention. A majority or all of the I/O circuitry normally fabricated on-chip is fabricated on the substrate, comprised of TFT-based I/O circuitry (333). I/O interconnects (bus lines) 334 are fabricated on the substrate surface or in the preferable case of a multilayer substrate, such as a multilayer printed circuit board, are fabricated in the multilayers of the substrate. Combining the I/O circuitry (333) and metal line interconnects (334) onto a single component reduces the design challenges and associated costs, and increases reliability of the device. A microprocessor chip (332), memory chips (331) and other chips may be directly attached to the substrate by the direct chip attach method, of connection of solder bumps (335) to the I/O pads as described in the prior art (FIG. 26) or other process.

Eighth Embodiment

Figure 35:
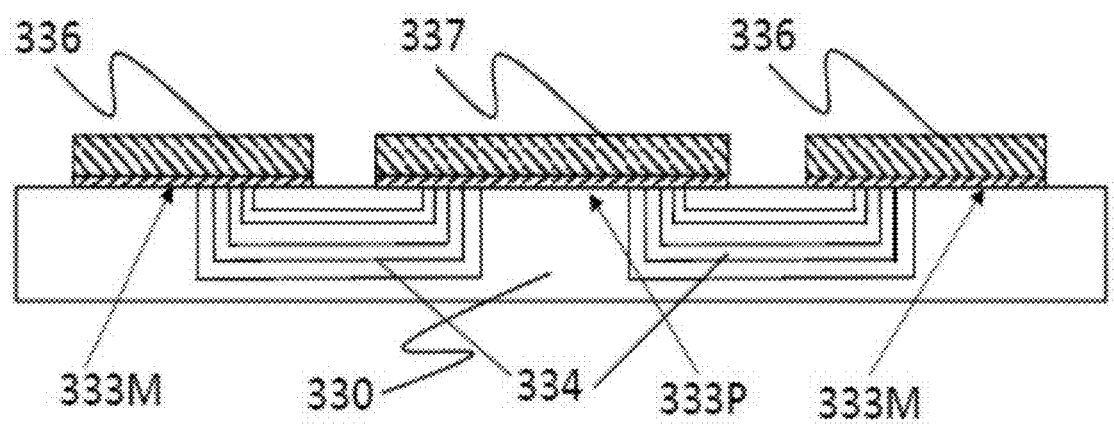
FIG. 35 is a side view cross section of integrated circuits including TFT-based I/O, memory, logic or other circuitry fabricated on a common multilayer (PCB) substrate in accordance with an embodiment of the present invention

FIG. 35 is a side view cross section of integrated circuits including I/O, memory, logic or other circuitry fabricated on a common substrate (330)—preferably a multilayer substrate such as a multilayer printed circuit board—in accordance with an embodiment of the present invention. Memory circuitry (336), microprocessor circuitry (337), I/O circuitry (333) and other circuitry all based on TFTs may be fabricated directly on the substrate. The circuitry may be fabricated in multiple layers to enable 3D integrated circuitry as described herein. For the memory circuitry (336), it may be preferable to fabricate the I/O circuitry and select transistors and decoder logic transistors and bandgap circuitry transistors on the common substrate (330), but to provide for the memory array—including only the memory elements and bit and word lines—to be produced on a separate substrate for subsequent attachment to the memory TFT circuitry via direct chip attach or other methods. The benefits of this approach is to enable a business model whereby fabricators may focus on their core competency of fabrication—be it high end CMOS (microprocessor), novel memory technology (MRAM array) or thin film transistor fabrication—and the individual components can be brought together for assembly at reasonable pad pitch to provide high reliability.

Figure 3A:
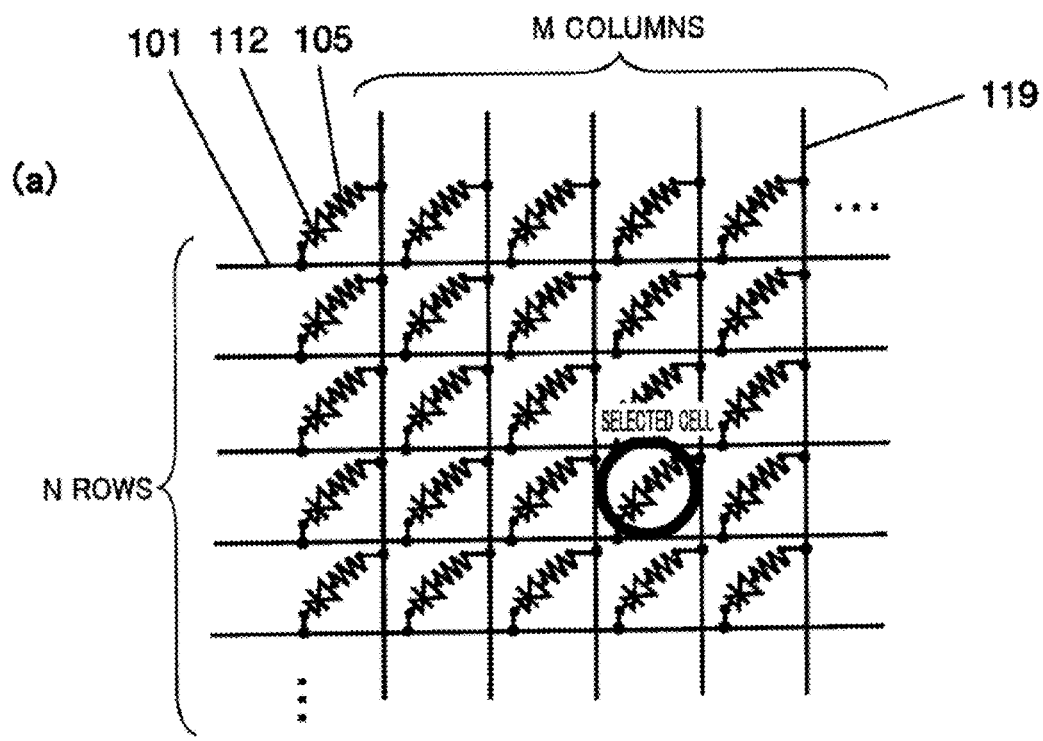
FIG. 3A is a circuit diagram of a crosspoint resistance nonvolatile memory array with back to back Schottky diodes at each memory cell according to the prior art
Figure 3B:
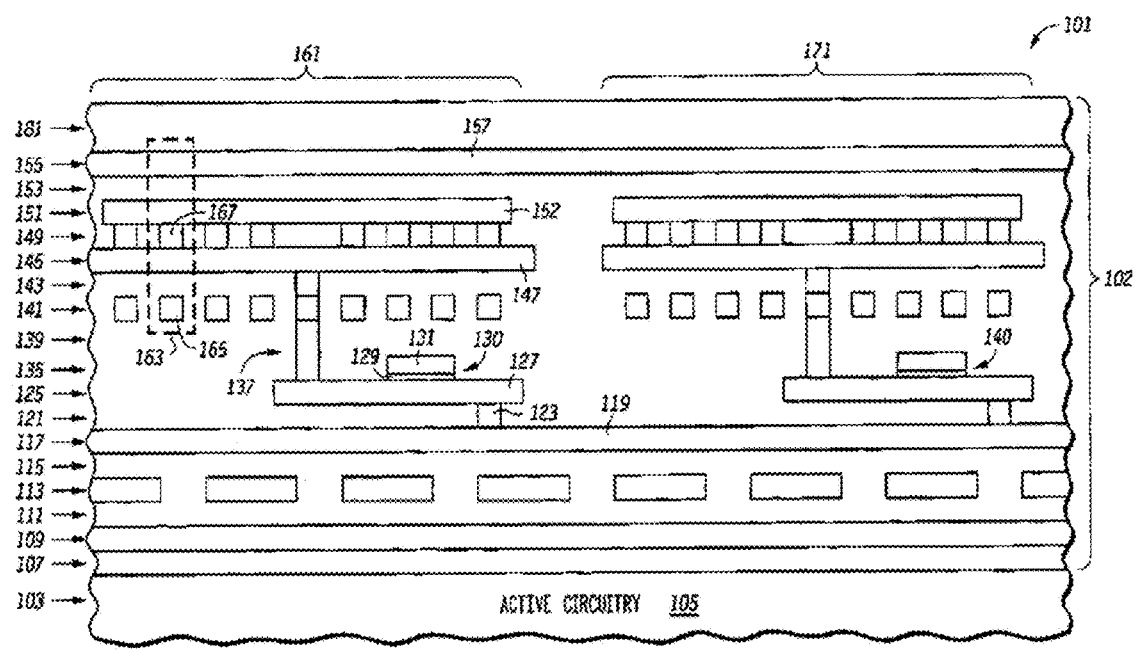
FIG. 3B is a cross section view of thin film transistors and memory cells showing the plurality of layers in an integrated circuit according to the prior art

It should be noted that FIGS. 7 to 9 are for high level illustrative purposes only and not intended for detailed drawings of the design of the transistors or the interconnects between the MTJ layer and TFT layer which would be known to one skilled in the art. U.S. Pat. No. 6,838,721 (Garni) for example, illustrates that several layers of metal lines and insulator layers comprise the interconnection between transistors and conductive lines to memory cells (see FIG. 3B), all well-known to one skilled in the art. Furthermore, interconnects (65) between TFT layers (64) and other circuitry closer to or on the substrate is well known to those skilled in the art.

Additional interconnects (65) are made from one or more TFT layers to related bandgap and decoder logic (not shown) which may or may not reside on the TFT-L1 circuitry layer, within the area directly above or under the memory array, thereby not occupying precious periphery area. Preferably, bandgap and decoder logic transistors are located on the same layer or in close proximity to the respective bit or word selection transistors in order to provide for shorter interconnects, which provides for higher speed operation and lower cost due to lower complexity of construction, in which case such circuitry would be located on each TFT layer. In this embodiment, the intermediate TFT layers include transistors for the bit drivers of the MTJ layer residing directly above the TFT layer and below the TFT layer. Hence, the number of transistors on such intermediate TFT layer would be at least 2×(N×2)=4N. Alternatively, a TFT layer may be fabricated as two layers, a first layer providing the bit driver transistors for the MTJ layer below the TFT layer, and a second layer providing the bit driver transistors for the MTJ layer above the TFT layer The placement of the relatively large thin film transistors across a large area, as indicated in FIG. 10A, enables interconnection to the bit and word lines not at the end of such lines (i.e. not in the periphery area), but at various intermediate points along the lines directly above or under the memory array, thereby minimizing the complexity of interconnection. The average area available for positioning of a transistor (81) depends on the size of the memory array (M×N), and the number of transistors to be fabricated on a given layer. One can appreciate the wide range of possibilities of providing for different sized areas (81) for placement of transistors depending on memory array size and functionality to be provided (e.g, select transistors and decoder logic transistors) on the layer. Since one can fabricate TFTs at larger technology nodes, the area (82) for interconnect between the TFT and the conductive line may be designed to provide sufficient area to account for alignment challenges between larger and smaller technology node circuitry.

Note that most embodiments described herein show the placement of the relatively large thin film transistors across a large area, as indicated in FIG. 10A, to enable interconnection to the bit and word lines not at the end of such lines (i.e. not in the periphery area), but at various intermediate points along the lines directly above or under the memory array, thereby minimizing the complexity of interconnection. However, it may be necessary for placement of additional transistors such that current may be directed across the entire bit line for example to induce a pre-tilt in the free layer, prior to writing to the desired memory cell, as discussed in the prior art. In this case, the conductive bit lines may be fabricated in an extended length and brought to another layer of the circuit to still enable the spreading of the larger transistor placement across a large area similar to that shown in FIG. 10A.

Figure 6B:
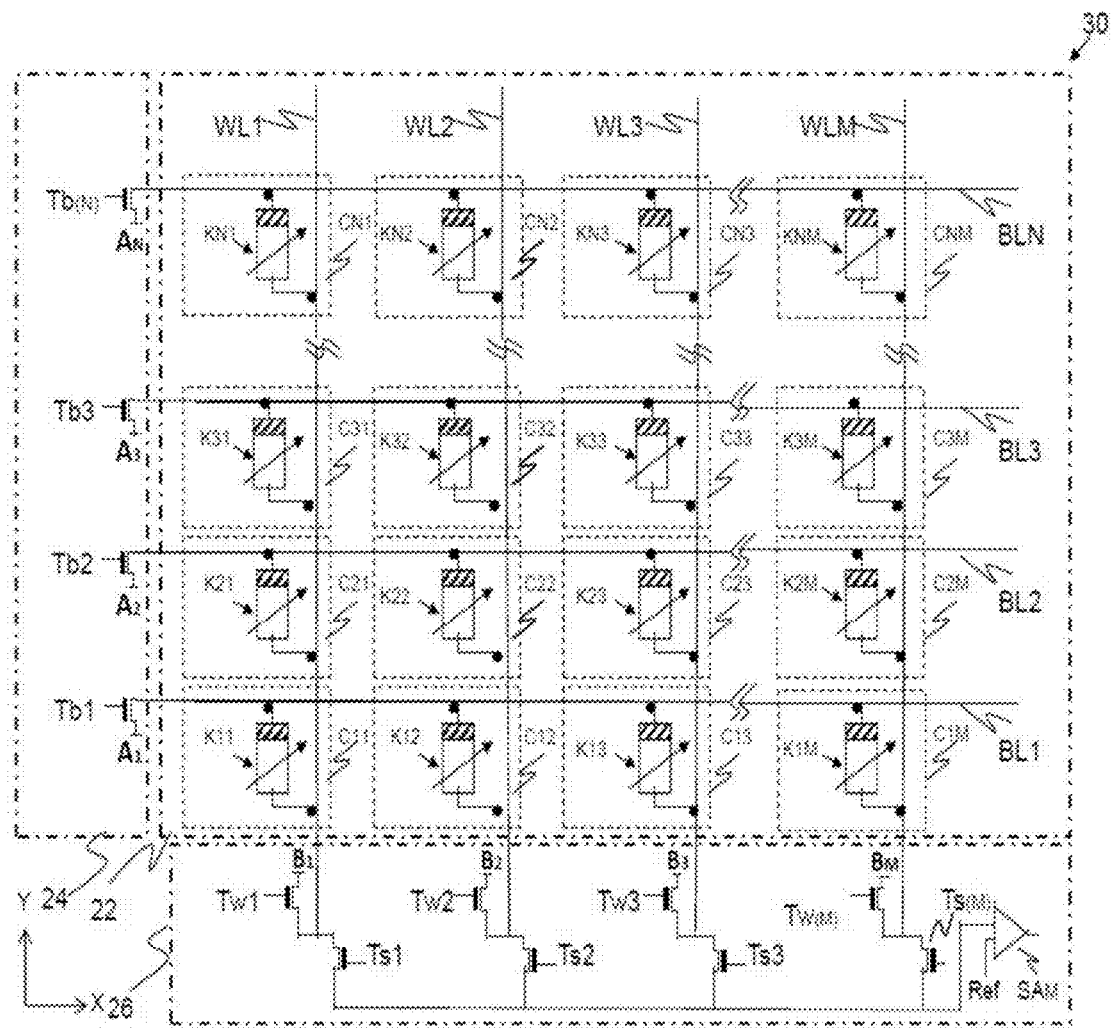
FIG. 6B is a circuit diagram of a magnetic random access memory (MRAM) crosspoint array with back to back Schottky diodes at each memory cell that further minimizes leakage currents by controlling intermediate node voltages. One sense amplifier is used for multiple bit lines thereby reducing overall number of transistors.
Figure 6C:
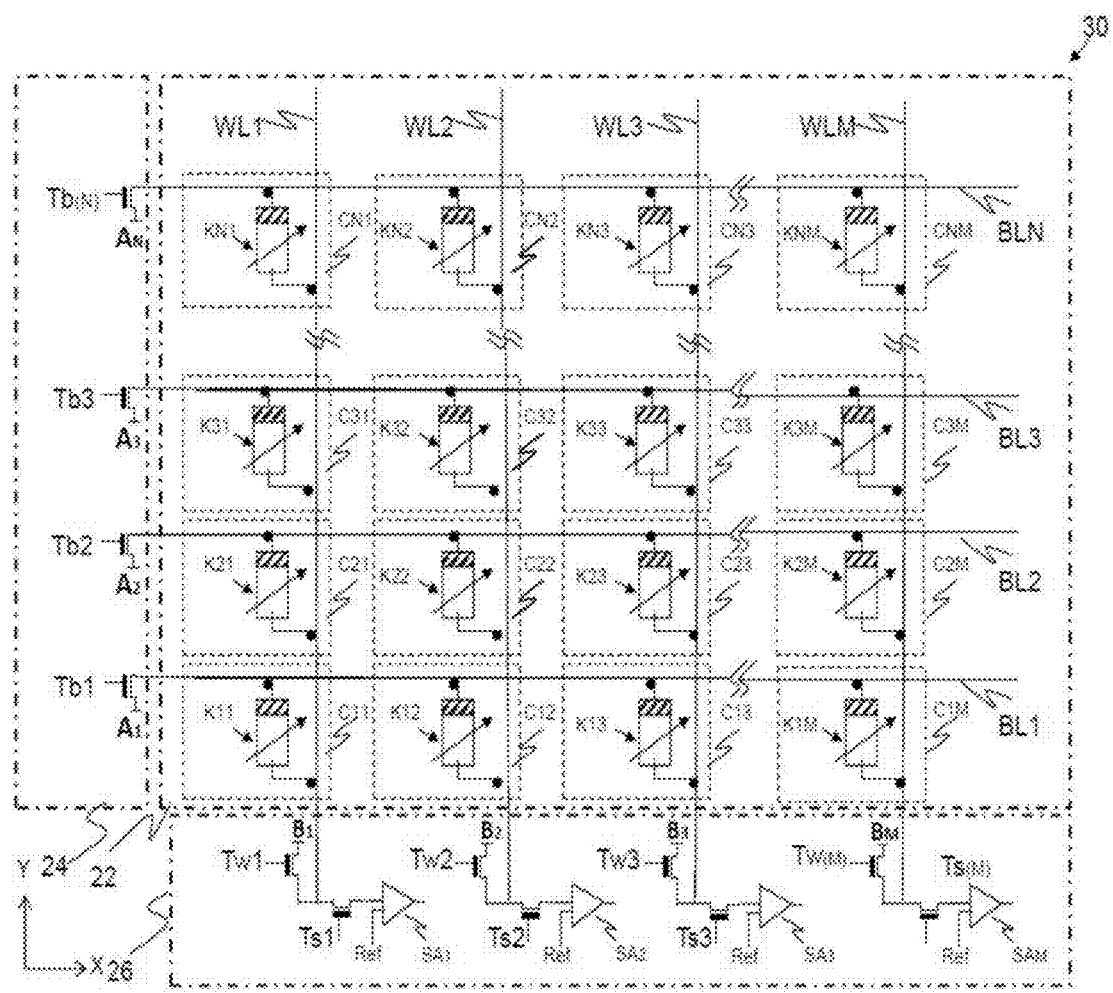
FIG. 6C is a circuit diagram of a magnetic random access memory (MRAM) crosspoint array with back to back Schottky diodes at each memory cell that further minimizes leakage currents by controlling intermediate node voltages

Another aspect of the invention is that leakage currents can be further minimized by controlling of the intermediate node voltages, which also enables writing and reading from larger arrays. FIG. 6B is a circuit diagram of a magnetic random access memory (MRAM) crosspoint array with back to back Schottky diodes at each memory cell that further minimizes leakage currents by controlling intermediate node voltages. An intermediate node voltage is defined herein as an extraneous voltage on a bit or word line not intended for the selected read or write operation. In a given conventional read or write operation of a crosspoint memory, a single bit line and single word are asserted to read or write the bit. All other memory elements in the array will experience a voltage and current due to intermediate leakage paths, even with back to back Schottky diodes employed at each memory element. It would be preferred to eliminate those extraneous voltages and currents. By controlling the non-asserted word line and bit line voltages, most extraneous currents and voltages are eliminated. For example, in FIG. 6B, for a write operation on cell C32, Tb3 and Tw2 would be asserted. $A_3$ and $B_2$ would be given the appropriate voltages for the desired write operation. $A_1$, $A_2$, $A_4$-$A_N$ would be set to a different voltage as would be $B_1$, $B_3$-$B_M$ be set to a different voltage to minimize leakage currents and voltages. For a read operation on cell C32, Tb3 and Ts2 would be asserted with appropriate voltage on $A_3$. The circuit design of FIG. 6B also allows for reading and writing of multiple bits on a word line simultaneously—for example one may write or read on an array of N=1,024 say eight (8) 126-bit words on one word line. If an entire word line—(WL2) for example in FIG. 6B—is to be written, Tw2 would be asserted and Tb1-Tb(N) would be asserted. $B_2$, and A1-$A_N$ would be given appropriate voltages for the given write operation. For reading of an entire word line the sense transistors (Ts1-Ts(M)) would need to be located on the bit lines (BL1-BLN) rather than the word lines as shown in FIG. 6B; furthermore a sense amplifier would be required for each of the bit lines. Tw2 would be asserted along with the sense transistors (located on the bit lines) for the read operation.

FIG. 6B shows only one bit line selection transistor is coupled directly to the conductive bit line. The bit line transistors (Tb1-Tbn) may be connected to one of multiple voltage levels (A). The word line transistors (Tw2, Tw4, . . . TwM) also may be connected to one of multiple voltage levels (B). This architecture enables driving of either current or voltage driven nonvolatile memory elements. Furthermore, a sense amplifier need not be dedicated for each word line, but may be utilized for more than one such as one SA per M word lines. Hence, the total number of select transistors including those for sense amplifiers in FIG. 6A is (2×N)+(3×M)=5M (if M=N), whereby in FIG. 6B the number of select transistors and sense amplifier transistors is (1×N)+(2×M)=3M (if M=N), a substantial reduction of transistors. The reduction in sense amplifiers in FIG. 6B compared to FIG. 6A represents a further reduction in transistors. In this case with less transistors for a given array, there is more area under or above the array available per transistor and hence a larger Ft may be employed. Referring back to FIG. 11B which is provided for illustration purposes only, the max Ft. assumes one layer of TFTs are fabricated to address the bit line transistors. The table in FIG. 11B is based on a circuit comparable to FIG. 6A where there are two transistors per bit line for a total of 2N bit line transistors for the array. If one were to consider FIG. 6B, where there is just one transistor per bit line for a total of N bit line transistors for the array, the maximum value of Ft would be twice as large as indicated in FIG. 11B. Of course, one may design to include additional transistors on a single layer such as bandgap and decoder logic transistors and word or bit line transistors from another MTJ layer and therefore the maximum Ft would be reduced accordingly. Many configurations are possible for optimization of cost and performance all consistent with the spirit and scope of the invention—that is, that the technology node for memory cell fabrication is decoupled from the technology node for transistor fabrication, thereby allowing for lower cost (larger technology node) transistors to be fabricated and placed substantially above or below the memory array such that peripheral area is not required outside the memory array. Such peripheral area is expensive since it would reduce the area processed when the expensive (small technology node) memory cells are fabricated. Note also that the principles described above also apply to the base silicon CMOS circuitry layer as well.

It should be noted that the order and combinations of the layers (MTJ and TFT) indicated in the embodiments described above may be modified without diverting from the scope of the present invention. A key aspect of the present invention is that high density nonvolatile crosspoint memory devices may be constructed in Back End Of Line (BEOL) facilities without the need for the high cost front end processing of silicon semiconductor production lines.

FIG. 46A through FIG. 46H illustrate the wide variety of business models whereby memory chips and memory and processor modules may be fabricated in accordance with embodiments of the present invention. The invention described herein is such that it will be disruptive to the semiconductor industry in order to be fully developed. Ideally, an integrated Fab (Fab-X or Fab-Y), as indicated in FIG. 46F is desired to reduce transfer of substrates and optimize productivity, thereby reducing costs. Fab-Y in particular which integrates the Nonvolatile memory fabrication, the TFT fabrication and produces a TFT-based microprocessor, is the holy grail where the invention described herein will take the industry where devices as described in FIG. 35 may be fabricated. FIG. 35 shows is a side view cross section of integrated circuits including TFT-based I/O, memory, logic or other circuitry fabricated on a common multilayer (PCB) substrate in accordance with an embodiment of the present invention whereby all circuitry related to the memory (336) and processor (337) are fabricated with TFTs and may be processed on PCB, glass or other substrates of large size offering economies of scale and hence lower production costs. Without reliance on conventional CMOS, and the constraints of the manufacturing of silicon wafers, limited to 450 mm diameter, the manufacturing infrastructure may now dramatically change to larger substrates (upwards of 3 meters×3 meters glass substrates as used in the flat panel display industry), flexible substrates, disposable/reusable substrates, roll-to-roll processes, etc. unleashing a new era in the semiconductor industry not seen in nearly half a century and truly providing the low cost production possibilities to provide for trillion units of IoT (Internet of Things) devices and other semiconductor integrated circuits.

Before reaching the holy grail of integrated Fabs however, the invention described herein may be implemented through existing CMOS fabs (Fab C) and dedicated fabs for the TFT fabrication (Fab A) as well as the nonvolatile memory elements (Fab B) as illustrated in FIG. 46A-46E and FIG. 46H. FIG. 46A-46C illustrate that medium speed devices may be fabricated within the constraints of the memory technology employed and TFTs employed without regard to the use of cache memory or wide I/O. FIG. 46D illustrates that high speed (such as DD4 data rates) devices may be fabricated by employing the cache memory approach indicated in FIG. 21A, and FIG. 43. FIG. 46E illustrates that high speed devise may be fabricated by employing Wide IO buses at the microprocessor and memory chip interfaces, enabling speeds such as stated in the WideIO2 specification or much higher yet as described in the disclosure herein if ultra wide bus lines are utilizied—enabled by the use of TFT-based I/O circuitry. FIG. 46G summarizes the different approaches to fabricate memory chips 331, 3311 and 331X utilizing TFT and nonvolatile memory fabs. The memory chips all include memory elements and conductive lines in a crosspoint memory array design at minimum (331X) and may also include TFTs for the drivers, decoder logic, sense circuits and bandgap circuits (331), and may further include TFT-based I/O circuitry (3311). The cache memory interface chip (361) to enable high speeds need not be fabricated with traditional crystalline silicon CMOS processes but also may be fabricated with high speed TFTs to accomplish the intended task. Such high speed TFTs may be poly-Si TFTs, CdSe TFTs, higher mobility IGZO or other AOS TFTs, or TFTs comprising of carbon nanotubes (CNTs) or graphene as noted within this disclosure. FIG. 4611 illustrates that different technology TFTs—in separate fabs (Fab-A' and Fab-A") or in an integrated fab—may be utilized to produce TFT devices for the memory logic (FIG. 39), TFTs for the memory I/O (FIG. 33B) and TFTs for cache (e.g., SRAM) memory 361 chips. Furthermore, other compound semiconductors such as GaAs transistors perform better than crystalline silicon transistors with respect to speed and hence offers another option to enabling very high speed nonvolatile memory employing TFTs for the logic associated with memory in accordance with embodiments of the present invention.

From the discussion above it should be appreciated that the invention can be embodied in various ways including the following apparatus descriptions A1-A60:

A1. An integrated circuit device, comprising
a memory array arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance,
whereby each conductive line of the first conductive lines or the second conductive lines or both first and second conductive lines, is electrically coupled to at least one thin film transistor and
whereby said transistors are substantially positioned above or below the memory array A2. The device according to A1 above whereby the thin film transistors have a minimum feature size 40% or larger than a minimum feature size of the memory cells A3. The device according to A1 above whereby the memory cell is a magnetic tunnel junction comprised of at least a pinned ferromagnetic layer with fixed magnetization direction and a free ferromagnetic layer with a reversible magnetization direction, the pinned and free layers are separated from each other by a thin tunnel barrier layer A4. The device according to apparatus A1 above whereby the memory array is a resistance random access memory array A5. The device according to apparatus A1 above whereby the memory array is embedded memory of a microprocessor, microcontroller, FPGA, GPU, PLD, ASIC, ASSP, DSP, or other integrated circuit A6. The device according to apparatus A1 above whereby a bidirectional selector switch is located between each memory cell and one of the said conductive lines A7. The device according to apparatus A1 above whereby a memory array is sized at 256 bit lines by 256 word lines or smaller A8. An integrated circuit device, comprising
at least two memory arrays separated from each other in the vertical direction, each memory array arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance,
whereby each conductive line of the first conductive lines or the second conductive lines or both first and second conductive lines, is electrically coupled to at least one thin film transistor and
whereby said transistors are substantially positioned above or below a memory array A9. The device according to apparatus A8 above, whereby the thin film transistors have a minimum feature size 40% or larger than a minimum feature size of the memory cells A10. The device according to apparatus A8 above, whereby the memory cell is a magnetic tunnel junction comprised of at least a pinned ferromagnetic layer with fixed magnetization direction and a free ferromagnetic layer with a reversible magnetization direction, the pinned and free layers are separated from each other by a thin tunnel barrier layer A11. The device according to apparatus A8 above, whereby a memory array is a resistance random access memory array A12. The device according to apparatus A8 above, whereby a memory array is embedded memory of a microprocessor, microcontroller, FPGA, GPU, PLD, ASIC, ASSP, DSP, or other integrated circuit A13. The device according to apparatus A1 above, whereby a buffer memory is employed to enable I/O from an external source at a higher clock speed than the I/O to a nonvolatile memory array A14. The device according to apparatus A8 above, whereby a buffer memory is employed to enable I/O from an external source at a higher clock speed than the I/O to a nonvolatile memory array A15. The device according to apparatus A13 above, whereby the buffer memory resides on the same base silicon substrate that the nonvolatile memory array is positioned above A16. The device according to apparatus A13 above, whereby the buffer memory resides on a separate die attached to the nonvolatile memory device A17. The device according to apparatus A14 above, whereby the buffer memory resides on the same base silicon substrate that the nonvolatile memory array is positioned above A18. The device according to apparatus A14 above, whereby the buffer memory resides on a separate die attached to the nonvolatile memory device A19. An integrated circuit device comprising of a plurality of logic blocks comprised of thin film transistors and interconnects between logic blocks in the vertical direction A20. An integrated circuit device comprising of a plurality of layers of memory arrays and logic blocks comprised of thin film transistors and interconnects between the layers in the vertical direction whereby, a memory array is arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance, wherein each conductive line of the first conductive lines or the second conductive lines or both first and second conductive lines, is connected to at least one thin film transistor and wherein said transistors are substantially positioned above or below a memory array A21. The device according to apparatus A20 above whereby the device comprises either a microprocessor, microcontroller, FPGA, GPU, PLD, ASIC, ASSP, DSP, MEMS or a hybrid thereof A22. The device according to apparatus A20 above whereby the device comprises a microdisplay with thin film transistors A23. The device according to apparatus A20 above whereby the device comprises a microprocessor, an FPGA and shared memory A24. The device according to apparatus A20 above whereby the device comprises an energy storage device A25. The device according to apparatus A20 above whereby the device comprises an RF device A26. The device according to apparatus A20 above whereby the device comprises an image sensor A27. An integrated circuit device comprising I/O circuitry comprised of thin film transistors A28. The device according to apparatus A27 above whereby the core circuitry of the device is based on CMOS transistors and substantially all of the I/O circuitry resides above the core circuitry A29. The device according to apparatus A27 above whereby the I/O pad count for data signals is 4,096 or more A30. A device comprising of a first substrate, I/O circuitry comprised of thin film transistors residing on said first substrate, whereby core circuitry related to a portion of said I/O circuitry resides on a second substrate and is connected to said I/O circuitry A31. The device according to apparatus A30 above whereby the first substrate is a printed circuit board A32. The device according to apparatus A30 above whereby the first substrate is a glass substrate A33. The device according to apparatus A30 above whereby the first substrate is a silicon or organic interposer A34. The device according to apparatus A30 above further comprising of I/O bus lines residing on or within said first substrate A35. The device according to apparatus A34 above whereby the I/O bus lines connect first I/O circuitry of a first core circuitry to second I/O circuitry of a second core circuitry A36. The device according to apparatus A35 above whereby a first core circuity is a microprocessor, FPGA, ASIC or ASSP residing on the second substrate A37. The device according to apparatus A34 above whereby a second core circuitry is related to memory A38. The device according to apparatus A37 above whereby the memory resides on said first substrate A39. The device according to apparatus A37 above whereby the memory resides on a third substrate and is connected to said second I/O circuitry A40. The device according to apparatus A6 above whereby the bidirectional selector switch is a back to back Schottky diode A41. The device according to apparatus A30 above whereby the first substrate is a diamond substrate A42. The device according to apparatus A1 above whereby the memory cell is a VCMA memory cell A43. The device according to apparatus A8 above whereby the memory cell is a VCMA memory cell A44. The device according to apparatus A20 above whereby the memory cell is a VCMA memory cell A45. The device according to apparatus A37 above whereby the memory is based on VCMA memory cells A46. The device according to apparatus A1 above whereby the thin film transistors are IGZO thin film transistors A47. The device according to apparatus A8 above whereby the thin film transistors are IGZO thin film transistors A48. The device according to apparatus A20 above whereby the thin film transistors are IGZO thin film transistors A49. The device according to apparatus A27 above whereby the thin film transistors are IGZO thin film transistors A50. The device according to apparatus A30 above whereby the thin film transistors are IGZO thin film transistors A51. The device according to apparatus A1 above whereby the thin film transistors are comprised of graphene or carbon nanotubes A52. The device according to apparatus A8 above whereby the thin film transistors are comprised of graphene or carbon nanotubes A53. The device according to apparatus A20 above whereby the thin film transistors are comprised of graphene or carbon nanotubes A54. The device according to apparatus A27 above whereby the thin film transistors are comprised of graphene or carbon nanotubes A55. The device according to apparatus A30 above whereby the thin film transistors are comprised of graphene or carbon nanotubes A56. The device according to apparatus A37 above whereby the thin film transistors are comprised of graphene or carbon nanotubes A57. The device according to apparatus A1 above whereby the memory cell is a SiOx memresistor cell A58. The device according to apparatus A8 above whereby the memory cell is a SiOx memresistor cell A59. The device according to apparatus A20 above whereby the memory cell is a SiOx memresistor cell A60. The device according to apparatus A37 above whereby the memory is based on SiOx memresistor cells It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. An integrated circuit device, comprising
   at least one memory array layer arranged in a matrix and comprising a plurality of parallel first conductive lines, a plurality of parallel second conductive lines overlapping the first conductive lines at a plurality of intersection regions, a plurality of memory cells, each memory cell being disposed at an intersection region of the conductive lines, electrically coupled to one of the first conductive lines at a first terminal and to one of the second conductive lines at a second terminal, and comprising a controllable electrical resistance,
   whereby each conductive line of the first conductive lines or the second conductive lines or both first and second conductive lines, is electrically coupled to at least one thin film transistor of a thin film transistor layer, which is positioned directly above the memory array layer.

2. The device according to claim 1 whereby the memory cells are selected from the group consisting of NRAM-type, FeRAM-type, RRAM-type, MRAM-type, CBRAM-type, and PCRAM-type.

3. The device according to claim 1 whereby the memory array layer is embedded memory of a microprocessor, microcontroller, FPGA, GPU, PLD, ASIC, ASSP, DSP, or other integrated circuit.

4. The device according to claim 1 further comprising a bidirectional selector switch disposed between each memory cell and one of said first or second conductive lines.

5. The device according to claim 1, wherein the at least one memory array layer comprises at least two memory array layers separated from each other in the vertical direction.

6. The device according to claim 1, whereby a buffer memory is employed to enable I/O from an external source at a higher clock speed than the I/O to a nonvolatile memory array.

7. The integrated circuit device of claim 1 wherein a first one of said at least one thin film transistor is of a carbon nanotube type.

8. The integrated circuit device of claim 1 wherein the first one of said at least one thin film transistor is of an amorphous oxide semiconductor type.

9. The device according to claim 5 whereby at least a first memory array layer of the at least two memory array layers is a resistance random access memory array.

10. The device according to claim 5 whereby at least one of said at least two memory array layers is embedded memory of a microprocessor, microcontroller, FPGA, GPU, PLD, ASIC, ASSP, DSP, or other integrated circuit.

11. The device according to claim 5, whereby a buffer memory is employed to enable I/O from an external source at a higher clock speed than the I/O to a nonvolatile memory array.

12. The device according to claim 5, wherein the at least two memory array layers comprises a plurality of logic blocks comprising thin film transistors and interconnects, each one of the plurality of logic blocks being disposed between the layers in the vertical direction.

13. The device according to claim 12 whereby the device comprises either a microprocessor, microcontroller, FPGA, GPU, PLD, ASIC, ASSP, DSP, MEMS or a hybrid thereof.

14. The device according to claim 12 whereby the device comprises an energy storage device, display, RF device or image sensor.

15. The integrated circuit device of claim 8 wherein the first one of said at least one thin film transistor is either of an IGZO-type or a ZnO-type.

16. The integrated circuit device of claim 8 wherein the first one of said at least one thin film transistor is of a SnO2-type.

17. The integrated circuit device of claim 8 wherein the first one of said at least one thin film transistor is of a MoS2-type.

* * * * *